US011296726B2

(12) United States Patent
Jin et al.

(10) Patent No.: US 11,296,726 B2
(45) Date of Patent: Apr. 5, 2022

(54) METHOD AND APPARATUS FOR LOW DENSITY PARITY CHECK CHANNEL CODING IN WIRELESS COMMUNICATION SYSTEM

(71) Applicant: Huawei Technologies Co., Ltd., Shenzhen (CN)

(72) Inventors: Jie Jin, Moscow (RU); Wen Tong, Ottawa (CA); Jun Wang, Hangzhou (CN); Aleksandr Aleksandrovich Petiushko, Moscow (RU); Ivan Leonidovich Mazurenko, Moscow (RU); Chaolong Zhang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/923,841

(22) Filed: Jul. 8, 2020

(65) Prior Publication Data

US 2020/0343912 A1 Oct. 29, 2020

Related U.S. Application Data

(63) Continuation of application No. 16/566,331, filed on Sep. 10, 2019, now Pat. No. 10,742,235, which is a
(Continued)

(30) Foreign Application Priority Data

Jun. 15, 2017 (CN) .......................... 201710454030.3
Jun. 27, 2017 (CN) .......................... 201710503056.2

(51) Int. Cl.
*H03M 13/11* (2006.01)
*H03M 13/00* (2006.01)
*H04L 1/00* (2006.01)

(52) U.S. Cl.
CPC ..... *H03M 13/1148* (2013.01); *H03M 13/616* (2013.01); *H04L 1/005* (2013.01); *H04L 1/0061* (2013.01)

(58) Field of Classification Search
CPC ......... H03M 13/1148; H03M 13/6516; H03M 13/116; H03M 13/6362; H03M 13/616;
(Continued)

(56) References Cited

U.S. PATENT DOCUMENTS 6,306,601 B1 10/2001 Barton et al.
7,178,082 B2 2/2007 Yu et al.
(Continued)

FOREIGN PATENT DOCUMENTS

CN 1845482 A 10/2006
CN 1973440 A 5/2007
(Continued)

OTHER PUBLICATIONS

"Design of LDPC Codes for NR," 3GPP TSG RAN WG1 Meeting #87, Reno, USA, R1-1611321, pp. 1-11, 3rd Generation Partnership Project, Valbonne, France (Nov. 14-18, 2016).
(Continued)

*Primary Examiner* — Shelly A Chase
(74) *Attorney, Agent, or Firm* — Leydig, Voit & Mayer, Ltd.

(57) ABSTRACT

A low density parity check (LDPC) channel encoding method is used in a wireless communications system. A communication device encodes an input bit sequence by using an LDPC matrix, to obtain an encoded bit sequence for transmission. The LDPC matrix is obtained based on a lifting factor Z and a base matrix. The base matrix may be one of eight exemplary designs. The encoding method can be used in various communications systems including fifth generation (5G) telecommunication systems, and can sup-
(Continued)

port various encoding requirements for information bit sequences with different code lengths.

30 Claims, 13 Drawing Sheets

Related U.S. Application Data continuation of application No. PCT/CN2017/092878, filed on Jul. 13, 2017.

(58) Field of Classification Search
CPC . H03M 13/618; H03M 13/1185; H04L 1/005; H04L 1/0057; H04L 1/0068; H04L 1/0061; H04L 1/0071
See application file for complete search history.

(56) References Cited

U.S. PATENT DOCUMENTS

| | | | |
|---|---|---|---|
| 7,188,297 B2 | 3/2007 | Blankenship et al. | |
| 7,191,378 B2 | 3/2007 | Eroz et al. | |
| 7,600,174 B2 | 10/2009 | Kyung et al. | |
| 8,433,984 B2* | 4/2013 | Khandekar | H03M 13/616 714/779 |
| 9,100,052 B2 | 8/2015 | Pisek | |
| 9,306,601 B2 | 4/2016 | Richardson | |
| 9,432,052 B2 | 8/2016 | Korb et al. | |
| 9,559,722 B1 | 1/2017 | Huang et al. | |
| 9,847,794 B2 | 12/2017 | Kim et al. | |
| 10,432,219 B2 | 10/2019 | Zheng et al. | |
| 2004/0186992 A1 | 9/2004 | Matsumoto | |
| 2006/0077947 A1 | 4/2006 | Kim et al. | |
| 2006/0156183 A1* | 7/2006 | Kim | H03M 13/1185 714/758 |
| 2009/0204868 A1 | 8/2009 | Park et al. | |
| 2010/0058139 A1 | 3/2010 | Wang et al. | |
| 2010/0257425 A1 | 10/2010 | Yue et al. | |
| 2011/0289375 A1 | 11/2011 | Jiang et al. | |
| 2012/0240001 A1 | 9/2012 | Abu-Surra et al. | |
| 2014/0223254 A1 | 8/2014 | Pisek | |
| 2014/0229789 A1 | 8/2014 | Richardson | |
| 2014/0344639 A1 | 11/2014 | Kyung et al. | |
| 2016/0087648 A1 | 3/2016 | Korb et al. | |
| 2016/0094246 A1 | 3/2016 | Vasista Srinivasan Ranganathan et al. | |
| 2016/0173132 A1 | 6/2016 | Cho | |
| 2016/0218750 A1 | 7/2016 | Ma | |
| 2016/0345028 A1 | 11/2016 | Kim et al. | |
| 2017/0149528 A1* | 5/2017 | Kim | H04L 1/0041 |
| 2017/0222660 A1 | 8/2017 | Li et al. | |
| 2018/0198466 A1 | 7/2018 | Chiu et al. | |
| 2018/0294822 A1 | 10/2018 | Shinohara et al. | |
| 2018/0323801 A1 | 11/2018 | Hsu et al. | |
| 2019/0229751 A1 | 7/2019 | Kim et al. | |
| 2019/0245654 A1 | 8/2019 | Richardson et al. | |
| 2019/0288708 A1 | 9/2019 | Ma et al. | |
| 2019/0393890 A1 | 12/2019 | Montorsi et al. | |

FOREIGN PATENT DOCUMENTS

| | | |
|---|---|---|
| CN | 101162907 A | 4/2008 |
| CN | 101515839 A | 8/2009 |
| CN | 100539442 C | 9/2009 |
| CN | 101662290 A | 3/2010 |
| CN | 101834613 A | 9/2010 |
| CN | 102315911 A | 1/2012 |
| CN | 102412842 A | 4/2012 |
| CN | 104333390 A | 2/2015 |
| CN | 104518847 A | 4/2015 |
| CN | 104521147 A | 4/2015 |
| CN | 104821831 A | 8/2015 |
| CN | 104868925 A | 8/2015 |
| CN | 104917536 A | 9/2015 |
| CN | 105075128 A | 11/2015 |
| CN | 105827251 A | 8/2016 |
| CN | 106685586 A | 5/2017 |
| CN | 106849958 A | 6/2017 |
| CN | 104168030 B | 11/2017 |
| CN | 108173621 A | 6/2018 |
| EP | 1596501 B1 | 4/2009 |
| JP | 2006157926 A | 6/2006 |
| JP | 2010517444 A | 5/2010 |
| JP | 6820438 B2 | 1/2021 |
| KR | 20090087386 A | 8/2009 |
| KR | 20150118992 A | 10/2015 |
| RU | 2310274 C1 | 11/2007 |
| RU | 2443053 C2 | 2/2012 |
| WO | 2010057407 A1 | 5/2010 |
| WO | 2014127140 A1 | 8/2014 |
| WO | WO-2016126202 A1 * | 8/2016 ........ H03M 13/3761 |
| WO | 2018082290 A1 | 5/2018 |

OTHER PUBLICATIONS

"Length compatibility of LDPC," 3GPP TSG RAN WG1 Meeting #86bis, Lisbon, Portugal, R1-1609242, pp. 1-4, 3rd Generation Partnership Project, Valbonne, France (Oct. 10-14, 2016).

LG Electronics,"LDPC Codes Design for eMBB data channel," 3GPP TSG RAN WG1 NR ad-hoc, Spokane, USA, R1-1700518, total 6 pages, 3rd Generation Partnership Project, Valbonne, France (Jan. 16-20, 2017).

ZTE, "Shift coefficient design for base graph #2," 3GPP TSG RAN WG1 NR Ad-Hoc#2, Qingdao, P.R. China, R1-1710846, total 3 pages, 3rd Generation Partnership Project, Valbonne, France (Jun. 27-30, 2017).

"Further consideration on compact LDPC design for eMBB," 3GPP TSG RAN WG1 Meeting #88, Athens, Greece, R1-1701600, pp. 1-14, 3rd Generation Partnership Project—Valbonne, France (Feb. 13-17, 2017).

Gallager, "Low-Density Parity-Check Codes," IRE Transactions on Information Theory, vol. 8, No. 1, pp. 21-28, Institute of Electrical and Electronics Engineers—New York, New York (Jan. 1962).

"Performance of LDPC design for eMBB," 3GPP TSG RAN WG1 Meeting #89, Hangzhou, P.R. China, R1-1709189, pp. 1-4, 3rd Generation Partnership Project—Valbonne, France (May 15-19, 2017).

"3rd Generation Partnership Project; Technical Specification Group Radio Access Network; NR; Multiplexing and channel coding (Release 15)," 3GPP TS 38.212 V0.0.0, pp. 1-10, 3rd Generation Partnership Project—Valbonne, France (May 2017).

Joo et al.,"LDPC coding for OFDMA PHY," IEEE 802.16 Broadband Wireless Access Working Group, IEEE C802.16d-04/86r1, pp. 1-12, Institute of Electrical and Electronics Engineers, New York, New York (May 1, 2004).

"Summary of [89-24] Email discussion on LDPC code base graph #1 for NR," 3GPP TSG RAN WG1 NR Ad-Hoc #2, Qingdao, P.R. China, R1-1711545, pp. 1-4, 3rd Generation Partnership Project, Valbonne, France (Jun. 27-30, 2017).

"Summary of [89-25] Email discussion on LDPC code base graph #2 for NR," 3GPP TSG RAN WG1 NR Ad-Hoc #2, Qingdao, P.R. China, R1-1711546, pp. 1-3, 3rd Generation Partnership Project, Valbonne, France (Jun. 27-30, 2017).

Chen, "Elementary Transformation of Matrix and Its Application," with English Translation, vol. 25, No. 2, pp. 71-74, Journal of Higher Correspondence Education (2012).

"WF on LDPC parity check matrices," 3GPP TSG RAN WG1 NR AH #2, Qingdao, China, R1-1711982, pp. 1-2, 3rd Generation Partnership Project, Valbonne, France (Jun. 27-30, 2017).

"LDPC design for eMBB data," 3GPP TSG RAN WG1 Meeting #89,Hangzhou, China, R1-1706970, pp. 1-11, 3rd Generation Partnership Project, Valbonne, France (May 15-19, 2017).

"Performance evaluation of LDPC codes," 3GPP TSG RAN WG1 Meeting #89, Hangzhou, China, R1-1706971, pp. 1-12, 3rd Generation Partnership Project, Valbonne, France (May 15-19, 2017).

"Throughput of LDPC codes," 3GPP TSG RAN WG1 Meeting #89, Hangzhou, China, R1-1706972, pp. 1-7, 3rd Generation Partnership Project, Valbonne, France (May 15-19, 2017).

(56) References Cited

OTHER PUBLICATIONS

"Rate matching for LDPC codes," 3GPP TSG RAN WG1 Meeting #89, Hangzhou, China, pp. 1-4, R1-1706973, 3rd Generation Partnership Project, Valbonne, France (May 15-19, 2017).
"WF on Candidate LDPC Base Matrices" with "Simulation results for LDPC codes," 3GPP TSG RAN WG1 Meeting #89, Hangzhou, China, R1-1709751, pp. 1-33, 3rd Generation Partnership Project, Valbonne, France (May 15-19, 2017).
"LDPC design for base graph 1," 3GPP TSG RAN WG1 Meeting AH#2, Qingdao, P.R. China, R1-1711436, pp. 1-4, 3rd Generation Partnership Project, Valbonne, France (Jun. 27-30, 2017).
"LDPC design for base graph 2," 3GPP TSG RAN WG1 Meeting AH#2, Qingdao, P.R. China, R1-1711437, pp. 1-4, 3rd Generation Partnership Project, Valbonne, France (Jun. 27-30, 2017).
"Rate matching for LDPC codes," 3GPP TSG RAN WG1 NR Ad-Hoc #2, Qingdao, China, R1-1711438, pp. 1-6, 3rd Generation Partnership Project, Valbonne, France (Jun. 27-30, 2017).
"LDPC design for base graph 1," with corrections, 3GPP TSG RAN WG1 Meeting AH#2, Qingdao, P.R. China, R1-1711727, pp. 1-4, 3rd Generation Partnership Project, Valbonne, France (Jun. 27-30, 2017).
Huawei: "R1-1711437_PCMs for BG2," retrived from the internet: https://www.3gpp.org/ftp/tsg_ran/WG1_RL1/TSGR1_AH/NR_AH_1706/Docs/R1-1711437.zip, XP055695142, pp. 1-10, 3rd Generation Partnership Project, Valbonne, France (Jun. 27, 2017).
"High Performance LDPC code Features," 3GPP TSG-RAN WG1 NR, Spokane, Washington, R1-1701470, pp. 1-17, 3rd Generation Partnership Project, Valbonne, France (Jan. 16-20, 2017).
"3rd Generation Partnership Project; Technical Specification Group Radio Access Network; NR; Multiplexing and channel coding (Release 15)," 3GPP TS 38.212 V0.0.1, XP051336737, pp. 1-23, 3rd Generation Partnership Project, Valbonne, France (Jul. 2017).
"On design and performance of NR eMBB LDPC Code," 3GPP TSG-RAN WG1 Meeting#89, Hangzhou, CN, R1-1709856, pp. 1-14, 3rd Generation Partnership Project, Valbonne, France (May 15-19, 2017).
"On NR LDPC design and performance," 3GPP TSG-RAN WG1 Meeting NR#2, Qingdao, CN, R1-1710829, XP051300033, pp. 1-6, 3rd Generation Partnership Project, Valbonne, France (Jun. 27-30, 2017).
"LDPC design for eMBB data," 3GPP TSG RAN WG1 WG1 NR Ad-Hoc#2, Qingdao, P.R. China, R1-1710046, pp. 1-4, 3rd Generation Partnership Project, Valbonne, France (Jun. 27-30, 2017).
ZTE: "R1-1710846 Shift coefficient design for BG2," retrieved from the internet:https://www.3gpp.org/ftp/tsg_ran/wg1_rl1/TSGR1_AH/NR_AH_1706/Docs/R1-1710846.zip, XP055694976, pp. 1-8, 3rd Generation Partnership Project, Valbonne, France (Jun. 20, 2017).
"Shift coefficient design for base graph #2," 3GPP TSG RAN WG1 NR Ad-Hoc#2, Qingdao, P.R. China, R1-1710846, pp. 1-3, 3rd Generation Partnership Project, Valbonne, France (Jun. 27-30, 2017).
"LDPC design for eMBB data," 3GPP TSG RAN WG1 Meeting #88bis, Spokane, USA, R1-1704250, XP051242402, pp. 1-6, 3rd Generation Partnership Project, Valbonne, France (Apr. 3-7, 2017).
Weidu Wu et al., "LDPC merged BG2.xlsx," XP055698448, 3GPP TSG_RAN_WG1 Archives, pp. 1-12, 3rd Generation Partnership Project, Valbonne, France (Jun. 15, 2017).
"A multi-codebook embedded compact QC-LDPC design," 3GPP TSG-RAN WG1 NR, Spokane, USA, R1-1704457, XP051242602, pp. 1-11, 3rd Generation Partnership Project, Valbonne, France (Apr. 3-7, 2017).
Keeth Jayasinghe, "Candidates for base matrix 2 final.xlsx," XP055698522, pp. 1-8 (Jun. 14, 2017).
Nokia et al: "LDPC Basegraph 2 / R1-1711546—Summary of [89-25] email discussion," XP055698232, one page, (Jun. 19, 2017).
Jayasinghe, Keeth, Re: [89-25] LDPC code base graph #2 for NR. 3GPP TSG RAN WG1@LIST.ETSI.ORG, Retrieved from https://list.etsi.org/scripts/wa.exe?A2=ind1706B&L=3GPP_TSG_RAN_WG1&P=R1093428&u=75577, total 20 pages (Jun. 14, 2017).
Jayasinghe, Keeth, Re: [89-25] LDPC code base graph #2 for NR . 3GPP_TSG_RAN_WG1@LIST.ETSI.ORG, Jun. 14, 2017, Candidates for base matrix 2_final.xlsx, retrieved from https://list.etsi.org/scripts/wa.exe? A2=ind1706B&L=3GPP_TSG_RAN_WG1&P=R988531&u=75577, total 56 pages.
Ericsson, "Rate Matching for LDPC Codes," 3GPP TSG RAN WG1 Meeting #87, Reno, USA, R1-1611322, total 6 pages, 3rd Generation Partnership Project, Valbonne, France (Nov. 14-18, 2016).
Samsung, "LDPC Code Design for eMBB," 3GPP TSG RAN WG1 #89, Hangzhou, China, R1-1708046, total 48 pages, 3rd Generation Partnership Project, Valbonne, France (May 15-19, 2017).
Mediatek Inc., "On NR LDPC design and performance," 3GPP TSG-RAN WG1 Meeting NR#2, Qingdao, CN, R1-1710829, total 6 pages, 3rd Generation Partnership Project, Valbonne, France (Jun. 27-30, 2017).
LG Electronics, "LDPC Codes Design for eMBB data channel," 3GPP TSG RAN WG1 #89, Hangzhou, China, R1-1709641, total 6 pages, 3rd Generation Partnership Project, Valbonne, France (May 15-19, 2017).

* cited by examiner

FIG. 3b-1

| | 0 | 1 | 2 | 3 | 4 | 5 | 6 | 7 | 8 | 9 | 10 | 11 | 12 | 13 | 14 | 15 | 16 | 17 | 18 | ... | ... | ... | 50 | 51 |
|---|---|---|---|---|---|---|---|---|---|---|---|---|---|---|---|---|---|---|---|---|---|---|---|---|
| 0 | 121 | 74 | 89 | 122 | −1 | −1 | 141 | −1 | −1 | 137 | 0 | 0 | −1 | −1 | −1 | −1 | −1 | −1 | −1 | ... | ... | ... | −1 | −1 |
| 1 | 118 | −1 | −1 | 0 | 25 | 171 | 133 | 79 | 173 | 121 | −1 | 0 | 0 | −1 | −1 | −1 | −1 | −1 | −1 | ... | ... | ... | −1 | −1 |
| 2 | 42 | 121 | −1 | 95 | 8 | −1 | −1 | −1 | 29 | −1 | 1 | −1 | 0 | 0 | −1 | −1 | −1 | −1 | −1 | ... | ... | ... | −1 | −1 |
| 3 | −1 | 64 | 110 | −1 | 143 | 78 | 90 | 9 | 55 | 90 | 0 | −1 | −1 | 0 | −1 | −1 | −1 | −1 | −1 | ... | ... | ... | −1 | −1 |
| 4 | 31 | 48 | −1 | −1 | −1 | −1 | −1 | −1 | −1 | −1 | 162 | −1 | −1 | 0 | −1 | −1 | −1 | −1 | −1 | ... | ... | ... | −1 | −1 |
| 5 | 28 | 29 | −1 | −1 | −1 | 99 | −1 | 142 | −1 | −1 | −1 | 80 | −1 | −1 | −1 | 0 | −1 | −1 | −1 | ... | ... | ... | −1 | −1 |
| 6 | 17 | −1 | −1 | −1 | −1 | 38 | −1 | 63 | −1 | 26 | −1 | 167 | −1 | −1 | −1 | −1 | 0 | −1 | −1 | ... | ... | ... | −1 | −1 |
| 7 | −1 | 44 | −1 | −1 | −1 | 68 | −1 | 59 | −1 | −1 | −1 | 110 | −1 | 86 | −1 | −1 | −1 | 0 | −1 | ... | ... | ... | −1 | −1 |
| 8 | 104 | 58 | −1 | −1 | −1 | −1 | −1 | −1 | −1 | −1 | −1 | −1 | 53 | −1 | −1 | −1 | −1 | −1 | 0 | ... | ... | ... | −1 | −1 |
| 9 | −1 | 136 | −1 | −1 | −1 | −1 | −1 | −1 | 135 | −1 | 133 | 142 | −1 | −1 | −1 | −1 | −1 | −1 | −1 | ... | ... | ... | −1 | −1 |
| 10 | 153 | 15 | −1 | −1 | −1 | −1 | 109 | 86 | −1 | −1 | −1 | −1 | −1 | −1 | −1 | −1 | −1 | −1 | −1 | ... | ... | ... | −1 | −1 |
| 11 | 4 | −1 | −1 | −1 | −1 | −1 | −1 | 34 | −1 | 168 | −1 | −1 | −1 | 156 | −1 | −1 | −1 | −1 | −1 | ... | ... | ... | −1 | −1 |
| 12 | −1 | 98 | −1 | 60 | −1 | −1 | −1 | −1 | −1 | −1 | −1 | 172 | −1 | −1 | −1 | −1 | −1 | −1 | −1 | ... | ... | ... | −1 | −1 |
| 13 | 98 | 3 | −1 | −1 | −1 | −1 | −1 | −1 | 89 | −1 | −1 | −1 | −1 | 108 | −1 | −1 | −1 | −1 | −1 | ... | ... | ... | −1 | −1 |
| 14 | −1 | 30 | −1 | −1 | −1 | −1 | 131 | −1 | −1 | −1 | −1 | 127 | −1 | 112 | −1 | −1 | −1 | −1 | −1 | ... | ... | ... | −1 | −1 |
| 15 | 38 | −1 | −1 | −1 | −1 | −1 | −1 | −1 | −1 | −1 | 64 | 77 | −1 | −1 | −1 | −1 | −1 | −1 | −1 | ... | ... | ... | −1 | −1 |
| 16 | −1 | 110 | −1 | −1 | −1 | −1 | −1 | −1 | −1 | 42 | −1 | 10 | 82 | −1 | −1 | −1 | −1 | −1 | −1 | ... | ... | ... | −1 | −1 |
| 17 | −1 | 48 | −1 | −1 | −1 | 66 | −1 | −1 | −1 | −1 | −1 | 61 | 161 | −1 | −1 | −1 | −1 | −1 | −1 | ... | ... | ... | −1 | −1 |
| 18 | 90 | −1 | −1 | −1 | −1 | −1 | 47 | 63 | −1 | −1 | −1 | −1 | −1 | −1 | −1 | −1 | −1 | −1 | −1 | ... | ... | ... | −1 | −1 |
| 19 | 175 | 87 | −1 | −1 | −1 | −1 | −1 | −1 | −1 | 59 | −1 | −1 | −1 | −1 | −1 | −1 | −1 | −1 | −1 | ... | ... | ... | −1 | −1 |
| 20 | −1 | 88 | −1 | −1 | 150 | −1 | −1 | −1 | −1 | −1 | −1 | 12 | −1 | −1 | −1 | −1 | −1 | −1 | −1 | ... | ... | ... | −1 | −1 |
| 21 | 5 | −1 | −1 | −1 | −1 | −1 | −1 | −1 | 79 | −1 | −1 | −1 | −1 | 137 | −1 | −1 | −1 | −1 | −1 | ... | ... | ... | −1 | −1 |
| 22 | −1 | 43 | 127 | −1 | −1 | −1 | −1 | −1 | −1 | −1 | −1 | −1 | −1 | −1 | −1 | −1 | −1 | −1 | −1 | ... | ... | ... | −1 | −1 |
| 23 | 78 | −1 | −1 | 32 | −1 | 169 | −1 | −1 | −1 | −1 | −1 | −1 | −1 | −1 | −1 | −1 | −1 | −1 | −1 | ... | ... | ... | −1 | −1 |
| 24 | −1 | 1 | 150 | −1 | −1 | −1 | −1 | −1 | 13 | −1 | −1 | −1 | −1 | −1 | −1 | −1 | −1 | −1 | −1 | ... | ... | ... | −1 | −1 |
| 25 | 39 | −1 | −1 | −1 | −1 | 21 | −1 | −1 | −1 | −1 | −1 | −1 | −1 | −1 | −1 | −1 | −1 | −1 | −1 | ... | ... | ... | −1 | −1 |
| 26 | −1 | −1 | 23 | −1 | −1 | −1 | −1 | 82 | −1 | −1 | −1 | 121 | 156 | −1 | −1 | −1 | −1 | −1 | −1 | ... | ... | ... | −1 | −1 |
| 27 | 74 | −1 | −1 | −1 | −1 | −1 | 166 | −1 | −1 | −1 | −1 | −1 | −1 | −1 | −1 | −1 | −1 | −1 | −1 | ... | ... | ... | −1 | −1 |
| 28 | −1 | 22 | 19 | −1 | −1 | 42 | −1 | −1 | −1 | −1 | −1 | −1 | −1 | −1 | −1 | −1 | −1 | −1 | −1 | ... | ... | ... | −1 | −1 |
| 29 | 91 | −1 | −1 | −1 | 133 | −1 | −1 | −1 | −1 | −1 | −1 | −1 | −1 | −1 | −1 | −1 | −1 | −1 | −1 | ... | ... | ... | −1 | −1 |
| 30 | −1 | −1 | 16 | −1 | −1 | 140 | −1 | 56 | −1 | 158 | −1 | −1 | −1 | −1 | −1 | −1 | −1 | −1 | −1 | ... | ... | ... | −1 | −1 |
| 31 | −1 | 165 | −1 | −1 | −1 | −1 | −1 | −1 | −1 | −1 | −1 | −1 | 23 | −1 | −1 | −1 | −1 | −1 | −1 | ... | ... | ... | −1 | −1 |
| 32 | 34 | −1 | −1 | −1 | 4 | −1 | −1 | −1 | −1 | −1 | −1 | 18 | −1 | −1 | −1 | −1 | −1 | −1 | −1 | ... | ... | ... | −1 | −1 |
| 33 | −1 | −1 | 152 | −1 | −1 | −1 | −1 | 131 | −1 | −1 | 5 | −1 | −1 | −1 | −1 | −1 | −1 | −1 | −1 | ... | ... | ... | −1 | −1 |
| 34 | 148 | −1 | −1 | −1 | −1 | −1 | −1 | −1 | −1 | −1 | −1 | 82 | 153 | −1 | −1 | −1 | −1 | −1 | −1 | ... | ... | ... | −1 | −1 |
| 35 | −1 | 124 | −1 | −1 | −1 | 48 | −1 | −1 | −1 | −1 | 8 | −1 | −1 | −1 | −1 | −1 | −1 | −1 | −1 | ... | ... | ... | −1 | −1 |
| 36 | 128 | −1 | 50 | −1 | −1 | −1 | −1 | 6 | −1 | −1 | −1 | −1 | −1 | −1 | −1 | −1 | −1 | −1 | −1 | ... | ... | ... | −1 | −1 |
| 37 | −1 | −1 | −1 | −1 | −1 | −1 | −1 | −1 | −1 | −1 | 31 | −1 | −1 | 120 | −1 | −1 | −1 | −1 | −1 | ... | ... | ... | −1 | −1 |
| 38 | −1 | 142 | −1 | −1 | −1 | 119 | −1 | −1 | −1 | −1 | 69 | −1 | −1 | −1 | −1 | −1 | −1 | −1 | −1 | ... | ... | ... | −1 | −1 |
| 39 | 69 | −1 | −1 | −1 | −1 | −1 | 124 | −1 | −1 | −1 | −1 | 33 | −1 | −1 | −1 | −1 | −1 | −1 | −1 | ... | ... | ... | −1 | −1 |
| 40 | −1 | −1 | 72 | −1 | −1 | −1 | −1 | −1 | −1 | −1 | 141 | −1 | −1 | 18 | −1 | −1 | −1 | −1 | −1 | ... | ... | ... | 0 | −1 |
| 41 | −1 | 4 | −1 | −1 | −1 | 92 | −1 | −1 | −1 | −1 | −1 | 37 | −1 | −1 | −1 | −1 | −1 | −1 | −1 | ... | ... | ... | −1 | 0 |

| | 0 | 1 | 2 | 3 | 4 | 5 | 6 | 7 | 8 | 9 | 10 | 11 | 12 | 13 | 14 | 15 | 16 | 17 | 18 | ... | ... | ... | 50 | 51 |
|---|---|---|---|---|---|---|---|---|---|---|---|---|---|---|---|---|---|---|---|---|---|---|---|---|
| 0 | 94 | 136 | 3 | 2 | -1 | -1 | 15 | -1 | -1 | 71 | 0 | 0 | -1 | -1 | -1 | -1 | -1 | -1 | -1 | ... | ... | ... | -1 | -1 |
| 1 | 71 | -1 | -1 | 126 | 0 | 119 | 103 | 34 | 75 | 126 | -1 | 0 | 0 | -1 | -1 | -1 | -1 | -1 | -1 | ... | ... | ... | -1 | -1 |
| 2 | 114 | 70 | -1 | 101 | 9 | -1 | -1 | -1 | 23 | -1 | 1 | -1 | 0 | 0 | -1 | -1 | -1 | -1 | -1 | ... | ... | ... | -1 | -1 |
| 3 | -1 | 14 | 18 | -1 | 102 | 105 | 27 | 91 | 128 | 117 | 0 | -1 | -1 | 0 | -1 | -1 | -1 | -1 | -1 | ... | ... | ... | -1 | -1 |
| 4 | 33 | 51 | -1 | -1 | -1 | -1 | -1 | -1 | -1 | -1 | 96 | -1 | -1 | 0 | -1 | -1 | -1 | -1 | -1 | ... | ... | ... | -1 | -1 |
| 5 | 40 | 53 | -1 | -1 | -1 | 47 | -1 | 121 | -1 | -1 | 10 | -1 | -1 | -1 | 0 | -1 | -1 | -1 | -1 | ... | ... | ... | -1 | -1 |
| 6 | 110 | -1 | -1 | -1 | -1 | 99 | -1 | 149 | -1 | 132 | -1 | 4 | -1 | -1 | -1 | 0 | -1 | -1 | -1 | ... | ... | ... | -1 | -1 |
| 7 | -1 | 83 | -1 | -1 | -1 | 111 | -1 | 129 | -1 | -1 | -1 | 43 | -1 | 25 | -1 | -1 | -1 | 0 | -1 | ... | ... | ... | -1 | -1 |
| 8 | 94 | 41 | -1 | -1 | -1 | -1 | -1 | -1 | -1 | -1 | -1 | -1 | 87 | -1 | -1 | -1 | -1 | -1 | 0 | ... | ... | ... | -1 | -1 |
| 9 | -1 | 135 | -1 | -1 | -1 | -1 | -1 | -1 | 11 | -1 | 50 | 84 | -1 | -1 | -1 | -1 | -1 | -1 | -1 | ... | ... | ... | -1 | -1 |
| 10 | 154 | 34 | -1 | -1 | -1 | -1 | 141 | 86 | -1 | -1 | -1 | -1 | -1 | -1 | -1 | -1 | -1 | -1 | -1 | ... | ... | ... | -1 | -1 |
| 11 | 54 | -1 | -1 | -1 | -1 | -1 | -1 | 40 | -1 | 84 | -1 | -1 | -1 | 43 | -1 | -1 | -1 | -1 | -1 | ... | ... | ... | -1 | -1 |
| 12 | -1 | 31 | -1 | 90 | -1 | -1 | -1 | -1 | -1 | -1 | -1 | 113 | -1 | -1 | -1 | -1 | -1 | -1 | -1 | ... | ... | ... | -1 | -1 |
| 13 | 41 | 86 | -1 | -1 | -1 | -1 | -1 | 16 | -1 | -1 | -1 | -1 | 79 | -1 | -1 | -1 | -1 | -1 | -1 | ... | ... | ... | -1 | -1 |
| 14 | -1 | 10 | -1 | -1 | -1 | -1 | 28 | -1 | -1 | -1 | -1 | 128 | -1 | 104 | -1 | -1 | -1 | -1 | -1 | ... | ... | ... | -1 | -1 |
| 15 | 65 | -1 | -1 | -1 | -1 | -1 | -1 | -1 | -1 | -1 | 110 | -1 | -1 | -1 | -1 | -1 | -1 | -1 | -1 | ... | ... | ... | -1 | -1 |
| 16 | -1 | 24 | -1 | -1 | -1 | -1 | -1 | -1 | 63 | -1 | 0 | 33 | -1 | -1 | -1 | -1 | -1 | -1 | -1 | ... | ... | ... | -1 | -1 |
| 17 | -1 | 35 | -1 | -1 | -1 | 100 | -1 | -1 | -1 | -1 | 86 | 0 | -1 | -1 | -1 | -1 | -1 | -1 | -1 | ... | ... | ... | -1 | -1 |
| 18 | 129 | -1 | -1 | -1 | -1 | -1 | 37 | 149 | -1 | -1 | -1 | -1 | -1 | -1 | -1 | -1 | -1 | -1 | -1 | ... | ... | ... | -1 | -1 |
| 19 | 117 | 48 | -1 | -1 | -1 | -1 | -1 | -1 | -1 | -1 | 136 | -1 | -1 | -1 | -1 | -1 | -1 | -1 | -1 | ... | ... | ... | -1 | -1 |
| 20 | -1 | 47 | -1 | -1 | 28 | -1 | -1 | -1 | -1 | -1 | -1 | 150 | -1 | -1 | -1 | -1 | -1 | -1 | -1 | ... | ... | ... | -1 | -1 |
| 21 | 56 | -1 | -1 | -1 | -1 | -1 | -1 | -1 | 118 | -1 | -1 | -1 | -1 | 126 | -1 | -1 | -1 | -1 | -1 | ... | ... | ... | -1 | -1 |
| 22 | -1 | 40 | 125 | -1 | -1 | -1 | -1 | -1 | -1 | -1 | -1 | -1 | -1 | -1 | -1 | -1 | -1 | -1 | -1 | ... | ... | ... | -1 | -1 |
| 23 | 7 | -1 | -1 | 113 | -1 | 65 | -1 | -1 | -1 | -1 | -1 | -1 | -1 | -1 | -1 | -1 | -1 | -1 | -1 | ... | ... | ... | -1 | -1 |
| 24 | -1 | 135 | 16 | -1 | -1 | -1 | -1 | -1 | -1 | 93 | -1 | -1 | -1 | -1 | -1 | -1 | -1 | -1 | -1 | ... | ... | ... | -1 | -1 |
| 25 | 80 | -1 | -1 | -1 | -1 | 143 | -1 | -1 | -1 | -1 | -1 | -1 | -1 | -1 | -1 | -1 | -1 | -1 | -1 | ... | ... | ... | -1 | -1 |
| 26 | -1 | -1 | 42 | -1 | -1 | -1 | -1 | 144 | -1 | -1 | -1 | -1 | 125 | 19 | -1 | -1 | -1 | -1 | -1 | ... | ... | ... | -1 | -1 |
| 27 | 144 | -1 | -1 | -1 | -1 | -1 | 100 | -1 | -1 | -1 | -1 | -1 | -1 | -1 | -1 | -1 | -1 | -1 | -1 | ... | ... | ... | -1 | -1 |
| 28 | -1 | 124 | 52 | -1 | -1 | 116 | -1 | -1 | -1 | -1 | -1 | -1 | -1 | -1 | -1 | -1 | -1 | -1 | -1 | ... | ... | ... | -1 | -1 |
| 29 | 141 | -1 | -1 | -1 | 120 | -1 | -1 | -1 | -1 | -1 | -1 | -1 | -1 | -1 | -1 | -1 | -1 | -1 | -1 | ... | ... | ... | -1 | -1 |
| 30 | -1 | -1 | 68 | -1 | -1 | 33 | -1 | 62 | -1 | 32 | -1 | -1 | -1 | -1 | -1 | -1 | -1 | -1 | -1 | ... | ... | ... | -1 | -1 |
| 31 | -1 | 94 | -1 | -1 | -1 | -1 | -1 | -1 | -1 | -1 | -1 | -1 | 121 | -1 | -1 | -1 | -1 | -1 | -1 | ... | ... | ... | -1 | -1 |
| 32 | 0 | -1 | -1 | -1 | -1 | 133 | -1 | -1 | -1 | -1 | -1 | -1 | 92 | -1 | -1 | -1 | -1 | -1 | -1 | ... | ... | ... | -1 | -1 |
| 33 | -1 | -1 | 6 | -1 | -1 | -1 | -1 | 103 | -1 | -1 | 89 | -1 | -1 | -1 | -1 | -1 | -1 | -1 | -1 | ... | ... | ... | -1 | -1 |
| 34 | 70 | -1 | -1 | -1 | -1 | -1 | -1 | -1 | -1 | -1 | -1 | 78 | 127 | -1 | -1 | -1 | -1 | -1 | -1 | ... | ... | ... | -1 | -1 |
| 35 | -1 | 63 | -1 | -1 | -1 | 132 | -1 | -1 | -1 | -1 | 36 | -1 | -1 | -1 | -1 | -1 | -1 | -1 | -1 | ... | ... | ... | -1 | -1 |
| 36 | 99 | -1 | 83 | -1 | -1 | -1 | -1 | 108 | -1 | -1 | -1 | -1 | -1 | -1 | -1 | -1 | -1 | -1 | -1 | ... | ... | ... | -1 | -1 |
| 37 | -1 | -1 | -1 | -1 | -1 | -1 | -1 | -1 | 50 | -1 | -1 | -1 | 97 | -1 | -1 | -1 | -1 | -1 | -1 | ... | ... | ... | -1 | -1 |
| 38 | -1 | 151 | -1 | -1 | -1 | 64 | -1 | -1 | -1 | -1 | 32 | -1 | -1 | -1 | -1 | -1 | -1 | -1 | -1 | ... | ... | ... | -1 | -1 |
| 39 | 27 | -1 | -1 | -1 | -1 | -1 | 61 | -1 | -1 | -1 | -1 | 51 | -1 | -1 | -1 | -1 | -1 | -1 | -1 | ... | ... | ... | -1 | -1 |
| 40 | -1 | -1 | 78 | -1 | -1 | -1 | -1 | -1 | -1 | 76 | -1 | -1 | 111 | -1 | -1 | -1 | -1 | -1 | -1 | ... | ... | ... | 0 | -1 |
| 41 | -1 | 30 | -1 | -1 | -1 | 156 | -1 | -1 | -1 | -1 | -1 | 103 | -1 | -1 | -1 | -1 | -1 | -1 | -1 | ... | ... | ... | -1 | 0 |

| | 0 | 1 | 2 | 3 | 4 | 5 | 6 | 7 | 8 | 9 | 10 | 11 | 12 | 13 | 14 | 15 | 16 | 17 | 18 | ... | ... | ... | 50 | 51 |
|---|---|---|---|---|---|---|---|---|---|---|---|---|---|---|---|---|---|---|---|---|---|---|---|---|
| 0 | 6 | 11 | 117 | 94 | -1 | -1 | 36 | -1 | -1 | 2 | 0 | 0 | -1 | -1 | -1 | -1 | -1 | -1 | -1 | ... | ... | ... | -1 | -1 |
| 1 | 63 | -1 | -1 | 100 | 10 | 4 | 52 | 13 | 26 | 97 | -1 | 0 | 0 | -1 | -1 | -1 | -1 | -1 | -1 | ... | ... | ... | -1 | -1 |
| 2 | 3 | 36 | -1 | 3 | 142 | -1 | -1 | -1 | 34 | -1 | 1 | -1 | 0 | 0 | -1 | -1 | -1 | -1 | -1 | ... | ... | ... | -1 | -1 |
| 3 | -1 | 88 | 125 | -1 | 127 | 7 | 11 | 68 | 112 | 23 | 0 | -1 | -1 | 0 | -1 | -1 | -1 | -1 | -1 | ... | ... | ... | -1 | -1 |
| 4 | 106 | 37 | -1 | -1 | -1 | -1 | -1 | -1 | -1 | -1 | -1 | 27 | -1 | -1 | 0 | -1 | -1 | -1 | -1 | ... | ... | ... | -1 | -1 |
| 5 | 15 | 133 | -1 | -1 | -1 | 21 | -1 | 101 | -1 | -1 | -1 | 46 | -1 | -1 | -1 | 0 | -1 | -1 | -1 | ... | ... | ... | -1 | -1 |
| 6 | 26 | -1 | -1 | -1 | 34 | -1 | 37 | -1 | 99 | -1 | 139 | -1 | -1 | -1 | -1 | -1 | 0 | -1 | -1 | ... | ... | ... | -1 | -1 |
| 7 | -1 | 136 | -1 | -1 | 61 | -1 | 120 | -1 | -1 | -1 | 133 | -1 | 77 | -1 | -1 | -1 | -1 | 0 | -1 | ... | ... | ... | -1 | -1 |
| 8 | 77 | 4 | -1 | -1 | -1 | -1 | -1 | -1 | -1 | -1 | -1 | 72 | -1 | -1 | -1 | -1 | -1 | -1 | 0 | ... | ... | ... | -1 | -1 |
| 9 | -1 | 18 | -1 | -1 | -1 | -1 | -1 | 13 | -1 | 77 | 22 | -1 | -1 | -1 | -1 | -1 | -1 | -1 | -1 | ... | ... | ... | -1 | -1 |
| 10 | 37 | 102 | -1 | -1 | -1 | -1 | 131 | 103 | -1 | -1 | -1 | -1 | -1 | -1 | -1 | -1 | -1 | -1 | -1 | ... | ... | ... | -1 | -1 |
| 11 | 50 | -1 | -1 | -1 | -1 | -1 | -1 | 103 | -1 | 95 | -1 | -1 | -1 | 103 | -1 | -1 | -1 | -1 | -1 | ... | ... | ... | -1 | -1 |
| 12 | -1 | 65 | -1 | 105 | -1 | -1 | -1 | -1 | -1 | -1 | -1 | 88 | -1 | -1 | -1 | -1 | -1 | -1 | -1 | ... | ... | ... | -1 | -1 |
| 13 | 77 | 95 | -1 | -1 | -1 | -1 | -1 | -1 | 14 | -1 | -1 | -1 | -1 | 105 | -1 | -1 | -1 | -1 | -1 | ... | ... | ... | -1 | -1 |
| 14 | -1 | 49 | -1 | -1 | -1 | 55 | -1 | -1 | -1 | -1 | 41 | -1 | 124 | -1 | -1 | -1 | -1 | -1 | -1 | ... | ... | ... | -1 | -1 |
| 15 | 21 | -1 | -1 | -1 | -1 | -1 | -1 | -1 | -1 | 90 | 22 | -1 | -1 | -1 | -1 | -1 | -1 | -1 | -1 | ... | ... | ... | -1 | -1 |
| 16 | -1 | 129 | -1 | -1 | -1 | -1 | -1 | -1 | 9 | -1 | 68 | 37 | -1 | -1 | -1 | -1 | -1 | -1 | -1 | ... | ... | ... | -1 | -1 |
| 17 | -1 | 25 | -1 | -1 | 143 | -1 | -1 | -1 | -1 | -1 | 34 | 10 | -1 | -1 | -1 | -1 | -1 | -1 | -1 | ... | ... | ... | -1 | -1 |
| 18 | 98 | -1 | -1 | -1 | -1 | -1 | 112 | 78 | -1 | -1 | -1 | -1 | -1 | -1 | -1 | -1 | -1 | -1 | -1 | ... | ... | ... | -1 | -1 |
| 19 | 51 | 37 | -1 | -1 | -1 | -1 | -1 | -1 | -1 | 86 | -1 | -1 | -1 | -1 | -1 | -1 | -1 | -1 | -1 | ... | ... | ... | -1 | -1 |
| 20 | -1 | 67 | -1 | -1 | 0 | -1 | -1 | -1 | -1 | -1 | -1 | 101 | -1 | -1 | -1 | -1 | -1 | -1 | -1 | ... | ... | ... | -1 | -1 |
| 21 | 135 | -1 | -1 | -1 | -1 | -1 | -1 | 52 | -1 | -1 | -1 | -1 | 88 | -1 | -1 | -1 | -1 | -1 | -1 | ... | ... | ... | -1 | -1 |
| 22 | -1 | 136 | 1 | -1 | -1 | -1 | -1 | -1 | -1 | -1 | -1 | -1 | -1 | -1 | -1 | -1 | -1 | -1 | -1 | ... | ... | ... | -1 | -1 |
| 23 | 9 | -1 | -1 | 142 | -1 | 121 | -1 | -1 | -1 | -1 | -1 | -1 | -1 | -1 | -1 | -1 | -1 | -1 | -1 | ... | ... | ... | -1 | -1 |
| 24 | -1 | 122 | 26 | -1 | -1 | -1 | -1 | -1 | -1 | 125 | -1 | -1 | -1 | -1 | -1 | -1 | -1 | -1 | -1 | ... | ... | ... | -1 | -1 |
| 25 | 10 | -1 | -1 | -1 | -1 | 128 | -1 | -1 | -1 | -1 | -1 | -1 | -1 | -1 | -1 | -1 | -1 | -1 | -1 | ... | ... | ... | -1 | -1 |
| 26 | -1 | -1 | 111 | -1 | -1 | -1 | -1 | 106 | -1 | -1 | -1 | -1 | 142 | 98 | -1 | -1 | -1 | -1 | -1 | ... | ... | ... | -1 | -1 |
| 27 | 19 | -1 | -1 | -1 | -1 | -1 | 7 | -1 | -1 | -1 | -1 | -1 | -1 | -1 | -1 | -1 | -1 | -1 | -1 | ... | ... | ... | -1 | -1 |
| 28 | -1 | 55 | 68 | -1 | -1 | 120 | -1 | -1 | -1 | -1 | -1 | -1 | -1 | -1 | -1 | -1 | -1 | -1 | -1 | ... | ... | ... | -1 | -1 |
| 29 | 40 | -1 | -1 | -1 | 19 | -1 | -1 | -1 | -1 | -1 | -1 | -1 | -1 | -1 | -1 | -1 | -1 | -1 | -1 | ... | ... | ... | -1 | -1 |
| 30 | -1 | -1 | 126 | -1 | -1 | 113 | -1 | 112 | -1 | 37 | -1 | -1 | -1 | -1 | -1 | -1 | -1 | -1 | -1 | ... | ... | ... | -1 | -1 |
| 31 | -1 | 107 | -1 | -1 | -1 | -1 | -1 | -1 | -1 | -1 | -1 | -1 | 130 | -1 | -1 | -1 | -1 | -1 | -1 | ... | ... | ... | -1 | -1 |
| 32 | 2 | -1 | -1 | -1 | -1 | 66 | -1 | -1 | -1 | -1 | -1 | -1 | 68 | -1 | -1 | -1 | -1 | -1 | -1 | ... | ... | ... | -1 | -1 |
| 33 | -1 | -1 | 95 | -1 | -1 | -1 | 115 | -1 | -1 | 37 | -1 | -1 | -1 | -1 | -1 | -1 | -1 | -1 | -1 | ... | ... | ... | -1 | -1 |
| 34 | 56 | -1 | -1 | -1 | -1 | -1 | -1 | -1 | -1 | -1 | -1 | 10 | 16 | -1 | -1 | -1 | -1 | -1 | -1 | ... | ... | ... | -1 | -1 |
| 35 | -1 | 12 | -1 | -1 | -1 | 43 | -1 | -1 | -1 | -1 | -1 | 15 | -1 | -1 | -1 | -1 | -1 | -1 | -1 | ... | ... | ... | -1 | -1 |
| 36 | 96 | -1 | 116 | -1 | -1 | -1 | -1 | 70 | -1 | -1 | -1 | -1 | -1 | -1 | -1 | -1 | -1 | -1 | -1 | ... | ... | ... | -1 | -1 |
| 37 | -1 | -1 | -1 | -1 | -1 | -1 | -1 | -1 | -1 | 31 | -1 | -1 | 74 | -1 | -1 | -1 | -1 | -1 | -1 | ... | ... | ... | -1 | -1 |
| 38 | -1 | 124 | -1 | -1 | -1 | 91 | -1 | -1 | -1 | -1 | 100 | -1 | -1 | -1 | -1 | -1 | -1 | -1 | -1 | ... | ... | ... | -1 | -1 |
| 39 | 11 | -1 | -1 | -1 | -1 | -1 | 2 | -1 | -1 | -1 | -1 | 121 | -1 | -1 | -1 | -1 | -1 | -1 | -1 | ... | ... | ... | -1 | -1 |
| 40 | -1 | -1 | 101 | -1 | -1 | -1 | -1 | -1 | -1 | 24 | -1 | -1 | 37 | -1 | -1 | -1 | -1 | -1 | -1 | ... | ... | ... | 0 | -1 |
| 41 | -1 | 88 | -1 | -1 | -1 | 89 | -1 | -1 | -1 | -1 | -1 | 23 | -1 | -1 | -1 | -1 | -1 | -1 | -1 | ... | ... | ... | -1 | 0 |

| | 0 | 1 | 2 | 3 | 4 | 5 | 6 | 7 | 8 | 9 | 10 | 11 | 12 | 13 | 14 | 15 | 16 | 17 | 18 | ... | ... | ... | 50 | 51 |
|---|---|---|---|---|---|---|---|---|---|---|---|---|---|---|---|---|---|---|---|---|---|---|---|---|
| 0 | 109 | 223 | 171 | 209 | −1 | −1 | 4 | −1 | −1 | 0 | 0 | 0 | −1 | −1 | −1 | −1 | −1 | −1 | −1 | ... | ... | ... | −1 | −1 |
| 1 | 36 | −1 | −1 | 236 | 40 | 226 | 226 | 157 | 11 | 204 | −1 | 0 | 0 | −1 | −1 | −1 | −1 | −1 | −1 | ... | ... | ... | −1 | −1 |
| 2 | 15 | 131 | −1 | 70 | 84 | −1 | −1 | −1 | 170 | −1 | 1 | −1 | 0 | 0 | −1 | −1 | −1 | −1 | −1 | ... | ... | ... | −1 | −1 |
| 3 | −1 | 135 | 193 | −1 | 97 | 158 | 177 | 11 | 96 | 223 | 0 | −1 | −1 | 0 | −1 | −1 | −1 | −1 | −1 | ... | ... | ... | −1 | −1 |
| 4 | 117 | 19 | −1 | −1 | −1 | −1 | −1 | −1 | −1 | −1 | 78 | −1 | −1 | 0 | −1 | −1 | −1 | −1 | −1 | ... | ... | ... | −1 | −1 |
| 5 | 40 | 119 | −1 | −1 | −1 | 116 | −1 | 133 | −1 | −1 | 102 | −1 | −1 | −1 | 0 | −1 | −1 | −1 | −1 | ... | ... | ... | −1 | −1 |
| 6 | 6 | −1 | −1 | −1 | −1 | 37 | −1 | 77 | −1 | 213 | −1 | 138 | −1 | −1 | −1 | 0 | −1 | −1 | −1 | ... | ... | ... | −1 | −1 |
| 7 | −1 | 156 | −1 | −1 | −1 | 215 | −1 | 29 | −1 | −1 | −1 | 120 | −1 | 243 | −1 | −1 | 0 | −1 | −1 | ... | ... | ... | −1 | −1 |
| 8 | 76 | 167 | −1 | −1 | −1 | −1 | −1 | −1 | −1 | −1 | −1 | −1 | 210 | −1 | −1 | −1 | −1 | 0 | −1 | ... | ... | ... | −1 | −1 |
| 9 | −1 | 241 | −1 | −1 | −1 | −1 | −1 | −1 | 44 | −1 | 22 | 51 | −1 | −1 | −1 | −1 | −1 | −1 | −1 | ... | ... | ... | −1 | −1 |
| 10 | 244 | 221 | −1 | −1 | −1 | −1 | 206 | 250 | −1 | −1 | −1 | −1 | −1 | −1 | −1 | −1 | −1 | −1 | −1 | ... | ... | ... | −1 | −1 |
| 11 | 194 | −1 | −1 | −1 | −1 | −1 | −1 | 174 | −1 | 95 | −1 | −1 | −1 | 199 | −1 | −1 | −1 | −1 | −1 | ... | ... | ... | −1 | −1 |
| 12 | −1 | 66 | −1 | 134 | −1 | −1 | −1 | −1 | −1 | −1 | 255 | −1 | −1 | −1 | −1 | −1 | −1 | −1 | −1 | ... | ... | ... | −1 | −1 |
| 13 | 98 | 159 | −1 | −1 | −1 | −1 | −1 | 68 | −1 | −1 | −1 | −1 | 17 | −1 | −1 | −1 | −1 | −1 | −1 | ... | ... | ... | −1 | −1 |
| 14 | −1 | 245 | −1 | −1 | −1 | 185 | −1 | −1 | −1 | −1 | 91 | −1 | 249 | −1 | −1 | −1 | −1 | −1 | −1 | ... | ... | ... | −1 | −1 |
| 15 | 53 | −1 | −1 | −1 | −1 | −1 | −1 | −1 | −1 | 237 | 103 | −1 | −1 | −1 | −1 | −1 | −1 | −1 | −1 | ... | ... | ... | −1 | −1 |
| 16 | −1 | 19 | −1 | −1 | −1 | −1 | −1 | −1 | 214 | −1 | 151 | 241 | −1 | −1 | −1 | −1 | −1 | −1 | −1 | ... | ... | ... | −1 | −1 |
| 17 | −1 | 185 | −1 | −1 | −1 | 237 | −1 | −1 | −1 | −1 | 41 | 122 | −1 | −1 | −1 | −1 | −1 | −1 | −1 | ... | ... | ... | −1 | −1 |
| 18 | 111 | −1 | −1 | −1 | −1 | 211 | 225 | −1 | −1 | −1 | −1 | −1 | −1 | −1 | −1 | −1 | −1 | −1 | −1 | ... | ... | ... | −1 | −1 |
| 19 | 150 | 38 | −1 | −1 | −1 | −1 | −1 | −1 | −1 | 66 | −1 | −1 | −1 | −1 | −1 | −1 | −1 | −1 | −1 | ... | ... | ... | −1 | −1 |
| 20 | −1 | 191 | −1 | −1 | 250 | −1 | −1 | −1 | −1 | −1 | −1 | 214 | −1 | −1 | −1 | −1 | −1 | −1 | −1 | ... | ... | ... | −1 | −1 |
| 21 | 2 | −1 | −1 | −1 | −1 | −1 | −1 | −1 | 232 | −1 | −1 | −1 | 76 | −1 | −1 | −1 | −1 | −1 | −1 | ... | ... | ... | −1 | −1 |
| 22 | −1 | 147 | 134 | −1 | −1 | −1 | −1 | −1 | −1 | −1 | −1 | −1 | −1 | −1 | −1 | −1 | −1 | −1 | −1 | ... | ... | ... | −1 | −1 |
| 23 | 25 | −1 | −1 | 235 | −1 | 194 | −1 | −1 | −1 | −1 | −1 | −1 | −1 | −1 | −1 | −1 | −1 | −1 | −1 | ... | ... | ... | −1 | −1 |
| 24 | −1 | 6 | 11 | −1 | −1 | −1 | −1 | −1 | 173 | −1 | −1 | −1 | −1 | −1 | −1 | −1 | −1 | −1 | −1 | ... | ... | ... | −1 | −1 |
| 25 | 11 | −1 | −1 | −1 | −1 | 0 | −1 | −1 | −1 | −1 | −1 | −1 | −1 | −1 | −1 | −1 | −1 | −1 | −1 | ... | ... | ... | −1 | −1 |
| 26 | −1 | −1 | 6 | −1 | −1 | −1 | −1 | 232 | −1 | −1 | −1 | 226 | 202 | −1 | −1 | −1 | −1 | −1 | −1 | ... | ... | ... | −1 | −1 |
| 27 | 232 | −1 | −1 | −1 | −1 | −1 | 19 | −1 | −1 | −1 | −1 | −1 | −1 | −1 | −1 | −1 | −1 | −1 | −1 | ... | ... | ... | −1 | −1 |
| 28 | −1 | 193 | 23 | −1 | −1 | 142 | −1 | −1 | −1 | −1 | −1 | −1 | −1 | −1 | −1 | −1 | −1 | −1 | −1 | ... | ... | ... | −1 | −1 |
| 29 | 0 | −1 | −1 | −1 | 112 | −1 | −1 | −1 | −1 | −1 | −1 | −1 | −1 | −1 | −1 | −1 | −1 | −1 | −1 | ... | ... | ... | −1 | −1 |
| 30 | −1 | −1 | 31 | −1 | −1 | 245 | −1 | 12 | −1 | 2 | −1 | −1 | −1 | −1 | −1 | −1 | −1 | −1 | −1 | ... | ... | ... | −1 | −1 |
| 31 | −1 | 0 | −1 | −1 | −1 | −1 | −1 | −1 | −1 | −1 | −1 | −1 | 152 | −1 | −1 | −1 | −1 | −1 | −1 | ... | ... | ... | −1 | −1 |
| 32 | 5 | −1 | −1 | −1 | 24 | −1 | −1 | −1 | −1 | −1 | −1 | 132 | −1 | −1 | −1 | −1 | −1 | −1 | −1 | ... | ... | ... | −1 | −1 |
| 33 | −1 | −1 | 80 | −1 | −1 | −1 | 145 | −1 | −1 | 26 | −1 | −1 | −1 | −1 | −1 | −1 | −1 | −1 | −1 | ... | ... | ... | −1 | −1 |
| 34 | 27 | −1 | −1 | −1 | −1 | −1 | −1 | −1 | −1 | −1 | −1 | 192 | 73 | −1 | −1 | −1 | −1 | −1 | −1 | ... | ... | ... | −1 | −1 |
| 35 | −1 | 84 | −1 | −1 | −1 | 218 | −1 | −1 | −1 | −1 | −1 | 201 | −1 | −1 | −1 | −1 | −1 | −1 | −1 | ... | ... | ... | −1 | −1 |
| 36 | 164 | −1 | 115 | −1 | −1 | −1 | −1 | 183 | −1 | −1 | −1 | −1 | −1 | −1 | −1 | −1 | −1 | −1 | −1 | ... | ... | ... | −1 | −1 |
| 37 | −1 | −1 | −1 | −1 | −1 | −1 | −1 | −1 | −1 | 19 | −1 | −1 | 20 | −1 | −1 | −1 | −1 | −1 | −1 | ... | ... | ... | −1 | −1 |
| 38 | −1 | 109 | −1 | −1 | −1 | 143 | −1 | −1 | −1 | −1 | 119 | −1 | −1 | −1 | −1 | −1 | −1 | −1 | −1 | ... | ... | ... | −1 | −1 |
| 39 | 180 | −1 | −1 | −1 | −1 | −1 | −1 | 143 | −1 | −1 | −1 | 135 | −1 | −1 | −1 | −1 | −1 | −1 | −1 | ... | ... | ... | −1 | −1 |
| 40 | −1 | −1 | 164 | −1 | −1 | −1 | −1 | −1 | −1 | −1 | 31 | −1 | −1 | 13 | −1 | −1 | −1 | −1 | −1 | ... | ... | ... | 0 | −1 |
| 41 | −1 | 230 | −1 | −1 | −1 | 167 | −1 | −1 | −1 | −1 | −1 | 122 | −1 | −1 | −1 | −1 | −1 | −1 | −1 | ... | ... | ... | −1 | 0 |

FIG. 3b-5

| | 0 | 1 | 2 | 3 | 4 | 5 | 6 | 7 | 8 | 9 | 10 | 11 | 12 | 13 | 14 | 15 | 16 | 17 | 18 | ... | ... | ... | 50 | 51 |
|---|---|---|---|---|---|---|---|---|---|---|---|---|---|---|---|---|---|---|---|---|---|---|---|---|
| 0 | 56 | 19 | 221 | 119 | -1 | -1 | 219 | -1 | -1 | 33 | 0 | 0 | -1 | -1 | -1 | -1 | -1 | -1 | -1 | ... | ... | ... | -1 | -1 |
| 1 | 119 | -1 | -1 | 5 | 115 | 64 | 208 | 120 | 95 | 131 | -1 | 0 | 0 | -1 | -1 | -1 | -1 | -1 | -1 | ... | ... | ... | -1 | -1 |
| 2 | 156 | 156 | -1 | 161 | 84 | -1 | -1 | -1 | 145 | -1 | 1 | -1 | 0 | 0 | -1 | -1 | -1 | -1 | -1 | ... | ... | ... | -1 | -1 |
| 3 | -1 | 26 | 64 | -1 | 118 | 197 | 186 | 106 | 127 | 186 | 0 | -1 | -1 | 0 | -1 | -1 | -1 | -1 | -1 | ... | ... | ... | -1 | -1 |
| 4 | 171 | 69 | -1 | -1 | -1 | -1 | -1 | -1 | -1 | -1 | -1 | 168 | -1 | -1 | 0 | -1 | -1 | -1 | -1 | ... | ... | ... | -1 | -1 |
| 5 | 120 | 154 | -1 | -1 | -1 | 27 | -1 | 212 | -1 | -1 | -1 | 202 | -1 | -1 | -1 | 0 | -1 | -1 | -1 | ... | ... | ... | -1 | -1 |
| 6 | 89 | -1 | -1 | -1 | -1 | 2 | -1 | 20 | -1 | 5 | -1 | 218 | -1 | -1 | -1 | -1 | 0 | -1 | -1 | ... | ... | ... | -1 | -1 |
| 7 | -1 | 239 | -1 | -1 | -1 | 75 | -1 | 165 | -1 | -1 | -1 | 24 | -1 | 20 | -1 | -1 | -1 | 0 | -1 | ... | ... | ... | -1 | -1 |
| 8 | 229 | 144 | -1 | -1 | -1 | -1 | -1 | -1 | -1 | -1 | -1 | -1 | 159 | -1 | -1 | -1 | -1 | -1 | 0 | ... | ... | ... | -1 | -1 |
| 9 | -1 | 234 | -1 | -1 | -1 | -1 | -1 | -1 | 2 | -1 | 67 | 129 | -1 | -1 | -1 | -1 | -1 | -1 | -1 | ... | ... | ... | -1 | -1 |
| 10 | 178 | 155 | -1 | -1 | -1 | -1 | 217 | 237 | -1 | -1 | -1 | -1 | -1 | -1 | -1 | -1 | -1 | -1 | -1 | ... | ... | ... | -1 | -1 |
| 11 | 187 | -1 | -1 | -1 | -1 | -1 | -1 | 185 | -1 | 180 | -1 | -1 | -1 | 22 | -1 | -1 | -1 | -1 | -1 | ... | ... | ... | -1 | -1 |
| 12 | -1 | 171 | -1 | 118 | -1 | -1 | -1 | -1 | -1 | -1 | -1 | 221 | -1 | -1 | -1 | -1 | -1 | -1 | -1 | ... | ... | ... | -1 | -1 |
| 13 | 154 | 14 | -1 | -1 | -1 | -1 | -1 | -1 | 104 | -1 | -1 | -1 | -1 | 61 | -1 | -1 | -1 | -1 | -1 | ... | ... | ... | -1 | -1 |
| 14 | -1 | 105 | -1 | -1 | -1 | -1 | 146 | -1 | -1 | -1 | -1 | 38 | -1 | 76 | -1 | -1 | -1 | -1 | -1 | ... | ... | ... | -1 | -1 |
| 15 | 231 | -1 | -1 | -1 | -1 | -1 | -1 | -1 | -1 | -1 | 149 | 173 | -1 | -1 | -1 | -1 | -1 | -1 | -1 | ... | ... | ... | -1 | -1 |
| 16 | -1 | 145 | -1 | -1 | -1 | -1 | -1 | -1 | -1 | 196 | -1 | 16 | 168 | -1 | -1 | -1 | -1 | -1 | -1 | ... | ... | ... | -1 | -1 |
| 17 | -1 | 206 | -1 | -1 | -1 | 170 | -1 | -1 | -1 | -1 | -1 | 43 | 234 | -1 | -1 | -1 | -1 | -1 | -1 | ... | ... | ... | -1 | -1 |
| 18 | 61 | -1 | -1 | -1 | -1 | -1 | 36 | 109 | -1 | -1 | -1 | -1 | -1 | -1 | -1 | -1 | -1 | -1 | -1 | ... | ... | ... | -1 | -1 |
| 19 | 16 | 153 | -1 | -1 | -1 | -1 | -1 | -1 | -1 | 85 | -1 | -1 | -1 | -1 | -1 | -1 | -1 | -1 | -1 | ... | ... | ... | -1 | -1 |
| 20 | -1 | 108 | -1 | -1 | 39 | -1 | -1 | -1 | -1 | -1 | -1 | 31 | -1 | -1 | -1 | -1 | -1 | -1 | -1 | ... | ... | ... | -1 | -1 |
| 21 | 118 | -1 | -1 | -1 | -1 | -1 | -1 | 97 | -1 | -1 | -1 | -1 | 44 | -1 | -1 | -1 | -1 | -1 | -1 | ... | ... | ... | -1 | -1 |
| 22 | -1 | 17 | 188 | -1 | -1 | -1 | -1 | -1 | -1 | -1 | -1 | -1 | -1 | -1 | -1 | -1 | -1 | -1 | -1 | ... | ... | ... | -1 | -1 |
| 23 | 16 | -1 | -1 | 52 | -1 | 101 | -1 | -1 | -1 | -1 | -1 | -1 | -1 | -1 | -1 | -1 | -1 | -1 | -1 | ... | ... | ... | -1 | -1 |
| 24 | -1 | 199 | 137 | -1 | -1 | -1 | -1 | -1 | -1 | 194 | -1 | -1 | -1 | -1 | -1 | -1 | -1 | -1 | -1 | ... | ... | ... | -1 | -1 |
| 25 | 17 | -1 | -1 | -1 | -1 | 115 | -1 | -1 | -1 | -1 | -1 | -1 | -1 | -1 | -1 | -1 | -1 | -1 | -1 | ... | ... | ... | -1 | -1 |
| 26 | -1 | -1 | 239 | -1 | -1 | -1 | 173 | -1 | -1 | -1 | -1 | 193 | 116 | -1 | -1 | -1 | -1 | -1 | -1 | ... | ... | ... | -1 | -1 |
| 27 | 18 | -1 | -1 | -1 | -1 | -1 | 171 | -1 | -1 | -1 | -1 | -1 | -1 | -1 | -1 | -1 | -1 | -1 | -1 | ... | ... | ... | -1 | -1 |
| 28 | -1 | 88 | 128 | -1 | -1 | 66 | -1 | -1 | -1 | -1 | -1 | -1 | -1 | -1 | -1 | -1 | -1 | -1 | -1 | ... | ... | ... | -1 | -1 |
| 29 | 181 | -1 | -1 | -1 | 13 | -1 | -1 | -1 | -1 | -1 | -1 | -1 | -1 | -1 | -1 | -1 | -1 | -1 | -1 | ... | ... | ... | -1 | -1 |
| 30 | -1 | -1 | 231 | -1 | -1 | 177 | -1 | 12 | -1 | 17 | -1 | -1 | -1 | -1 | -1 | -1 | -1 | -1 | -1 | ... | ... | ... | -1 | -1 |
| 31 | -1 | 6 | -1 | -1 | -1 | -1 | -1 | -1 | -1 | -1 | -1 | -1 | 204 | -1 | -1 | -1 | -1 | -1 | -1 | ... | ... | ... | -1 | -1 |
| 32 | 130 | -1 | -1 | -1 | -1 | 214 | -1 | -1 | -1 | -1 | -1 | -1 | 67 | -1 | -1 | -1 | -1 | -1 | -1 | ... | ... | ... | -1 | -1 |
| 33 | -1 | -1 | 235 | -1 | -1 | -1 | 192 | -1 | -1 | 65 | -1 | -1 | -1 | -1 | -1 | -1 | -1 | -1 | -1 | ... | ... | ... | -1 | -1 |
| 34 | 123 | -1 | -1 | -1 | -1 | -1 | -1 | -1 | -1 | -1 | -1 | 42 | 2 | -1 | -1 | -1 | -1 | -1 | -1 | ... | ... | ... | -1 | -1 |
| 35 | -1 | 123 | -1 | -1 | 135 | -1 | -1 | -1 | -1 | -1 | 5 | -1 | -1 | -1 | -1 | -1 | -1 | -1 | -1 | ... | ... | ... | -1 | -1 |
| 36 | 125 | -1 | 190 | -1 | -1 | -1 | 90 | -1 | -1 | -1 | -1 | -1 | -1 | -1 | -1 | -1 | -1 | -1 | -1 | ... | ... | ... | -1 | -1 |
| 37 | -1 | -1 | -1 | -1 | -1 | -1 | -1 | -1 | 78 | -1 | -1 | 190 | -1 | -1 | -1 | -1 | -1 | -1 | -1 | ... | ... | ... | -1 | -1 |
| 38 | -1 | 90 | -1 | -1 | -1 | 126 | -1 | -1 | -1 | -1 | 234 | -1 | -1 | -1 | -1 | -1 | -1 | -1 | -1 | ... | ... | ... | -1 | -1 |
| 39 | 164 | -1 | -1 | -1 | -1 | -1 | -1 | 134 | -1 | -1 | -1 | 200 | -1 | -1 | -1 | -1 | -1 | -1 | -1 | ... | ... | ... | -1 | -1 |
| 40 | -1 | -1 | 239 | -1 | -1 | -1 | -1 | -1 | -1 | 17 | -1 | -1 | 63 | -1 | -1 | -1 | -1 | -1 | -1 | ... | ... | ... | 0 | -1 |
| 41 | -1 | 99 | -1 | -1 | -1 | 94 | -1 | -1 | -1 | -1 | -1 | 181 | -1 | -1 | -1 | -1 | -1 | -1 | -1 | ... | ... | ... | -1 | 0 |

| | 0 | 1 | 2 | 3 | 4 | 5 | 6 | 7 | 8 | 9 | 10 | 11 | 12 | 13 | 14 | 15 | 16 | 17 | 18 | ... | ... | ... | 50 | 51 |
|---|---|---|---|---|---|---|---|---|---|---|---|---|---|---|---|---|---|---|---|---|---|---|---|---|
| 0 | 191 | 100 | 49 | 135 | -1 | -1 | 36 | -1 | -1 | 80 | 0 | 0 | -1 | -1 | -1 | -1 | -1 | -1 | -1 | ... | ... | ... | -1 | -1 |
| 1 | 119 | -1 | -1 | 26 | 219 | 57 | 199 | 89 | 25 | 42 | -1 | 0 | 0 | -1 | -1 | -1 | -1 | -1 | -1 | ... | ... | ... | -1 | -1 |
| 2 | 19 | 25 | -1 | 6 | 131 | -1 | -1 | -1 | 55 | -1 | 1 | -1 | 0 | 0 | -1 | -1 | -1 | -1 | -1 | ... | ... | ... | -1 | -1 |
| 3 | -1 | 103 | 90 | -1 | 140 | 4 | 38 | 53 | 29 | 36 | 0 | -1 | -1 | 0 | -1 | -1 | -1 | -1 | -1 | ... | ... | ... | -1 | -1 |
| 4 | 172 | 35 | -1 | -1 | -1 | -1 | -1 | -1 | -1 | -1 | -1 | 17 | -1 | -1 | 0 | -1 | -1 | -1 | -1 | ... | ... | ... | -1 | -1 |
| 5 | 96 | 121 | -1 | -1 | -1 | 80 | -1 | 207 | -1 | -1 | -1 | 183 | -1 | -1 | -1 | 0 | -1 | -1 | -1 | ... | ... | ... | -1 | -1 |
| 6 | 6 | -1 | -1 | -1 | 143 | -1 | 86 | -1 | 15 | -1 | 98 | -1 | -1 | -1 | -1 | -1 | 0 | -1 | -1 | ... | ... | ... | -1 | -1 |
| 7 | -1 | 16 | -1 | -1 | 18 | -1 | 28 | -1 | -1 | -1 | 69 | -1 | 50 | -1 | -1 | -1 | -1 | 0 | -1 | ... | ... | ... | -1 | -1 |
| 8 | 17 | 19 | -1 | -1 | -1 | -1 | -1 | -1 | -1 | -1 | -1 | 77 | -1 | -1 | -1 | -1 | -1 | -1 | 0 | ... | ... | ... | -1 | -1 |
| 9 | -1 | 207 | -1 | -1 | -1 | -1 | -1 | -1 | 199 | -1 | 87 | 39 | -1 | -1 | -1 | -1 | -1 | -1 | -1 | ... | ... | ... | -1 | -1 |
| 10 | 34 | 202 | -1 | -1 | -1 | -1 | 29 | 174 | -1 | -1 | -1 | -1 | -1 | -1 | -1 | -1 | -1 | -1 | -1 | ... | ... | ... | -1 | -1 |
| 11 | 176 | -1 | -1 | -1 | -1 | -1 | -1 | 19 | -1 | 222 | -1 | -1 | -1 | 201 | -1 | -1 | -1 | -1 | -1 | ... | ... | ... | -1 | -1 |
| 12 | -1 | 33 | -1 | 100 | -1 | -1 | -1 | -1 | -1 | -1 | 55 | -1 | -1 | -1 | -1 | -1 | -1 | -1 | -1 | ... | ... | ... | -1 | -1 |
| 13 | 3 | 155 | -1 | -1 | -1 | -1 | -1 | -1 | 114 | -1 | -1 | -1 | -1 | 195 | -1 | -1 | -1 | -1 | -1 | ... | ... | ... | -1 | -1 |
| 14 | -1 | 168 | -1 | -1 | -1 | -1 | 14 | -1 | -1 | -1 | -1 | 198 | -1 | 14 | -1 | -1 | -1 | -1 | -1 | ... | ... | ... | -1 | -1 |
| 15 | 77 | -1 | -1 | -1 | -1 | -1 | -1 | -1 | -1 | 81 | 212 | -1 | -1 | -1 | -1 | -1 | -1 | -1 | -1 | ... | ... | ... | -1 | -1 |
| 16 | -1 | 26 | -1 | -1 | -1 | -1 | -1 | -1 | -1 | 31 | -1 | 193 | 20 | -1 | -1 | -1 | -1 | -1 | -1 | ... | ... | ... | -1 | -1 |
| 17 | -1 | 40 | -1 | -1 | -1 | 89 | -1 | -1 | -1 | -1 | -1 | 27 | 194 | -1 | -1 | -1 | -1 | -1 | -1 | ... | ... | ... | -1 | -1 |
| 18 | 33 | -1 | -1 | -1 | -1 | -1 | 132 | 194 | -1 | -1 | -1 | -1 | -1 | -1 | -1 | -1 | -1 | -1 | -1 | ... | ... | ... | -1 | -1 |
| 19 | 148 | 170 | -1 | -1 | -1 | -1 | -1 | -1 | -1 | -1 | 170 | -1 | -1 | -1 | -1 | -1 | -1 | -1 | -1 | ... | ... | ... | -1 | -1 |
| 20 | -1 | 23 | -1 | -1 | 182 | -1 | -1 | -1 | -1 | -1 | -1 | 212 | -1 | -1 | -1 | -1 | -1 | -1 | -1 | ... | ... | ... | -1 | -1 |
| 21 | 19 | -1 | -1 | -1 | -1 | -1 | -1 | 122 | -1 | -1 | -1 | -1 | 66 | -1 | -1 | -1 | -1 | -1 | -1 | ... | ... | ... | -1 | -1 |
| 22 | -1 | 0 | 31 | -1 | -1 | -1 | -1 | -1 | -1 | -1 | -1 | -1 | -1 | -1 | -1 | -1 | -1 | -1 | -1 | ... | ... | ... | -1 | -1 |
| 23 | 49 | -1 | -1 | 134 | -1 | 16 | -1 | -1 | -1 | -1 | -1 | -1 | -1 | -1 | -1 | -1 | -1 | -1 | -1 | ... | ... | ... | -1 | -1 |
| 24 | -1 | 64 | 72 | -1 | -1 | -1 | -1 | -1 | 180 | -1 | -1 | -1 | -1 | -1 | -1 | -1 | -1 | -1 | -1 | ... | ... | ... | -1 | -1 |
| 25 | 221 | -1 | -1 | -1 | -1 | 33 | -1 | -1 | -1 | -1 | -1 | -1 | -1 | -1 | -1 | -1 | -1 | -1 | -1 | ... | ... | ... | -1 | -1 |
| 26 | -1 | -1 | 27 | -1 | -1 | -1 | 87 | -1 | -1 | -1 | -1 | 157 | 187 | -1 | -1 | -1 | -1 | -1 | -1 | ... | ... | ... | -1 | -1 |
| 27 | 201 | -1 | -1 | -1 | -1 | -1 | 72 | -1 | -1 | -1 | -1 | -1 | -1 | -1 | -1 | -1 | -1 | -1 | -1 | ... | ... | ... | -1 | -1 |
| 28 | -1 | 219 | 202 | -1 | -1 | 68 | -1 | -1 | -1 | -1 | -1 | -1 | -1 | -1 | -1 | -1 | -1 | -1 | -1 | ... | ... | ... | -1 | -1 |
| 29 | 153 | -1 | -1 | -1 | 196 | -1 | -1 | -1 | -1 | -1 | -1 | -1 | -1 | -1 | -1 | -1 | -1 | -1 | -1 | ... | ... | ... | -1 | -1 |
| 30 | -1 | -1 | 68 | -1 | 217 | -1 | 131 | -1 | 93 | -1 | -1 | -1 | -1 | -1 | -1 | -1 | -1 | -1 | -1 | ... | ... | ... | -1 | -1 |
| 31 | -1 | 193 | -1 | -1 | -1 | -1 | -1 | -1 | -1 | -1 | -1 | 141 | -1 | -1 | -1 | -1 | -1 | -1 | -1 | ... | ... | ... | -1 | -1 |
| 32 | 82 | -1 | -1 | -1 | -1 | 138 | -1 | -1 | -1 | -1 | -1 | -1 | 204 | -1 | -1 | -1 | -1 | -1 | -1 | ... | ... | ... | -1 | -1 |
| 33 | -1 | -1 | 142 | -1 | -1 | -1 | -1 | 53 | -1 | -1 | 144 | -1 | -1 | -1 | -1 | -1 | -1 | -1 | -1 | ... | ... | ... | -1 | -1 |
| 34 | 79 | -1 | -1 | -1 | -1 | -1 | -1 | -1 | -1 | -1 | -1 | 93 | 54 | -1 | -1 | -1 | -1 | -1 | -1 | ... | ... | ... | -1 | -1 |
| 35 | -1 | 188 | -1 | -1 | -1 | 135 | -1 | -1 | -1 | -1 | 205 | -1 | -1 | -1 | -1 | -1 | -1 | -1 | -1 | ... | ... | ... | -1 | -1 |
| 36 | 177 | -1 | 124 | -1 | -1 | -1 | -1 | 66 | -1 | -1 | -1 | -1 | -1 | -1 | -1 | -1 | -1 | -1 | -1 | ... | ... | ... | -1 | -1 |
| 37 | -1 | -1 | -1 | -1 | -1 | -1 | -1 | -1 | 57 | -1 | -1 | 62 | -1 | -1 | -1 | -1 | -1 | -1 | -1 | ... | ... | ... | -1 | -1 |
| 38 | -1 | 45 | -1 | -1 | -1 | 97 | -1 | -1 | -1 | -1 | 150 | -1 | -1 | -1 | -1 | -1 | -1 | -1 | -1 | ... | ... | ... | -1 | -1 |
| 39 | 105 | -1 | -1 | -1 | -1 | -1 | 10 | -1 | -1 | -1 | -1 | 223 | -1 | -1 | -1 | -1 | -1 | -1 | -1 | ... | ... | ... | -1 | -1 |
| 40 | -1 | -1 | 200 | -1 | -1 | -1 | -1 | -1 | -1 | 129 | -1 | -1 | 216 | -1 | -1 | -1 | -1 | -1 | -1 | ... | ... | ... | 0 | -1 |
| 41 | -1 | 208 | -1 | -1 | -1 | 32 | -1 | -1 | -1 | -1 | -1 | 53 | -1 | -1 | -1 | -1 | -1 | -1 | -1 | ... | ... | ... | -1 | 0 |

| | 0 | 1 | 2 | 3 | 4 | 5 | 6 | 7 | 8 | 9 | 10 | 11 | 12 | 13 | 14 | 15 | 16 | 17 | 18 | ... | ... | ... | 50 | 51 |
|---|---|---|---|---|---|---|---|---|---|---|---|---|---|---|---|---|---|---|---|---|---|---|---|---|
| 0 | 153 | 19 | 47 | 79 | −1 | −1 | 19 | −1 | −1 | 90 | 0 | 0 | −1 | −1 | −1 | −1 | −1 | −1 | −1 | ... | ... | ... | −1 | −1 |
| 1 | 58 | −1 | −1 | 201 | 157 | 100 | 42 | 46 | 15 | 19 | −1 | 0 | 0 | −1 | −1 | −1 | −1 | −1 | −1 | ... | ... | ... | −1 | −1 |
| 2 | 48 | 160 | −1 | 172 | 169 | −1 | −1 | −1 | 169 | −1 | 1 | −1 | 0 | 0 | −1 | −1 | −1 | −1 | −1 | ... | ... | ... | −1 | −1 |
| 3 | −1 | 38 | 2 | −1 | 196 | 50 | 192 | 81 | 98 | 85 | 0 | −1 | −1 | 0 | −1 | −1 | −1 | −1 | −1 | ... | ... | ... | −1 | −1 |
| 4 | 169 | 94 | −1 | −1 | −1 | −1 | −1 | −1 | −1 | −1 | −1 | 8 | −1 | −1 | 0 | −1 | −1 | −1 | −1 | ... | ... | ... | −1 | −1 |
| 5 | 20 | 76 | −1 | −1 | −1 | 102 | −1 | 136 | −1 | −1 | −1 | 186 | −1 | −1 | −1 | 0 | −1 | −1 | −1 | ... | ... | ... | −1 | −1 |
| 6 | 121 | −1 | −1 | −1 | −1 | 160 | −1 | 180 | −1 | 161 | −1 | 172 | −1 | −1 | −1 | −1 | 0 | −1 | −1 | ... | ... | ... | −1 | −1 |
| 7 | −1 | 104 | −1 | −1 | 109 | −1 | 109 | −1 | −1 | −1 | 106 | −1 | 81 | −1 | −1 | −1 | −1 | 0 | −1 | ... | ... | ... | −1 | −1 |
| 8 | 107 | 133 | −1 | −1 | −1 | −1 | −1 | −1 | −1 | −1 | −1 | −1 | 197 | −1 | −1 | −1 | −1 | −1 | 0 | ... | ... | ... | −1 | −1 |
| 9 | −1 | 49 | −1 | −1 | −1 | −1 | −1 | −1 | 4 | −1 | 164 | 128 | −1 | −1 | −1 | −1 | −1 | −1 | −1 | ... | ... | ... | −1 | −1 |
| 10 | 165 | 172 | −1 | −1 | −1 | −1 | 11 | 148 | −1 | −1 | −1 | −1 | −1 | −1 | −1 | −1 | −1 | −1 | −1 | ... | ... | ... | −1 | −1 |
| 11 | 85 | −1 | −1 | −1 | −1 | −1 | 111 | −1 | 161 | −1 | −1 | −1 | 113 | −1 | −1 | −1 | −1 | −1 | −1 | ... | ... | ... | −1 | −1 |
| 12 | −1 | 84 | −1 | 128 | −1 | −1 | −1 | −1 | −1 | −1 | −1 | 198 | −1 | −1 | −1 | −1 | −1 | −1 | −1 | ... | ... | ... | −1 | −1 |
| 13 | 54 | 129 | −1 | −1 | −1 | −1 | −1 | 10 | −1 | −1 | −1 | −1 | 59 | −1 | −1 | −1 | −1 | −1 | −1 | ... | ... | ... | −1 | −1 |
| 14 | −1 | 165 | −1 | −1 | −1 | −1 | 77 | −1 | −1 | −1 | −1 | 125 | −1 | 131 | −1 | −1 | −1 | −1 | −1 | ... | ... | ... | −1 | −1 |
| 15 | 74 | −1 | −1 | −1 | −1 | −1 | −1 | −1 | −1 | 72 | 48 | −1 | −1 | −1 | −1 | −1 | −1 | −1 | −1 | ... | ... | ... | −1 | −1 |
| 16 | −1 | 160 | −1 | −1 | −1 | −1 | −1 | −1 | 134 | −1 | 194 | 93 | −1 | −1 | −1 | −1 | −1 | −1 | −1 | ... | ... | ... | −1 | −1 |
| 17 | −1 | 194 | −1 | −1 | −1 | 78 | −1 | −1 | −1 | −1 | 158 | 91 | −1 | −1 | −1 | −1 | −1 | −1 | −1 | ... | ... | ... | −1 | −1 |
| 18 | 193 | −1 | −1 | −1 | −1 | −1 | 19 | 14 | −1 | −1 | −1 | −1 | −1 | −1 | −1 | −1 | −1 | −1 | −1 | ... | ... | ... | −1 | −1 |
| 19 | 71 | 134 | −1 | −1 | −1 | −1 | −1 | −1 | −1 | 39 | −1 | −1 | −1 | −1 | −1 | −1 | −1 | −1 | −1 | ... | ... | ... | −1 | −1 |
| 20 | −1 | 5 | −1 | −1 | 49 | −1 | −1 | −1 | −1 | −1 | −1 | 159 | −1 | −1 | −1 | −1 | −1 | −1 | −1 | ... | ... | ... | −1 | −1 |
| 21 | 61 | −1 | −1 | −1 | −1 | −1 | −1 | 48 | −1 | −1 | −1 | −1 | 82 | −1 | −1 | −1 | −1 | −1 | −1 | ... | ... | ... | −1 | −1 |
| 22 | −1 | 162 | 39 | −1 | −1 | −1 | −1 | −1 | −1 | −1 | −1 | −1 | −1 | −1 | −1 | −1 | −1 | −1 | −1 | ... | ... | ... | −1 | −1 |
| 23 | 37 | −1 | −1 | 201 | −1 | 174 | −1 | −1 | −1 | −1 | −1 | −1 | −1 | −1 | −1 | −1 | −1 | −1 | −1 | ... | ... | ... | −1 | −1 |
| 24 | −1 | 191 | 176 | −1 | −1 | −1 | −1 | −1 | 178 | −1 | −1 | −1 | −1 | −1 | −1 | −1 | −1 | −1 | −1 | ... | ... | ... | −1 | −1 |
| 25 | 191 | −1 | −1 | −1 | −1 | 9 | −1 | −1 | −1 | −1 | −1 | −1 | −1 | −1 | −1 | −1 | −1 | −1 | −1 | ... | ... | ... | −1 | −1 |
| 26 | −1 | −1 | 94 | −1 | −1 | −1 | −1 | 83 | −1 | −1 | −1 | −1 | 142 | 198 | −1 | −1 | −1 | −1 | −1 | ... | ... | ... | −1 | −1 |
| 27 | 188 | −1 | −1 | −1 | −1 | 176 | −1 | −1 | −1 | −1 | −1 | −1 | −1 | −1 | −1 | −1 | −1 | −1 | −1 | ... | ... | ... | −1 | −1 |
| 28 | −1 | 44 | 68 | −1 | −1 | 33 | −1 | −1 | −1 | −1 | −1 | −1 | −1 | −1 | −1 | −1 | −1 | −1 | −1 | ... | ... | ... | −1 | −1 |
| 29 | 10 | −1 | −1 | −1 | 91 | −1 | −1 | −1 | −1 | −1 | −1 | −1 | −1 | −1 | −1 | −1 | −1 | −1 | −1 | ... | ... | ... | −1 | −1 |
| 30 | −1 | −1 | 62 | −1 | −1 | 17 | −1 | 135 | −1 | 39 | −1 | −1 | −1 | −1 | −1 | −1 | −1 | −1 | −1 | ... | ... | ... | −1 | −1 |
| 31 | −1 | 187 | −1 | −1 | −1 | −1 | −1 | −1 | −1 | −1 | −1 | 58 | −1 | −1 | −1 | −1 | −1 | −1 | −1 | ... | ... | ... | −1 | −1 |
| 32 | 166 | −1 | −1 | −1 | −1 | 166 | −1 | −1 | −1 | −1 | −1 | 191 | −1 | −1 | −1 | −1 | −1 | −1 | −1 | ... | ... | ... | −1 | −1 |
| 33 | −1 | −1 | 126 | −1 | −1 | −1 | 73 | −1 | −1 | 153 | −1 | −1 | −1 | −1 | −1 | −1 | −1 | −1 | −1 | ... | ... | ... | −1 | −1 |
| 34 | 140 | −1 | −1 | −1 | −1 | −1 | −1 | −1 | −1 | −1 | 97 | 180 | −1 | −1 | −1 | −1 | −1 | −1 | −1 | ... | ... | ... | −1 | −1 |
| 35 | −1 | 198 | −1 | −1 | −1 | 69 | −1 | −1 | −1 | −1 | 202 | −1 | −1 | −1 | −1 | −1 | −1 | −1 | −1 | ... | ... | ... | −1 | −1 |
| 36 | 45 | −1 | 30 | −1 | −1 | −1 | −1 | 134 | −1 | −1 | −1 | −1 | −1 | −1 | −1 | −1 | −1 | −1 | −1 | ... | ... | ... | −1 | −1 |
| 37 | −1 | −1 | −1 | −1 | −1 | −1 | −1 | −1 | 162 | −1 | −1 | 170 | −1 | −1 | −1 | −1 | −1 | −1 | −1 | ... | ... | ... | −1 | −1 |
| 38 | −1 | 28 | −1 | −1 | −1 | 109 | −1 | −1 | −1 | −1 | 198 | −1 | −1 | −1 | −1 | −1 | −1 | −1 | −1 | ... | ... | ... | −1 | −1 |
| 39 | 51 | −1 | −1 | −1 | −1 | −1 | 44 | −1 | −1 | −1 | −1 | 82 | −1 | −1 | −1 | −1 | −1 | −1 | −1 | ... | ... | ... | −1 | −1 |
| 40 | −1 | −1 | 157 | −1 | −1 | −1 | −1 | −1 | −1 | 47 | −1 | −1 | 96 | −1 | −1 | −1 | −1 | −1 | −1 | ... | ... | ... | 0 | −1 |
| 41 | −1 | 142 | −1 | −1 | 58 | −1 | −1 | −1 | −1 | −1 | −1 | 73 | −1 | −1 | −1 | −1 | −1 | −1 | −1 | ... | ... | ... | −1 | 0 |

FIG. 3b-8

METHOD AND APPARATUS FOR LOW DENSITY PARITY CHECK CHANNEL CODING IN WIRELESS COMMUNICATION SYSTEM

CROSS-REFERENCE TO RELATED APPLICATIONS

This application is a continuation of U.S. patent application Ser. No. 16/566,331, filed on Sep. 10, 2019, which is a continuation of International Application No. PCT/CN2017/092878, filed on Jul. 13, 2017. The International Application claims priority to Chinese Patent Application No. 201710454030.3, filed on Jun. 15, 2017 and Chinese Patent Application No. 201710503056.2, filed on Jun. 27, 2017. All of the aforementioned applications are hereby incorporated by reference in their entireties.

TECHNICAL FIELD

Embodiments of the present application relate to the communication field, and in particular, to an information processing method and a communication apparatus.

BACKGROUND

Low density parity check (LDPC) code is a type of linear block code including a sparse check matrix, and is characterized by a flexible structure and low decoding complexity. Because decoding the LDPC code uses a partially parallel iterative decoding algorithm, the LDPC code has a higher throughput than a conventional turbo code. The LDPC code may be used as an error-correcting code in a communication system, so as to increase channel transmission reliability and power utilization. LDPC code may further be widely applied to space communication, fiber optic communication, a personal communication system, an asymmetric digital subscriber line (ADSL), a magnetic recording device, and the like. The LDPC code scheme has been currently considered as one of channel coding schemes in the fifth generation mobile communication systems.

In practical applications, LDPC matrices characterized by different special structures may be used. An LDPC matrix H, having a special structure, may be obtained by expanding an LDPC base matrix having a quasi cyclic (QC) structure.

Generally, lengths of to-be-encoded information bit sequences vary from tens to hundreds of bits, and code rates required by a communication system are also flexibly variable. How to support encoding on information bit sequences of various lengths, to satisfy code rate requirements of a system becomes a problem that needs to be resolved.

SUMMARY

Embodiments of the present application provide an information processing method, a communication apparatus, and a communication system, to support encoding and decoding of information bit sequences of various lengths and meet flexible code length and code rate requirements of the communication system.

According to a first aspect, an encoding method and an encoder are provided. The encoder encodes an input sequence by using a low-density parity-check (LDPC) matrix.

According to a second aspect, a decoding method and a decoder are provided. The decoder decodes an input sequence by using a low-density parity-check (LDPC) matrix.

In a first implementation of the first aspect or the second aspect, the LDPC matrix is obtained based on a base graph, and the base graph includes submatrix A, submatrix B, submatrix C, submatrix D, and submatrix E, where the submatrix A is a matrix including $m_A$ rows and $n_A$ columns, $m_A$ and $n_A$ are positive integers, $4 \le m_A \le 7$, and $n_A = 10$;

the submatrix B is a matrix including $m_A$ rows and $m_A$ columns, and the submatrix B includes a column whose weight is 3 and a submatrix B' having a bi-diagonal structure;

the submatrix D includes $m_D$ rows in a matrix F, the matrix F is a matrix including $m_F$ rows and $(m_A+n_A)$ columns, $m_D$ and $m_F$ are positive integers, $0 \le m_D \le m_F$, and $35 \le m_F \le 38$;

the submatrix C is an all zero matrix including $m_A$ rows and $m_D$ columns; and the submatrix E is an identity matrix including $m_D$ rows and $m_D$ columns.

Based on the foregoing implementation, in a possible implementation, any two adjacent rows in the last 10 rows in the base graph are mutually orthogonal.

Based on the foregoing implementations, in a possible implementation, the last 10 rows in the base graph include at least five groups, each of the at least five groups includes at least two rows, and the at least two rows are mutually orthogonal.

Based on any of the foregoing implementations, in a possible implementation, in the matrix F, weights of nine rows are 3, and a weight of one row is 2.

In a design, in the matrix F, a weight of one column is 16, a weight of one column is 18, a weight of one column is 11, weights of two columns are 10, a weight of one column is 9, a weight of one column is 8, a weight of one column is 7, a weight of one column is 6, weights of two columns are 4, a weight of one column is 3, and weights of two columns are 2.

Based on the first implementation, in another possible implementation, a row count of rows having an orthogonal structure in the matrix F is greater than or equal to 10, and in the matrix F, a weight of one column is 16, a weight of one column is 18, a weight of one column is 11, weights of two columns are 10, a weight of one column is 9, a weight of one column is 8, a weight of one column is 7, a weight of one column is 6, weights of two columns are 4, a weight of one column is 3, and weights of two columns are 2.

In another design, in the matrix F, weights of nine rows are 3, and a weight of one row is 2.

In another design, the matrix F includes at least 10 rows, and any two adjacent rows in the at least 10 rows are mutually orthogonal.

In another design, the matrix F includes at least five groups, each of the at least five groups includes at least two rows, and the at least two rows are mutually orthogonal. Optionally, the at least two rows may be consecutive rows. For example, the at least 10 rows may be the last 10 rows in a base graph 30a.

In any of the foregoing implementations, if $m_A > 4$, weights of columns other than $m_A$ columns in the matrix F is 0.

For example, 10 rows having the orthogonal structure in the matrix F may include, for example, rows or columns of a matrix block including row 25 to row 34 and column 0 to column 13 in the base graph 30a; or 10 rows having the orthogonal structure in the matrix F may include, for example, rows or columns of a matrix block including row 25 to row 34 and column 0 to column 16 in the base graph

30a. In the matrix F, rows may be switched with each other, and columns may also be switched with each other.

Based on the foregoing implementations, a base matrix of the base graph 30a may be, for example, any one of base matrices 30b-1, 30b-2, 30b-3, 30b-4, 30b-5, 30b-6, 30b-7, and 30b-8, or a matrix obtained by performing row/column permutation on any one of base matrices 30b-1, 30b-2, 30b-3, 30b-4, 30b-5, 30b-6, 30b-7, and 30b-8.

Based on the foregoing implementations, a shift matrix of the matrix F may be a matrix including row 7 to row 41 and column 0 to column 16 in any matrix of 30b-1 to 30b-8, or a matrix obtained by performing row/column permutation on the matrix including row 7 to row 41 and column 0 to column 16 in any matrix of 30b-1 to 30b-8; or a shift matrix of the matrix F may include a matrix including row 4 to row 41 and column 0 to column 14 in any matrix of 30b-1 to 30b-8, or a matrix obtained by performing row/column permutation on the matrix including row 4 to row 41 and column 0 to column 14 in any matrix of 30b-1 to 30b-8.

To support different code block lengths, the LDPC code utilizes different lifting factors Z. Based on the foregoing implementations, in a possible implementation, based on the different lifting factors Z, base matrices corresponding to the different lifting factors Z are used. For example, $Z=a\times2^j$, where $a \in \{2, 3, 5, 7, 9, 11, 13, 15\}$.

If the lifting factor is one satisfying $Z=2\times2^j$, where j=0, 1, 2, 3, 4, 5, 6, 7, the shift matrix of the matrix F may be the matrix including row 7 to row 41 and column 0 to column 16 in 30b-1, or the matrix obtained by performing the row/column permutation on the matrix including row 7 to row 41 and column 0 to column 16 in 30b-1; or the shift matrix of the matrix F may be the matrix including row 4 to row 41 and column 0 to column 14 in 30b-1, or the matrix obtained by performing row/column permutation on the matrix including row 4 to row 41 and column 0 to column 14 in 30b-1. Correspondingly, the base matrix of the base graph 30a may be the matrix shown in 30b-1, or the matrix obtained by performing row/column permutation on the matrix shown in 30b-1.

If the lifting factor is one satisfying $Z=3\times2^j$, where j=0, 1, 2, 3, 4, 5, 6, 7, the shift matrix of the matrix F may be the matrix including row 7 to row 41 and column 0 to column 16 in 30b-2, or the matrix obtained by performing row/column permutation on the matrix including row 7 to row 41 and column 0 to column 16 in 30b-2; or the shift matrix of the matrix F may be the matrix including row 4 to row 41 and column 0 to column 14 in 30b-2, or the matrix obtained by performing row/column permutation on the matrix including row 4 to row 41 and column 0 to column 14 in 30b-2. Correspondingly, the base matrix of the base graph 30a may be the matrix shown in 30b-2, or the matrix obtained by performing row/column permutation on the matrix shown in 30b-2.

If the lifting factor is one satisfying $Z=5\times2^j$, where j=0, 1, 2, 3, 4, 5, 6, the shift matrix of the matrix F may be the matrix including row 7 to row 41 and column 0 to column 16 in 30b-3, or the matrix obtained by performing row/column permutation on the matrix including row 7 to row 41 and column 0 to column 16 in 30b-3; or the shift matrix of the matrix F may be the matrix including row 4 to row 41 and column 0 to column 14 in 30b-3, or the matrix obtained by performing row/column permutation on the matrix including row 4 to row 41 and column 0 to column 14 in 30b-3. Correspondingly, the base matrix of the base graph 30a may be the matrix shown in 30b-3, or the matrix obtained by performing row/column permutation on the matrix shown in 30b-3.

If the lifting factor satisfying one in $Z=7\times2^j$, where j=0, 1, 2, 3, 4, 5, the shift matrix of the matrix F may be the matrix including row 7 to row 41 and column 0 to column 16 in 30b-4, or the matrix obtained by performing row/column permutation on the matrix including row 7 to row 41 and column 0 to column 16 in 30b-4; or the shift matrix of the matrix F may be the matrix including row 4 to row 41 and column 0 to column 14 in 30b-4, or the matrix obtained by performing row/column permutation on the matrix including row 4 to row 41 and column 0 to column 14 in 30b-4. Correspondingly, the base matrix of the base graph 30a may be the matrix shown in 30b-4, or the matrix obtained by performing row/column permutation on the matrix shown in 30b-4.

If the lifting factor is one satisfying $Z=9\times2^j$, where j=0, 1, 2, 3, 4, 5, the shift matrix of the matrix F may be the matrix including row 7 to row 41 and column 0 to column 16 in 30b-5, or the matrix obtained by performing row/column permutation on the matrix including row 7 to row 41 and column 0 to column 16 in 30b-5; or the shift matrix of the matrix F may be the matrix including row 4 to row 41 and column 0 to column 14 in 30b-5, or the matrix obtained by performing row/column permutation on the matrix including row 4 to row 41 and column 0 to column 14 in 30b-5. Correspondingly, the base matrix of the base graph 30a may be the matrix shown in 30b-5, or the matrix obtained by performing row/column permutation on the matrix shown in 30b-5.

If the lifting factor is one satisfying $Z=11\times2^j$, where j=0, 1, 2, 3, 4, 5, the shift matrix of the matrix F may be the matrix including row 7 to row 41 and column 0 to column 16 in 30b-6, or the matrix obtained by performing row/column permutation on the matrix including row 7 to row 41 and column 0 to column 16 in 30b-6; or the shift matrix of the matrix F may be the matrix including row 4 to row 41 and column 0 to column 14 in 30b-6, or the matrix obtained by performing row/column permutation on the matrix including row 4 to row 41 and column 0 to column 14 in 30b-6. Correspondingly, the base matrix of the base graph 30a may be the matrix shown in 30b-6, or the matrix obtained by performing row/column permutation on the matrix shown in 30b-6.

If the lifting factor is one satisfying $Z=13\times2^j$, where j=0, 1, 2, 3, 4, the shift matrix of the matrix F may be the matrix including row 7 to row 41 and column 0 to column 16 in 30b-7, or the matrix obtained by performing row/column permutation on the matrix including row 7 to row 41 and column 0 to column 16 in 30b-7; or the shift matrix of the matrix F may be the matrix including row 4 to row 41 and column 0 to column 14 in 30b-7, or the matrix obtained by performing row/column permutation on the matrix including row 4 to row 41 and column 0 to column 14 in 30b-7. Correspondingly, the base matrix of the base graph 30a may be the matrix shown in 30b-7, or the matrix obtained by performing row/column permutation on the matrix shown in 30b-7.

If the lifting factor is one satisfying $Z=15\times2^j$, where j=0, 1, 2, 3, 4, the shift matrix of the matrix F may be the matrix including row 7 to row 41 and column 0 to column 16 in 30b-8, or the matrix obtained by performing row/column permutation on the matrix including row 7 to row 41 and column 0 to column 16 in 30b-8; or the shift matrix of the matrix F may be the matrix including row 4 to row 41 and column 0 to column 14 in 30b-8, or the matrix obtained by performing row/column permutation on the matrix including row 4 to row 41 and column 0 to column 14 in 30b-8. Correspondingly, the base matrix of the base graph 30a may be the matrix shown in 30*b*-8, or the matrix obtained by performing row/column permutation on the matrix shown in 30*b*-8.

Further, optionally, based on the foregoing implementations, for the lifting factors Z, an element $P_{i,j}=f(V_{i,j},Z)$ in row i and column j in the base matrix of Z may further be obtained according to the base matrices of the foregoing sets, where $V_{i,j}$ is an element in row i and column j in the base matrix of the set to which the lifting factor Z belongs.

For example, $$P_{i,j} = \begin{cases} -1 & V_{i,j} = -1 \\ \mod(V_{i,j}, Z) & V_{i,j} \geq 0 \end{cases}.$$

In another possible implementation, the base graph or the base matrix may further include at least one column corresponding to built-in puncture bits.

In the foregoing implementations, the base graph and the base matrix of the LDPC matrix may satisfy performance requirements of code blocks whose block length are 20 to 2560 bits.

Based on the foregoing aspects or any possible implementation of the aspects, in another possible implementation, the method further includes: determining the lifting factor Z. For example, a value of the lifting factor Z is determined according to a length K of the input sequence. For example, if the length of the input sequence is K, a minimum value satisfying $10 \times Z \geq K$ may be determined from a plurality of lifting factors defined in a system.

Optionally, the LDPC matrix may be obtained based on the base matrix corresponding to Z, or based on a shift matrix corresponding to Z.

For a communication device at a transmit end, the encoding an input sequence by using an LDPC matrix includes:

encoding the input sequence by using an LDPC matrix corresponding to the lifting factor Z; or encoding the input sequence by using a matrix, wherein the matrix is obtained by performing row/column permutation on an LDPC matrix corresponding to the lifting factor Z. In this application, the row/column permutation refers to row permutation, column permutation, or row permutation and column permutation.

For a communication device at a receive end, the decoding an input sequence by using an LDPC matrix includes:

decoding the input sequence by using an LDPC matrix corresponding to the lifting factor Z; or performing row/column permutation on an LDPC matrix corresponding to the lifting factor Z, and decoding the input sequence by using a matrix obtained by performing row/column permutation on an LDPC matrix corresponding to the lifting factor Z. In this application, the row/column permutation refers to row permutation, column permutation, or row permutation and column permutation.

In a possible implementation, the LDPC matrix may be stored in the memory, and the input sequence is encoded by using the LDPC matrix; or an LDPC matrix that may be used for encoding is obtained by performing permutation (row/column permutation) or lifting based on the LDPC matrix.

In another possible implementation, parameters may be stored in the memory, and an LDPC matrix used for encoding or decoding may be obtained according to the parameters, so that the input sequence may be encoded or decoded based on the LDPC matrix. The parameters include at least one of the following: a base graph, a base matrix, a permutated matrix obtained by performing row/column permutation on the base graph or the base matrix, a lifted matrix based on the base graph or the base matrix, a shift value of a non-zero-element in the base matrix, or any parameter related to the obtaining the LDPC matrix.

In still another possible implementation, the base matrix of the LDPC matrix may be stored in a memory.

In still another possible implementation, the base graph of the LDPC matrix is stored in a memory, and shift values of non-zero-elements in the base matrix of the LDPC matrix may be stored in the memory.

Based on the foregoing possible implementations, in a possible design, at least one of a base graph and a base matrix that are used for LDPC encoding or decoding is obtained by performing row permutation, column permutation, or row permutation and column permutation on at least one of the base graph and the base matrices of the LDPC matrix.

According to a third aspect, a communication apparatus is provided. The communication apparatus may include corresponding modules configured to perform the foregoing method designs. The modules may be software and/or hardware.

In a possible design, the communication apparatus provided in the third aspect includes a processor and a transceiver component, and the processor and the transceiver component may be configured to implement functions in the foregoing encoding or decoding method. In this design, if the communication apparatus is a terminal, a base station, or other network devices, the transceiver component of the communication apparatus may be a transceiver. If the communication apparatus is a baseband chip or a baseband processing board, the transceiver component of the communication apparatus may be an input/output circuit of the baseband chip or the baseband processing board, and is configured to receive/send an input/output signal. The communication apparatus may optionally include a memory, configured to store data and/or an instruction.

In an implementation, the processor may include the encoder according to the foregoing first aspect and a determining unit. The determining unit is configured to determine a lifting factor Z required for encoding the input sequence. The encoder is configured to encode the input sequence by using the LDPC matrix corresponding to the lifting factor Z.

In another implementation, the processor may include the decoder according to the foregoing second aspect and an obtaining unit. The obtaining unit is configured to obtain soft values of the LDPC code and a lifting factor Z. The decoder is configured to decode the soft values of the LDPC code based on a base matrix $H_B$ corresponding to the lifting factor Z, to obtain an information bit sequence.

According to a fourth aspect, a communication apparatus is provided. The communication apparatus includes one or more processors.

In a possible design, the one or more processors may implement a function of the encoder in the first aspect. In another possible design, the encoder in the first aspect may be a part of the processor. In addition to the function of the encoder in the first aspect, the processor may further implement other functions.

In a possible design, the one or more processors may implement a function of the decoder in the second aspect. In another possible design, the decoder in the second aspect may be a part of the processor.

Optionally, the communication apparatus may further include a transceiver and an antenna.

Optionally, the communication apparatus may further include a component configured to produce a transport block cyclic redundancy check (CRC), a component used for code block segmentation and CRC attachment, an interleaver used for interleaving, a modulator used for modulation processing, or the like.

Optionally, the communication apparatus may further include a demodulator used for a demodulation operation, a deinterleaver used for deinterleaving, a component used for de-rate matching, or the like. Functions of the components may be implemented by using the one or more processors.

In a possible design, functions of the components may be implemented by using the one or more processors.

BRIEF DESCRIPTION OF DRAWINGS

FIG. 3b-1 to FIG. 3b-8 show schematic diagrams of base matrices of the base graph shown in FIG. 3a;

FIG. 4 is a performance graph according to an embodiment of the present application;

FIG. 5 is a schematic structural diagram of an information processing apparatus according to an embodiment of the present application; and FIG. 6 is a schematic diagram of a communication system according to an embodiment of the present application.

DESCRIPTION OF EMBODIMENTS

To facilitate understanding, some terms in this application are described below.

In this application, terms "network" and "system" are usually interchanged, and terms "apparatus" and "device" are also usually interchanged. However, a person skilled in the art may understand their meanings. A "communication apparatus" may be a chip (such as a baseband chip, or a digital signal processing chip, or a general-purpose chip), a terminal, a base station, or other network devices. The terminal is a device having a communication function. The terminal may include a handheld device, an in-vehicle device, a wearable device, and a computing device that have a wireless communication function, or another processing device connected to a wireless modem, or the like. The terminal may have different names in different networks, for example, user equipment, a mobile station, a user unit, a station, a cellular phone, a personal digital assistant, a wireless modem, a wireless communication device, a handheld device, a laptop computer, a cordless telephone set, and a wireless local loop station. For ease of description, in this application, the devices are referred to as the terminal for short. The base station (BS), also referred to as a base station device, is a device deployed in a radio access network to provide a wireless communication function. In different radio access systems, names of the base station may be different. For example, a base station in a Universal Mobile Telecommunication System (UMTS) network is referred to as a node B (NodeB), a base station in a Long-Term Evolution (LTE) network is referred to as an evolved node B (eNB, or eNodeB), a base station in a new radio (NR) network is referred to as a transmission reception point (TRP) or a next-generation node B (gNB), or a base station in various other networks may also be referred to as other names. The present application is not limited thereto.

The following describes technical solutions in embodiments of the present application with reference to the accompanying drawings.

Figure 1:
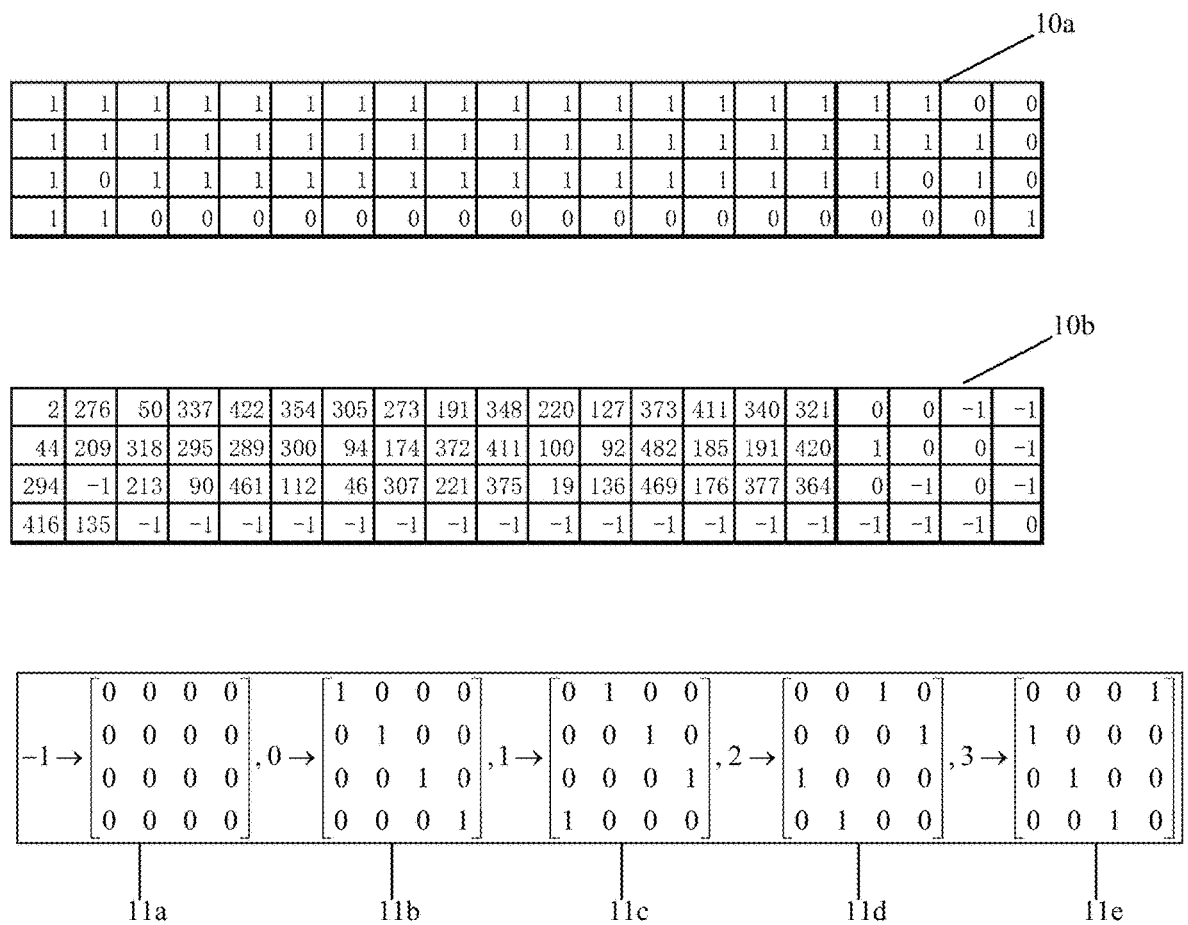
FIG. 1 is a schematic diagram of a base graph and a base matrix of an LDPC code, and circular permutation matrices of the base matrix in an LDPC code scheme.

Usually, an LDPC code can be defined by using a parity check matrix H. The parity check matrix H for the LDPC code may be obtained by using a base graph and shift values. Usually, the base graph may include m×n matrix elements (entry). The base graph may be represented by using a matrix including m rows and n columns. The value of each matrix element is either 0 or 1. An element whose value is 0 is also referred to as a zero-element sometimes, which may be replaced with an all zero matrix of size Z×Z. An element whose value is 1 is also referred to as a non-zero-element sometimes, which may be replaced with a circular permutation matrix (circulant permutation matrix) of size Z×Z. That is, each matrix element represents an all zero matrix or a circular permutation matrix. FIG. 1 shows an example 10a of a base graph of an LDPC code in which m=4 and n=20 and that has a QC structure. It should be noted that in this specification, row indexes and column indexes of a base graph and a matrix are all numbered starting from 0. This is only for ease of understanding. It may be understood that the row indexes and the column indexes may alternatively be numbered starting from 1, and corresponding row indexes and column indexes are increased by 1 based on the row indexes and the column indexes shown in this specification.

If a value of an element in row i and column j in the base graph is 1, it is assigned a shift value $P_{i,j}$. $P_{i,j}$ is an integer greater than or equal to 0, and it indicates that the element of 1 (a non-zero-element) in row i and column j may be replaced with a circular permutation matrix of size Z×Z corresponding to $P_{i,j}$. The circular permutation matrix may be obtained by circularly shifting an identity matrix of size Z×Z to the right for $P_{i,j}$ times. It will be appreciated that in the base graph, each element whose value is 0 is replaced with an all zero matrix of size Z×Z, and each element whose value is 1 is replaced with a circular permutation matrix of size Z×Z corresponding to a shift value of the element, so that the parity check matrix of the LDPC code can be obtained. The base graph may be used to indicate positions of shift values, and each non-zero-element in the base graph corresponds to a shift value. Z is a positive integer, may also be referred to as a lifting factor, and may also be referred to as a lifting size, a lifting factor, or the like sometimes. Z may be determined according to a code block size that is supported by a system and size of information data. It will be appreciated that the parity check matrix H has a size of (m×Z)×(n×Z). For example, if the lifting factor Z=4, each zero element is replaced with a 4×4 all zero matrix 11a. If $P_{2,3}$=2, a non-zero-element in row 2 and column 3 is replaced with a 4×4 circular permutation matrix 11d. The matrix is obtained by circularly shifting a 4×4 identity matrix 11b to the right twice. If $P_{2,4}$=0, a non-zero-element in row 2 and column 4 is replaced with the identity matrix 11b. It should be noted that only examples are described herein, and the examples do not constitute a limitation.

Value of $P_{i,j}$ may depend on the lifting factor Z. Therefore, for an element of 1 (a non-zero-element) in row i and column j of the base graph, $P_{i,j}$ may be different for different lifting factors Z. For ease of implementation, usually, an m×n base matrix is defined in the system. Each element in the base matrix is in a one-to-one correspondence with each element in the base graph. A zero-element in the base graph has a same position in the base matrix, and the element is indicated by −1. A non-zero-element indicated by 1 in row i and column j in the base graph has a same position in the base matrix, and the non-zero-element is indicated by a value $V_{i,j}$, where $V_{i,j}$ may be a shift value defined relative to a preset or a particular lifting factor Z, for example, a shift value relative to a maximum lifting factor $Z_{max}$ in a set to which the lifting factor Z belongs. In this way, $V_{i,j}$ may be a shift value of the non-zero-element in row i and column j when the maximum lifting factor $Z_{max}$ in the set to which Z belongs is used. In this embodiment of this application, the base matrix is also referred to as a shift matrix of a matrix of the base graph sometimes.

$P_{i,j}$ may be obtained based on $V_{i,j}$ and Z. For example, it may be expressed as $P_{i,j}=f(V_{i,j},Z)$, where $f(V_{i,j},Z)$ is a function using $V_{i,j}$ and Z as parameters. For example, $$P_{i,j} = \begin{cases} -1 & V_{i,j} = -1 \\ \mathrm{mod}(V_{i,j}, Z) & V_{i,j} \geq 0 \end{cases}.$$

As shown in FIG. 1, 10b is a base matrix corresponding to the base graph 10a.

Usually, the base graph or the base matrix of the LDPC code may include p columns corresponding to built-in puncture bits, where p may be an integer from 0 to 2. These columns may be used in encoding, but systematic bits corresponding to the built-in puncture bits are not sent. A code rate of the base matrix of the LDPC code satisfies R=(n−m)/(n−p). For a base matrix including 4 rows and 20 columns (4×20), if there are two columns corresponding to built-in puncture bits, a code rate is (20−4)/(20−2)=8/9.

For an LDPC code used in a wireless communication system, a matrix of a base graph of the LDPC code has a size of m×n, and the base graph may include five submatrices: A, B, C, D, and E. A weight of the matrix is determined by a quantity of non-zero-elements, a row weight of a row (a row weight) refers to a quantity of non-zero-elements in the row, and a column weight of a column (a column weight) refers to a quantity of non-zero-elements in the column.

Figure 2:
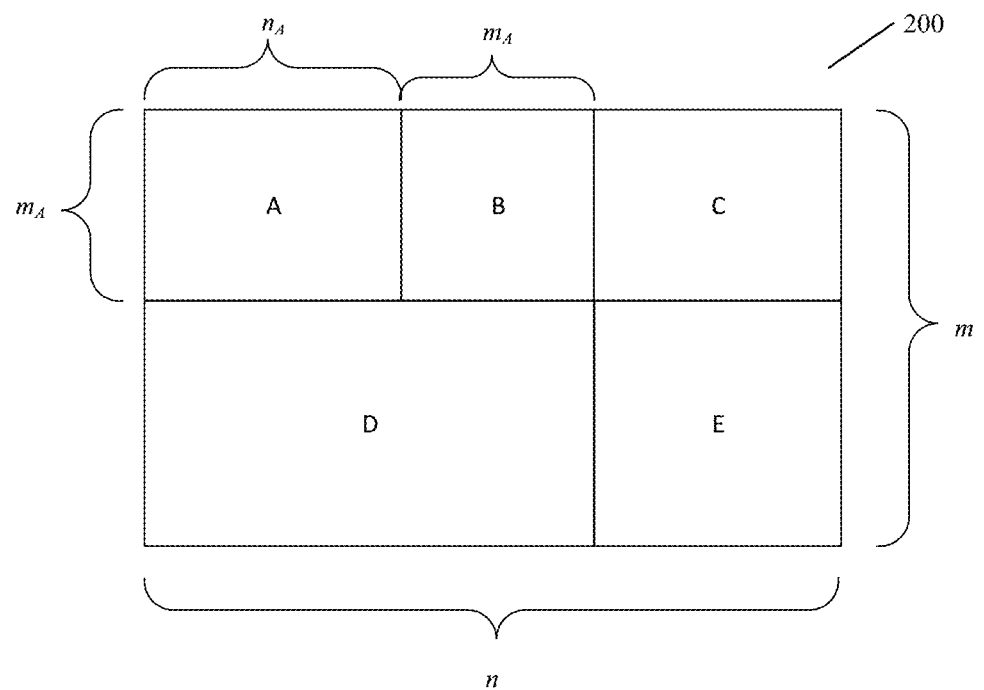
FIG. 2 is a schematic structural diagram of a base graph of an LDPC code.
Figure 2:
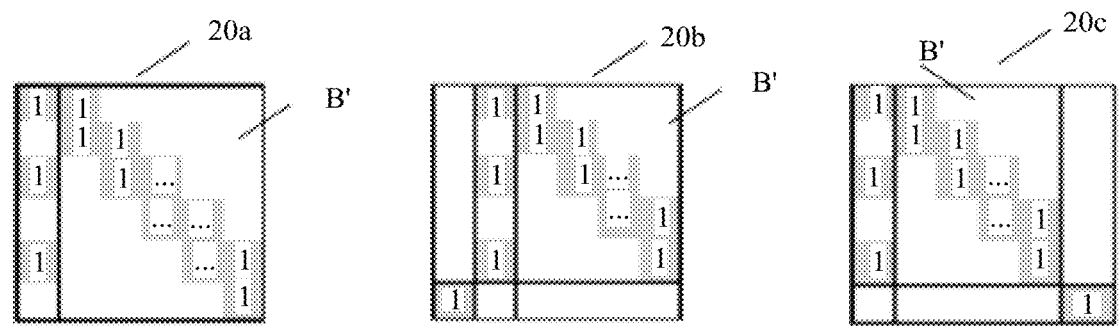

As shown in 200 in FIG. 2, submatrix A is a matrix including $m_A$ rows and $n_A$ columns, and the submatrix A has a size of $m_A \times n_A$. Each column corresponds to Z systematic bits in the LDPC code, and a systematic bit is sometimes referred to as an information bit.

Submatrix B is a square matrix of $m_A$ rows and $m_A$ columns, and the submatrix B has a size of $m_A \times m_A$. Each column corresponds to Z parity bits in the LDPC code. As shown in 20a of FIG. 2, the submatrix B includes a submatrix B' with a bi-diagonal structure, and a matrix column whose weight is 3 (for short, weight-3 column), and the weight-3 column may be located at the left side of the submatrix B'. The submatrix B may further include one or more matrix columns whose column weights are 1 (for short, weight-1 column). For example, a possible implementation is shown in 20b or 20c in FIG. 2.

Generally, a matrix generated based on the submatrices A and B is a core matrix, which may be used to support high-code rate encoding.

Continuing in FIG. 2, submatrix C is an all zero matrix, and the submatrix C has a size of $m_A \times m_D$. Submatrix E is an identity matrix, and the submatrix E has a size of $m_D \times m_D$.

Submatrix D has a size of $m_D \times (n_A + m_A)$, and the submatrix D may be used to generate parity bits with low code rate.

It may be understood that the base graph is described above from a mathematical definition perspective. Because submatrix C is an all zero matrix and submatrix E is an identity matrix, in a possible implementation, a matrix including the submatrix A and submatrix B, or a matrix including the submatrix A, the submatrix B, and the submatrix D may be used to represent a base graph of a matrix in encoding or decoding.

Because structures of the submatrix C and the submatrix E are relatively fixed, structures of the submatrix A, the submatrix B, and the submatrix D are determining factors affecting encoding and decoding performance of the LDPC code.

When an LDPC matrix with a raptor-like structure is used for encoding, in a possible implementation, the part of the matrix including the submatrix A and the submatrix B, namely, a core matrix, may be first used for encoding to obtain one or more parity bits corresponding to the submatrix B. Then the entire matrix is used for encoding to obtain one or more parity bits corresponding to the submatrix E. Because the submatrix B may include a submatrix B' with a bi-diagonal structure and a weight-1 column. Therefore, during the encoding, one or more parity bits corresponding to the bi-diagonal structure may be first obtained, and then one or more parity bits corresponding to the weight-1 column are obtained.

The following provides an example of encoding method. Assuming that the core matrix including the submatrix A and the submatrix B is $H_{core}$, a weight-1 column and a row in which a non-zero-element in the weight-1 column is located are removed from the $H_{core}$ to obtain a matrix $H_{core\text{-}dual}$. A matrix block in the $H_{core\text{-}dual}$ corresponding to parity bits is represented by $H_e = [H_{e1}\ H_{e2}]$, where $H_{e1}$ is a weight-3 column, and $H_{e2}$ has a bi-diagonal structure. According to a definition of an LDPC code matrix, $H_{core\text{-}dual} \cdot [S\ P_e]^T = 0$, where S is an input sequence and is a vector including information bits, $P_e$ is a vector including parity bits, and $[S\ P_e]^T$ indicates a transposed matrix including the input sequence S and $P_e$. Therefore, parity bits corresponding to $H_{core\text{-}dual}$ may be calculated first according to the input sequence S and $H_{core\text{-}dual}$. The input sequence S includes all information bits. Then, parity bits corresponding to the weight-1 column in the submatrix B is calculated according to the obtained parity bits corresponding to $H_{core\text{-}dual}$ and the input sequence S. In this case, all parity bits corresponding to the submatrix B may be obtained. Then, parity bits corresponding to the submatrix E is obtained by encoding using the submatrix D and based on the input sequence S and the obtained parity bits corresponding to the submatrix B. In this way, all the information bits and all parity bits are obtained. These bits form an encoded sequence, that is, LDPC codeword(s).

Optionally, LDPC encoding may further include shortening and puncturing operations. The shortened bits and the punctured bits are not sent.

The shortening is usually performed starting from the last bit of information bits, and may be performed in different manners. For example, for a quantity of shortened bits is $s_0$, the last $s_0$ bits in the input sequence S may be set as known bits, such as set to 0 or null or other values, to obtain an input sequence S', and then the input sequence S' is encoded by using an LDPC matrix. For another example, the last ($s_0$ mod Z) bits in the input sequence S may be set as known bits, such as set to 0 or null or other values, to obtain an input sequence S', and the last $$\left\lfloor \frac{s_0}{Z} \right\rfloor$$

columns in the submatrix A are deleted to obtain an LDPC matrix H', and the input sequence S' is encoded by using the LDPC matrix H', or the last $$\left\lfloor \frac{s_0}{Z} \right\rfloor$$

columns in the submatrix A do not participate in encoding of the input sequence S'. After the encoding is completed, the shortened bits are not sent.

The puncturing may be performed on one or more columns corresponding to built-in puncture bits, or one or more parity bits in an input sequence. Usually puncturing one or more parity bits is also from the last one bit in parity bits. Alternatively, puncturing parity bit(s) may be performed according to a preset puncturing pattern in the system. In a possible implementation, an input sequence is first encoded, and then based on a quantity p of bits that need to be punctured, the last p bit(s) in parity bits are selected, or p bit(s) are selected according to the preset puncturing pattern in the system, where the p bit(s) are not sent. In another possible implementation, p column(s) of a matrix corresponding to the punctured bits and p rows in which non-zero-elements in these columns are located may be determined, and the rows and the columns do not participate in encoding, and therefore no corresponding parity bits are generated.

It should be noted that the encoding implementations described herein are merely used as examples. Other known encoding implementations may alternatively be used based on the base graph and/or the base matrix provided in this application. and the encoding implementations are not limited in this application. Decoding in this application may be performed in various decoding methods, for example, a min-sum (MS) decoding method, or a belief propagation decoding method. The MS decoding method may also be referred to as a flood MS decoding method sometimes. For example, an input sequence is initialized, and an iteration is performed. Hard decision detection is performed after the iteration, and a hard decision result is checked. If the decoding result meets a check equation, decoding succeeds, the iteration ends, and the decision result is output. If the decoding result does not meet a check equation, an iteration is performed again within a maximum quantity of iteration times. If the check still fails when the maximum quantity of iteration times is reached, the decoding fails. It may be understood that the principle of the MS decoding is conventionally known, and details are not described herein again.

It should be noted that the decoding method is merely used as an example herein, other decoding methods known may alternatively be used based on the base graph and/or the base matrix provided in this application, and the decoding manner is not limited in this application.

An LDPC code may be obtained based on a base graph and a base matrix, an upper limit of performance of the LDPC code may be determined by performing density evolution on the base graph or the base matrix. An error floor of the LDPC code is determined based on a shift value in the base matrix. Improving encoding performance and decoding performance and lowering the error floor are some of objectives of designing the base graph and the base matrix. In the wireless communication system, code lengths are widely varied. For example, a code length may be 40 bits, 1280 bits, or the like. FIG. 3a and FIG. 3b-1 to FIG. 3b-8 are examples of a base graph and base matrices of a core matrix of the LDPC code. The examples may meet performance requirements of code blocks having a block length of 20 to 2560 bits. For ease of description and understanding, column indexes and row indexes are respectively shown on the uppermost side and the leftmost side in FIG. 3a and FIG. 3b-1 to FIG. 3b-8.

Figure 3A:
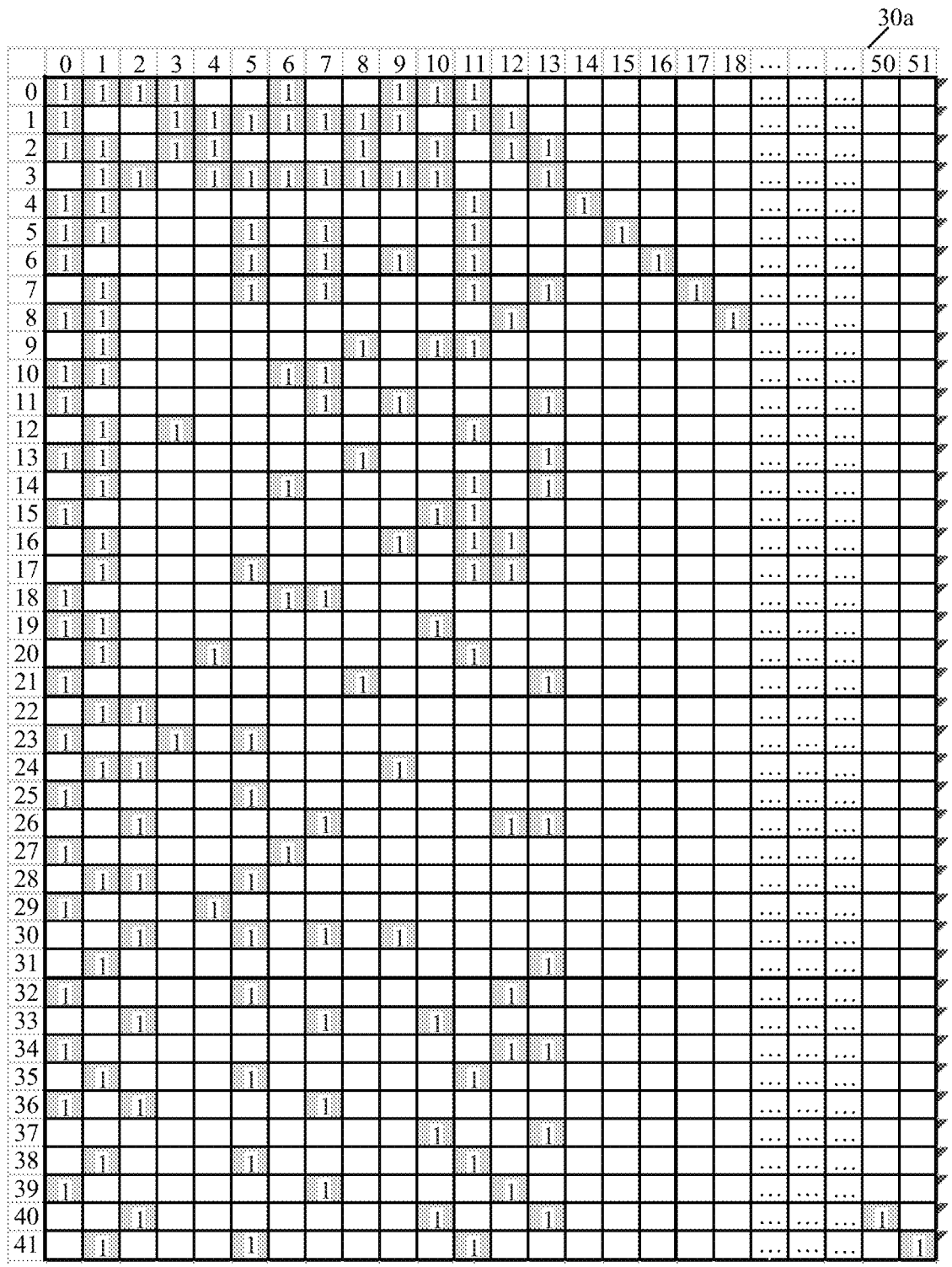
FIG. 3a is a schematic diagram of a base graph of an LDPC code according to an embodiment of the present application.
Figure 3B-1:
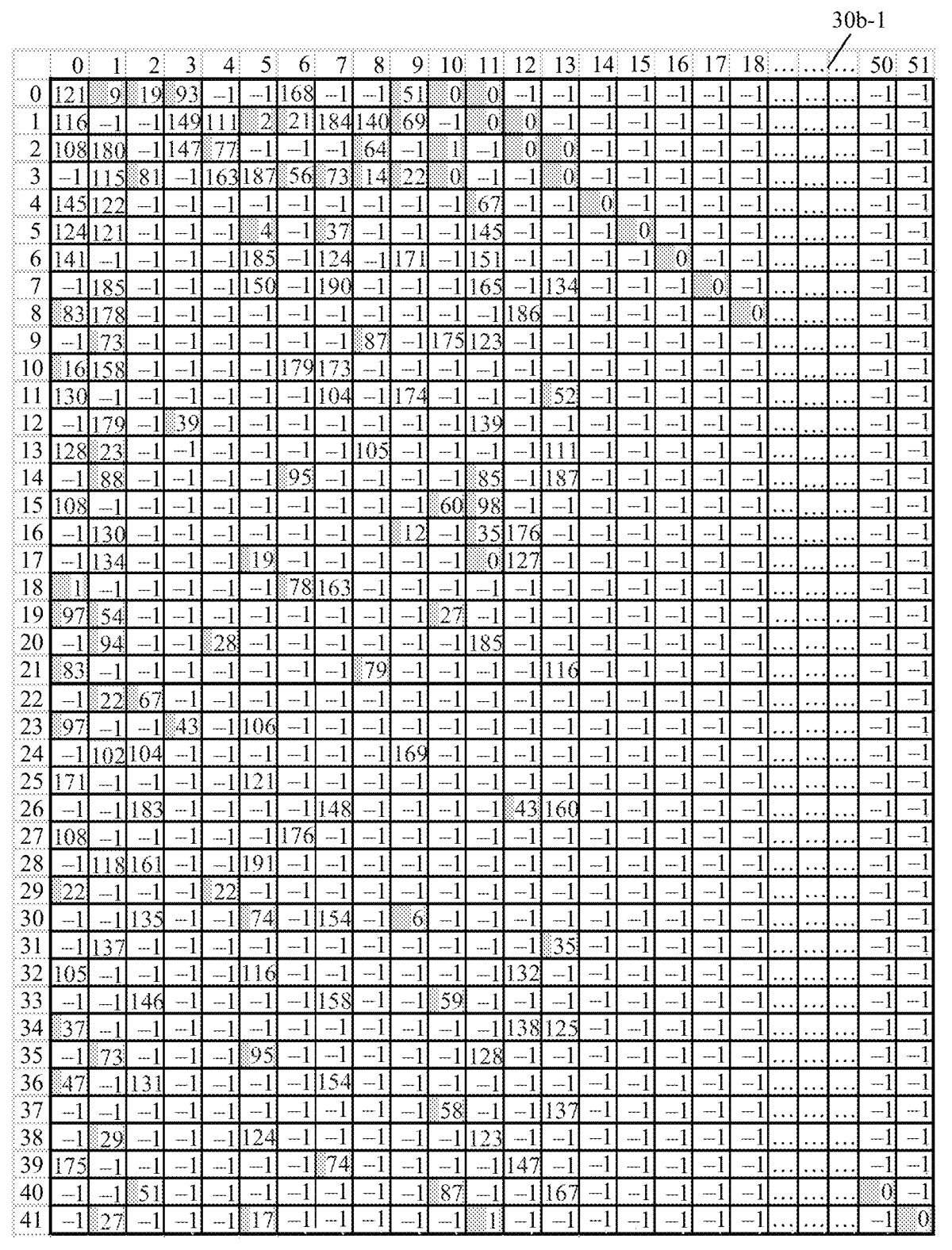
Figure 4:
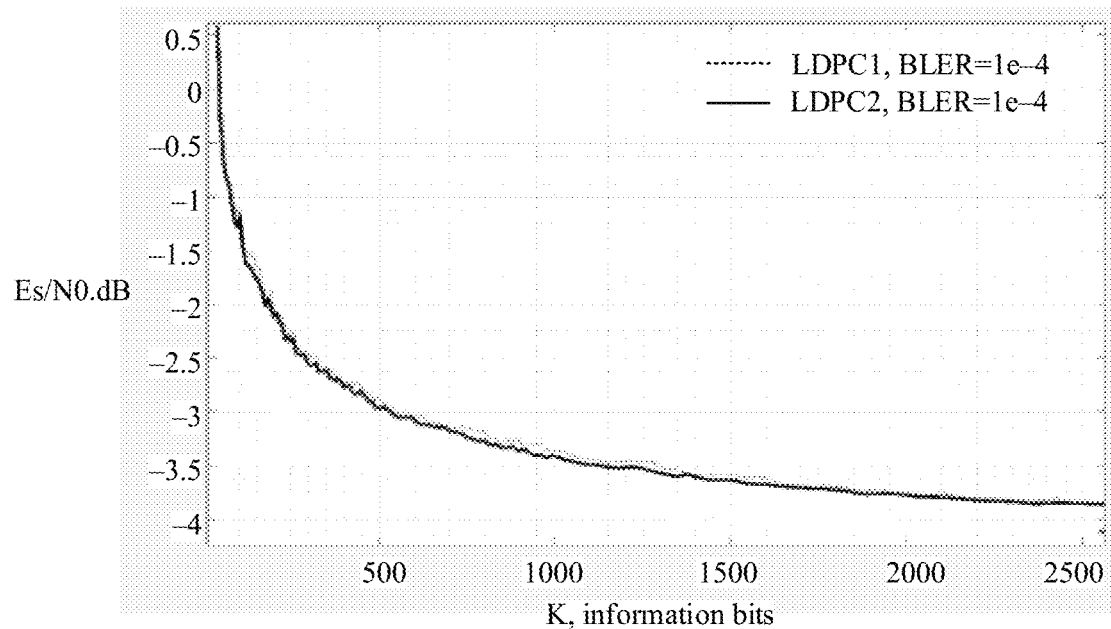

FIG. 4 is a performance diagram based on the LDPC code shown in FIG. 3a and FIG. 3b-1 to FIG. 3b-8. An LDPC 1 indicates an LDPC code obtained by encoding based on a base matrix corresponding to a base graph 30a, and LDPC 2 indicates a commonly used LDPC code used for comparison. A horizontal coordinate indicates a length of an information bit sequence, and a unit of length is bit. A vertical coordinate indicates a symbol signal-to-noise ratio (Es/N0). Performance curves indicates performance of a symbol signal-to-noise ratio for the LDPC 1 and the LDPC 2 in case of different information bit sequence lengths when a block error rate (BLER) is 0.0001. It will be appreciated that at a same BLER, a symbol signal-to-noise ratio of the LDPC 1 is less than that of the LDPC 2 in case of different information bit sequence lengths, that is, performance of the LDPC 1 is better than that of the LDPC 2.

FIG. 3a shows an example of a base graph 30a of an LDPC code. The matrix of the base graph 30a has 42 rows and 52 columns. In the figure, 0 to 51 in the uppermost row indicate column indexes, and 0 to 41 in the leftmost column indicate row indexes.

In the base graph 30a, submatrix A corresponds to systematic bits and has $m_A$ rows and 10 columns, where $4 \leq m_A \leq 7$. For example, if $m_A = 4$, the submatrix A includes elements in row 0 to row 3 and column 0 to column 9 in the base graph 30a. For another example, if $m_A > 4$, using $m_A = 7$ as an example, the submatrix A includes elements in row 0 to row 6 and column 0 to column 9 in the base graph 30a.

Submatrix B corresponds to parity bits, has $m_A$ rows and $m_A$ columns, and includes elements in row 0 to row $(m_A-1)$ and column 10 to column $(10+m_A-1)$ in the base graph 30a.

The submatrix A and the submatrix B form a core matrix of the base graph of an LDPC code, that is, a matrix including $m_A$ rows and $(m_A+n_A)$ columns. The matrix may be used for high-code rate encoding. For ease of description, using $m_A=7$ as an example below, the core matrix of the base graph of the LDPC code is 7 rows and 17 columns.

The submatrix A may include two columns corresponding to built-in puncture bits. After puncturing, a code rate that can be supported by the core matrix is $10/(17-2)=\frac{2}{3}$.

The submatrix B includes one weight-3 column, that is, a column weight of column 0 of the submatrix B (column 10 of the core matrix) is 3. A matrix including column 1 to column 3 (column 11 to column 13 in the core matrix) and row 0 to row 3 in the submatrix B is of a bi-diagonal structure. The submatrix B further includes three weight-1 columns.

Using $m_A=7$ as an example, the core matrix of the base graph 30a includes two rows whose weights are 10, two rows whose weights are 8, two rows whose weights are 6, and one row whose weight is 4. That is, row weights of rows in the core matrix including the submatrix A and the submatrix B are respectively 8, 10, 8, 10, 4, 6, and 6. It should be noted that the rows in the core matrix may be switched, for example, row 0 is switched with row 2, row 1 is switched with row 3, and the like. Each of the rows in the core matrix may be one of rows shown in row 0 to row 6 and column 0 to column 16 in the core matrix of the base graph 30a. The rows may be switched with each other, and the columns may also be switched with each other. For example, column 8 may be switched with column 14 in the core matrix. It should be noted that, only examples are provided herein. In an actual application, column permutation and row permutation may be flexibly designed based on a system requirement.

It may be understood that because in a matrix, rows may be switched with each other, columns may also be switched with each other, row permutation does not change weights of columns, and column permutation does not change weights of rows, a quantity of non-zero-elements in the matrix does not change. After row permutation and column permutation, weights of rows in a base graph do not change. Use of a base graph obtained after row permutation, column permutation, or row permutation and column permutation does not affect performance.

It should be noted that in this application, that performance is not affected means: On the whole, impact is acceptable and falls within a tolerance range. For example, in some scenarios or in some ranges, the performance is lowered in an allowable range. However, in some scenarios or some ranges, the performance is improved. On the whole, there is little impact on the performance.

Usually, for a given base graph or a given base matrix of an LDPC code, impact on performance caused by few modifications to matrix elements is acceptable. For example, in an implementation, few modifications may be made based on the core matrix of the base graph 30a. For example, a weight of one row is greater than or equal to 2 and less than or equal to 5, and weights of other six rows are greater than or equal to 6 and less than or equal to 12. It may be understood that referring to the solution provided in this application, weights of some rows may be increased or decreased by 1 or 2. This is not limited in this application.

To obtain flexible code rates, a submatrix C, a submatrix D, and a submatrix E of corresponding sizes may be added based on the core matrix. Because the submatrix C is an all zero matrix and the submatrix E is an identity matrix, sizes of the matrices are determined according to code rates, and structures of the matrices are relatively fixed. Encoding performance and decoding performance are mainly affected by the core matrix and the submatrix D. Different code rates may be obtained by adding rows and columns based on the core matrix to form the corresponding submatrices C, D, and E. For example, the core matrix of the base graph 30a may be used as the core matrix, and the corresponding submatrices C, D, and E are added to satisfy requirements of encoding or decoding for different code rates.

A column count $m_D$ of the submatrix D is a sum of a column count of the submatrix A and a column count of the submatrix B, and a row count of the submatrix D is mainly related to a code rate. Using the base graph 30a as an example, if $m_A=4$, a corresponding column count of the submatrix D is $(n_A+m_A)=14$, or if $m_A=7$, a corresponding column count of the submatrix D is $(n_A+m_A)=17$. If a code rate supported by the LDPC code is $R_m$, a base graph or a base matrix of the LDPC code has a size of m×n, where $n=n_A/R_m+p$ and $m=n-n_A=n_A/R_m+p-n_A$. If a minimum code rate $R_m=1/5$, and a quantity p columns corresponding to the built-in puncture bits is 2, using the base graph 30a as an example, n=52 and m=42. A row count $m_D$ of the submatrix D may be up to $m-m_A=42-m_A$, and if $m_A=4$, $0 \le m_D \le 38$, or if $m_A=7$, $0 \le m_D \le 35$.

For ease of description, a matrix F of $m_F$ rows and $(m_A+n_A)$ columns may be defined, so that the submatrix D may include $m_D$ rows in the matrix F, where $0 \le m_D \le m_F$, and $35 \le m_F \le 38$. Still using $m_A=7$ as an example, in the base graph 30a, $m_A+m_D=42$. If $m_D=35$, correspondingly, the submatrix D includes 35 rows and 17 columns. To be specific, the submatrix D is the matrix F, and the code rate supported by the corresponding LDPC code is 10/50=1/5. It will be appreciated that for $m_A=7$, a matrix including row 7 to row 41 and column 0 to column 17 in the base graph 30a is the matrix F. For $m_A=4$, a matrix including row 4 to row 41 and column 0 to column 13 in the base graph 30a is the matrix F. It should be noted that, only examples are provided herein, and the present application is not limited thereto. $m_A$ may alternatively be any integer value from 4 to 7, and the column count of the matrix F also correspondingly changes.

In the present application, if there is at most one non-zero-element in a same column in two adjacent rows in the base graph, the two rows are mutually orthogonal. In other columns different from some columns for two adjacent rows in the base graph, if there is at most one non-zero-element in a same column of the other columns for two adjacent rows in the base graph, the two rows are quasi-orthogonal.

The matrix F may include a plurality of rows having a quasi-orthogonal structure and at least two rows having an orthogonal structure. For example, the matrix F includes at least 15 rows satisfying the quasi-orthogonal structure. In columns other than the f columns corresponding to built-in puncture bits in any two adjacent rows in the 15 rows, there is at most one non-zero-element in a same column, that is, a matrix block including the columns other than the columns corresponding to built-in puncture bits in the at least 15 rows in the matrix F has an orthogonal structure. The matrix F may further include 10 to 20 rows satisfying the orthogonal structure. In these rows, there is at most one non-zero-element in a same column in any two adjacent rows. To be specific, there is also at most one non-zero-element in a built-in puncture column.

For example, using the base graph 30a as an example, the last 10 rows in the matrix F has an orthogonal structure, weights of nine rows are 3, and a weight of one row is 2. Column weight distribution of the matrix F may be: a weight of one column is 16, a weight of one column is 18, a weight of one column is 11, weights of two columns are 10, a weight of one column is 9, a weight of one column is 8, a weight of one column is 7, a weight of one column is 6, weights of two columns are 4, a weight of one column is 3, and weights of two columns are 2. If $m_A>4$, weights of other columns in the matrix F are 0.

Using $m_A=7$ as an example, in an example of the matrix F in the base graph 30a, row weights of the matrix F are 5, 3, 4, 4, 4, 3, 4, 4, 3, 4, 4, 3, 3, 3, 2, 3, 3, 2, 4, 2, 3, 2, 4, 2, 3, 3, 3, 3, 3, 2, 3, 3, 3, and 3 in sequence.

Because the submatrix E is an identity matrix, weights of rows in the base graph 30a are respectively 8, 10, 8, 10, 4, 6, 6, 6, 4, 5, 5, 5, 4, 5, 5, 4, 5, 5, 4, 4, 4, 4, 3, 4, 4, 3, 5, 3, 4, 3, 5, 3, 4, 4, 4, 4, 4, 3, 4, 4, 4, and 4.

Still using $m_A=7$ as an example, if $m_D=15$, the submatrix D in the base graph of the LDPC code may include 15 rows and 17 columns. The submatrix D may be a matrix including row 0 to row 14 in the matrix F in the base graph 30a, that is, row 7 to row 21, and column 0 to column 16 in the base graph 30a. A code rate supported by the corresponding LDPC code is 10/30=1/3. That is, at the code rate, the base graph of the LDPC code corresponds to a matrix including row 0 to row 21 and column 0 to column 31 in the base graph 30a. The submatrix E is an identity matrix including 15 rows and 15 columns, and the submatrix C is an all zero matrix including 7 rows and 15 columns.

If $m_D=25$, the submatrix D in the base graph of the LDPC code has 25 rows and 17 columns. The submatrix D may be a matrix including row 0 to row 24 in the matrix F in the base graph 30a, that is, row 7 to row 31, and column 0 to column 16 in the base graph 30a. A code rate supported by the corresponding LDPC code is 10/40=¼. That is, at the code rate, the base graph of the LDPC code corresponds to a matrix including row 0 to row 31 and column 0 to column 41 in the base graph 30a. The submatrix E is an identity matrix including 25 rows and 25 columns, and the submatrix C is an all zero matrix including 7 rows and 25 columns.

The rest can be deduced by analogy, and details are not described one by one.

It should be noted that in the base graph and the base matrix of the LDPC code, rows may be switched with each other, and columns may also be switched with each other. For example, in the base graph 30a, row 34 may be switched with row 36, and column 44 may be switched with column 45. For another example, the submatrix D includes $m_D$ rows in the matrix F, the $m_D$ rows may not be switched, or one or more of the $m_D$ rows may be switched, the submatrix E is still of a diagonal structure, and neither row permutation nor column permutation is performed on the submatrix E. For example, row 27 is switched with row 29 in the matrix F, the submatrix D includes $m_D$ rows in the matrix F, and the submatrix E is still of the diagonal structure. The matrix F is a quasi-orthogonal matrix before the row permutation, and is still a quasi-orthogonal matrix by performing row permutation. It may be understood that if the base graph or the base matrix includes the submatrix D, when columns in the core matrix are switched, corresponding columns in the submatrix D also need to be switched.

As shown in FIG. 3b-1 to FIG. 3b-8, base matrices 30b-1 to 30b-8 are examples of a plurality of base matrices of the base graph 30a. A non-zero-element in row i and column j in the base graph 30a has a same position in each of the base matrices 30b-1 to 30b-8, and a value of the non-zero-element is a shift value $V_{i,j}$. A zero-element in a shift matrix is represented by using −1 or null. A part corresponding to the submatrix D in the base matrix may include $m_D$ rows in a shift matrix of the matrix F, and values of $m_D$ may be selected according to different code rates. A shift matrix corresponding to the submatrix D includes $m_D$ rows in the shift matrix of the matrix F.

In a possible implementation, the shift matrix of the matrix F may be a matrix including row 7 to row 41 and column 0 to column 16 in any one of matrices 30b-1 to 30b-8, or a matrix obtained by performing row/column permutation on the matrix including row 7 to row 41 and column 0 to column 16 in any one of matrices 30b-1 to 30b-8; or the shift matrix of the matrix F may include a matrix including row 4 to row 41 and column 0 to column 14 in any one of matrices 30b-1 to 30b-8, or a matrix obtained by performing row/column permutation on the matrix including row 4 to row 41 and column 0 to column 14 in any one of matrices 30b-1 to 30b-8.

To support different block lengths, the LDPC code utilizes different lifting factors Z. For example, lifting factors $Z = a \times 2^j$, where $a \in \{2, 3, 5, 7, 9, 11, 13, 15\}$ may be divided into eight sets shown in Table 1:

TABLE 1

| Set 1 | $Z = 2 \times 2^j$, where j = 0, 1, 2, 3, 4, 5, 6, 7 |
| Set 2 | $Z = 3 \times 2^j$, where j = 0, 1, 2, 3, 4, 5, 6, 7 |
| Set 3 | $Z = 5 \times 2^j$, where j = 0, 1, 2, 3, 4, 5, 6 |
| Set 4 | $Z = 7 \times 2^j$, where j = 0, 1, 2, 3, 4, 5 |
| Set 5 | $Z = 9 \times 2^j$, where j = 0, 1, 2, 3, 4, 5 |
| Set 6 | $Z = 11 \times 2^j$, where j = 0, 1, 2, 3, 4, 5 |

TABLE 1-continued

| Set 7 | $Z = 13 \times 2^j$, where j = 0, 1, 2, 3, 4 |
| Set 8 | $Z = 15 \times 2^j$, where j = 0, 1, 2, 3, 4 |

To ensure LDPC code performance in different block lengths, based on the sets of different lifting factors Z, base matrices corresponding to the sets of the different lifting factors Z may be separately used.

In a possible implementation:

If the lifting factor Z is one lifting factor in the set 1, the shift matrix of the matrix F may be the matrix including row 7 to row 41 and column 0 to column 16 in 30b-1, or the matrix obtained by performing row/column permutation on the matrix including row 7 to row 41 and column 0 to column 16 in 30b-1; or the shift matrix of the matrix F may be the matrix including row 4 to row 41 and column 0 to column 14 in 30b-1, or the matrix obtained by performing row/column permutation on the matrix including row 4 to row 41 and column 0 to column 14 in 30b-1. Correspondingly, the base matrix of the base graph 30a may be the matrix shown in 30b-1, or the matrix obtained by performing row/column permutation on the matrix shown in 30b-1.

If the lifting factor Z is one lifting factor in the set 2, the shift matrix of the matrix F may be the matrix including row 7 to row 41 and column 0 to column 16 in 30b-2, or the matrix obtained by performing row/column permutation on the matrix including row 7 to row 41 and column 0 to column 16 in 30b-2; or the shift matrix of the matrix F may be the matrix including row 4 to row 41 and column 0 to column 14 in 30b-2, or the matrix obtained by performing row/column permutation on the matrix including row 4 to row 41 and column 0 to column 14 in 30b-2. Correspondingly, the base matrix of the base graph 30a may be the matrix shown in 30b-2, or the matrix obtained by performing row/column permutation on the matrix shown in 30b-2.

If the lifting factor Z is one lifting factor in the set 3, the shift matrix of the matrix F may be the matrix including row 7 to row 41 and column 0 to column 16 in 30b-3, or the matrix obtained by performing row/column permutation on the matrix including row 7 to row 41 and column 0 to column 16 in 30b-3; or the shift matrix of the matrix F may be the matrix including row 4 to row 41 and column 0 to column 14 in 30b-3, or the matrix obtained by performing row/column permutation on the matrix including row 4 to row 41 and column 0 to column 14 in 30b-3. Correspondingly, the base matrix of the base graph 30a may be the matrix shown in 30b-3, or the matrix obtained by performing row/column permutation on the matrix shown in 30b-3.

If the lifting factor Z is one lifting factor in the set 4, the shift matrix of the matrix F may be the matrix including row 7 to row 41 and column 0 to column 16 in 30b-4, or the matrix obtained by performing row/column permutation on the matrix including row 7 to row 41 and column 0 to column 16 in 30b-4; or the shift matrix of the matrix F may be the matrix including row 4 to row 41 and column 0 to column 14 in 30b-4, or the matrix obtained by performing row/column permutation on the matrix including row 4 to row 41 and column 0 to column 14 in 30b-4. Correspondingly, the base matrix of the base graph 30a may be the matrix shown in 30b-4, or the matrix obtained by performing row/column permutation on the matrix shown in 30b-4.

If the lifting factor Z is one lifting factor in the set 5, the shift matrix of the matrix F may be the matrix including row 7 to row 41 and column 0 to column 16 in 30b-5, or the matrix obtained by performing row/column permutation on the matrix including row 7 to row 41 and column 0 to column 16 in 30b-5; or the shift matrix of the matrix F may be the matrix including row 4 to row 41 and column 0 to column 14 in 30b-5, or the matrix obtained by performing row/column permutation on the matrix including row 4 to row 41 and column 0 to column 14 in 30b-5. Correspondingly, the base matrix of the base graph 30a may be the matrix shown in 30b-5, or the matrix obtained by performing row/column permutation on the matrix shown in 30b-5.

If the lifting factor Z is one lifting factor in the set 6, the shift matrix of the matrix F may be the matrix including row 7 to row 41 and column 0 to column 16 in 30b-6, or the matrix obtained by performing row/column permutation on the matrix including row 7 to row 41 and column 0 to column 16 in 30b-6; or the shift matrix of the matrix F may be the matrix including row 4 to row 41 and column 0 to column 14 in 30b-6, or the matrix obtained by performing row/column permutation on the matrix including row 4 to row 41 and column 0 to column 14 in 30b-6. Correspondingly, the base matrix of the base graph 30a may be the matrix shown in 30b-6, or the matrix obtained by performing row/column permutation on the matrix shown in 30b-6.

If the lifting factor Z is one lifting factor in the set 7, the shift matrix of the matrix F may be the matrix including row 7 to row 41 and column 0 to column 16 in 30b-7, or the matrix obtained by performing row/column permutation on the matrix including row 7 to row 41 and column 0 to column 16 in 30b-7; or the shift matrix of the matrix F may be the matrix including row 4 to row 41 and column 0 to column 14 in 30b-7, or the matrix obtained by performing row/column permutation on the matrix including row 4 to row 41 and column 0 to column 14 in 30b-7. Correspondingly, the base matrix of the base graph 30a may be the matrix shown in 30b-7, or the matrix obtained by performing row/column permutation on the matrix shown in 30b-7.

If the lifting factor Z is one lifting factor in the set 8, the shift matrix of the matrix F may be the matrix including row 7 to row 41 and column 0 to column 16 in 30b-8, or the matrix obtained by performing row/column permutation on the matrix including row 7 to row 41 and column 0 to column 16 in 30b-8; or the shift matrix of the matrix F may be the matrix including row 4 to row 41 and column 0 to column 14 in 30b-8, or the matrix obtained by performing row/column permutation on the matrix including row 4 to row 41 and column 0 to column 14 in 30b-8. Correspondingly, the base matrix of the base graph 30a may be the matrix shown in 30b-8, or the matrix obtained by performing row/column permutation on the matrix shown in 30b-8.

For example, a value of the lifting factor Z is determined based on a length K of the input sequence. For example, if the length of the input sequence is K, a minimum value that meets $10 \times Z \geq K$ may be determined from a plurality of lifting factors defined in a system and used as the value of the lifting factor of the matrix. Further, a corresponding base matrix may be selected according to the determined lifting factor.

Similarly, rows in the base matrix may also be switched with each other, and columns in the base matrix may also be switched with each other. If at least one of row permutation or column permutation is performed on the base graph, same permutation is also performed on the corresponding rows or columns in the base matrix.

It may be understood that in this application, the quasi-orthogonal structure is not limited to only two adjacent rows. A matrix including the quasi-orthogonal structure may alternatively be designed to include a plurality of groups, each group includes at least two rows, for example, 3 rows or 4 rows, and rows included in each group are quasi-orthogonal.

In the performance curve diagram shown in FIG. 4, LDPC 1 indicates that the LDPC code is obtained by encoding based on a base matrix corresponding to the base graph 30a, and LDPC 2 indicates a commonly used LDPC code used for comparison. A horizontal coordinate indicates a length of an information bit sequence, and a unit of length is bit. A vertical coordinate is a symbol signal-to-noise ratio (Es/N0). Performance curves indicate performance of a symbol signal-to-noise ratio for LDPC 1 and LDPC 2 in case of different information bit sequence lengths when BLER is 0.0001. It will be appreciated that at a same BLER, a symbol signal-to-noise ratio of LDPC 1 is less than that of LDPC 2 in case of different information bit sequence lengths, that is, performance of LDPC 1 is better than that of LDPC 2.

In an encoding method provided in an embodiment of the present application, an encoder encodes an input sequence by using an LDPC matrix. A base graph of the LDPC matrix may be any base graph in the foregoing examples, and a base matrix of the LDPC matrix may be any base matrix in the foregoing examples. The input sequence of the encoder may be an information bit sequence, or may be an information bit sequence obtained through at least one type of the following processing: CRC bits attachment or filler bits insertion.

Further, the method includes: determining a lifting factor Z. A value of the lifting factor Z may be determined based on a length K of the input sequence. The information bit sequence may also be referred to as a code block (code block) sometimes, and may be obtained through code block segmentation on a transport block. If the length of the information bit sequence is K, a minimum value that meets $10 \times Z \geq K$ may be determined from a plurality of lifting factors defined in a system as the value of the lifting factor Z. For example, if K=128 and the lifting factors defined in the system include lifting factors in the sets in Table 1, for example, 2, 3, 4, 5, 6, 7, 8, 9, 10, 11, 12, 13, 14, 15, 16, 18, 20, 22, 24, 26, 28, 30, 32, 36, 40, 44, 48, 52, 56, 60, 64, 72, 80, 88, 96, 104, 112, 120, 128, 144, 160, 176, 192, 208, 224, 240, and 256, it may be determined that Z is 13 and is in the set 7. It should be noted that only examples are provided herein, and the examples do not constitute a limitation.

In another possible design, Kb may be a column count of columns corresponding to information bits in a base matrix of an LDPC code. In a supported lifting factor set, a minimum value $Z_0$ that meets $Kb \cdot Z_0 \geq K$ may be determined as the value of the lifting factor Z. In the base graph 30a, the column count $Kb_{max}$ of columns corresponding to information bits is 10, and it is assumed that a lifting factor set supported by the base graph 30a is {24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}.

If the length K of the input sequence is 529 bits, Z is 26. If the length K of the input sequence is 5000 bits, Z is 240. It should be noted that only examples are provided herein, and the examples do not constitute a limitation.

For another example, a value of Kb may also vary with a value of K, but the value of Kb does not exceed the column count of columns corresponding to the information bits in the base matrix of the LDPC code. For example, different thresholds may be set for Kb.

A possible design is as follows: It should be noted that threshold values 640, 560, or 192 herein are only examples. Other values may be designed according to a system design requirement.

if$(K>640)$,$Kb=10$;

elseif$(K>560)$,$Kb=9$;

elseif($K>192$),$Kb=8$;

else$Kb=6$;end

Wherein the lifting factor Z may be determined by the encoder according to the length K of the input sequence, or may be obtained by the encoder from other entities (such as a processor).

In a possible design, a value of a filler bit may be null, or 0, or other values defined in a system. After encoding, the filler bits can be identified and are not sent. The present application is not limited thereto.

The encoding, by the encoder, an input sequence by using an LDPC matrix H may be encoding the input sequence by using the LDPC matrix H corresponding to the lifting factor Z.

In a possible implementation, an input sequence is $c=\{c_0, c_1, c_2, \ldots, c_{K-1}\}$, a length of the input sequence c is K, and an output sequence obtained after the input sequence c is encoded by the encoder is $d=\{d_0, d_1, d_2, \ldots, d_{N-1}\}$, where K is an integer greater than 0, and K may be an integer multiple of the lifting factor Z.

The output sequence d includes $K_0$ bits in the input sequence c and parity bits in a parity bit sequence w, where $K_0$ is an integer greater than 0 and less than or equal to K. A length of the parity bit sequence w is $N-K_0$, where $w=\{w_0, w_1, w_2, \ldots, w_{N-K_0-1}\}$.

The parity bit sequence w and the input sequence c meet Formula (1):

$$H \times \begin{bmatrix} c^T \\ w^T \end{bmatrix} = 0^T, \quad (1)$$

where $c^T=[C_0, c_1, c_2, \ldots, c_{K-1}]^T$, $c^T$ is a transposed vector of a vector including bits in the input sequence, and $w^T=[w_0, w_1, w_2, \ldots, w_{N-K_0-1}]^T$, $w^T$ is a transposed vector of a vector including bits in the parity bit sequence, where $0^T$ is a column vector, and values of all elements of $0^T$ are 0.

H is an LDPC matrix obtained based on any base graph described in the foregoing embodiments, a base graph of H has m rows and n columns, and may be the base graph 30a mentioned in the foregoing embodiments.

In a design, the base graph of H includes p built-in puncture columns, where p is an integer greater than or equal to 0, and information bits corresponding to the p built-in puncture columns are not output, and the output sequence does not include the information bits corresponding to the p built-in puncture columns. In this case, $K_0=K-p \cdot Z$. For example, if $p=2$, $K_0=K-2 \cdot Z$ and the length of the parity bit sequence w is $N+2 \cdot Z-K$. If the p built-in puncture columns participate in encoding, $K_0=K$ and the length of the parity bit sequence w is $N-K$.

Correspondingly, H may have M rows and $(N+p \cdot Z)$ columns or M rows and N columns, and a size of the base graph of H is: $m=M/Z$ rows and $$n = \frac{(N + p \cdot Z)}{Z}$$

columns.

The base graph of the LDPC matrix H may be represented as $[H_{BG} \ H_{BG,EXT}]$, where $$H_{BG,EXT} = \begin{bmatrix} 0_{m_c \times n_c} \\ I_{n_c \times n_c} \end{bmatrix},$$

$0_{m_c \times n_c}$ represents an all zero matrix of size $m_c \times n_c$, and $I_{n_c \times n_c}$ represents an identity matrix of size $n_c \times n_c$. Because Kb may vary with K, $H_{BG}$ includes Kb columns corresponding to information bits in $H_{BG2}$ and includes column 10 to column $(10+m_A-1)$ in $H_{BG2}$, a column count in $H_{BG2}$ is $10+m_A$, where $4 \leq m_A \leq 7$. For example, if $Kb \in \{6, 8, 9\}$, $H_{BG}$ may be obtained after column Kb to column 9 are deleted from $H_{BG2}$. If $Kb=10$, $H_{BG}=H_{BG2}$.

In a possible design, $0_{m_c \times n_c}$ is the submatrix C in the base graph in the foregoing embodiments, and $I_{n_c \times n_c}$ is the submatrix E in the foregoing embodiments, so that $$H_{BG2} = \begin{bmatrix} [A \ B] \\ D \end{bmatrix},$$

where A, B, and D are respectively the submatrices A, B, and D in the base graph in the foregoing embodiments. Therefore, $m_c=7$, $0 \leq n_c \leq 35$, a row count in $H_{BG2}$ is less than or equal to 42 and is greater than or equal to 4, and the column count in $H_{BG2}$ is equal to 17.

In another possible design, because column 14 to column 16 are weight-1 columns and non-zero-elements in these columns are in row 4 to row 6, therefore, $m_c=6$, $0 \leq n_c \leq 36$, and the column count in $H_{BG2}$ is 16; or $m_c=5$, $0 \leq n_c \leq 37$, and the column count in $H_{BG2}$ is 15; or $m_c=4$, $0 \leq n_c \leq 38$, and the column count in $H_{BG2}$ is 14.

Correspondingly, the LDPC matrix H may be represented by $H=[H_1 \ H_2]$.

$H_1$ may be obtained by replacing each zero-element in $H_{BG}$ with an all zero matrix of size $Z \times Z$, and replacing each non-zero-element with a circular permutation matrix $h_{i,j}$ of size $Z \times Z$, where the circular permutation matrix $h_{i,j}$ is obtained by circularly shifting an identity matrix of size $Z \times Z$ to the right $P_{i,j}$ times, and $h_{i,j}$ may also be represented by $I(P_{i,j})$, where i is a row index and j is a column index. In a possible design, $P_{i,j}=\text{mod}(V_{i,j}, Z)$, where $V_{i,j}$ is a non-zero-element in row i and column j in a base matrix corresponding to a lifting factor set index corresponding to Z.

$H_2$ may be obtained by replacing each zero-element in $H_{BG,EXT}$ with an all zero matrix of size $Z \times Z$ and replacing each non-zero-element with an identity matrix of size $Z \times Z$.

The encoder may perform encoding and outputting in a plurality of manners. The base graph 30a mentioned in the foregoing embodiments is used as an example for description below. The base graph has a maximum of 42 rows and a maximum of 52 columns, and includes two built-in puncture columns. For ease of description, in the present application, a base graph that has the most rows and of the most columns is referred to as a complete base graph sometimes.

Manner 1

Encoding is performed based on the complete base graph, so that as many parity bits as possible can be obtained. In this case, $m=42$ and $n=52$, which correspond to row 0 to row 41 and column 0 to column 51 in the foregoing base graph.

Correspondingly, for the LDPC matrix H, M is $42 \times Z$, and if the output sequence includes information bits corresponding to the columns corresponding to built-in puncture bits, $N=(42+Kb) \times Z$; or if the output sequence does not include $2 \times Z$ information bits corresponding to the built-in puncture bits, $N=(40+Kb) \cdot Z$.

Information bits and parity bits that need to be sent may be determined from the output sequence generated by the encoder during subsequent processing.

Manner 2

Encoding is performed based on some rows and some columns in the complete base graph. Rows and columns may be selected, based on a code rate that needs to be sent, or a quantity of information bits and a quantity of parity bits that need to be sent, or the like, from the complete base graph for encoding.

For example, the code rate is ⅔, m=7, and n=17, that is, encoding is performed based on row 0 to row 6 and column 0 to column 16 in the foregoing base graph 30a.

Correspondingly, for the LDPC matrix H, M=7×Z, and if the output sequence includes information bits corresponding to the built-in puncture columns, N=17×Z; or if the output sequence does not include the information bits corresponding to the built-in puncture columns, N=15×Z.

For another example, the code rate is ⅚, m=4, and n=14.

For another example, the code rate is ⅕, m=42, and n=52.

It will be appreciated that the size of the base graph of H is 4≤m≤42 and 14≤n≤52. Correspondingly, for the LDPC matrix H, 4×Z≤M≤42×Z and (4+Kb)×Z≤N≤(42+Kb)×Z.

For example, if Z is 13 and in the set 7, encoding is performed on the input sequence by using the LDPC matrix obtained based on the base matrix 3b-7 corresponding to the set 7.

In another design, an element $P_{i,j}$ in row i and column j of the base matrix of the lifting factor Z may also satisfy the following relationship:

$$P_{i,j} = \begin{cases} -1 & V_{i,j} = -1 \\ \mod(V_{i,j}, Z) & V_{i,j} \geq 0 \end{cases},$$

where $V_{i,j}$ may be a shift value of an element in row i and column j in a base matrix of a set to which Z belongs, that is, a shift value of a non-zero-element in row i and column j in a base matrix of a maximum lifting factor in the set to which Z belongs.

For example, using an example in which Z is 13, the element $P_{i,j}$ in row i and column j in the base matrix of Z meets:

$$P_{i,j} = \begin{cases} -1 & V_{i,j} = -1 \\ \mod(V_{i,j}, Z) & V_{i,j} \geq 0 \end{cases},$$

where $V_{i,j}$ is a shift value of a non-zero-element in row i and column j in the base matrix 3b-7.

It should be noted that only examples are provided herein, and the examples do not constitute a limitation in the present application.

In the foregoing implementations, the base matrix $H_B$ of the LDPC matrix H may be any base matrix mentioned in the foregoing embodiments or a base matrix obtained by performing row permutation, or column permutation, or row permutation and column permutation on any base matrix described above. The base graph of the LDPC matrix includes at least a submatrix A and a submatrix B, and may further include a submatrix C, a submatrix D, and a submatrix E. For each submatrix, refer to descriptions in the foregoing embodiments, and details are not described herein again. Certainly, the base matrix $H_B$ may alternatively be a base matrix which base graph is the same as the base graph 30a. The present application is not limited thereto.

In a possible implementation, the base matrix $H_B$ of the LDPC code may be stored in a memory, and the encoder obtains the LDPC matrix corresponding to the lifting factor Z, to encode the input sequence. In another possible implementation, because there are a plurality of base matrices $H_B$ of the LDPC code, relatively large storage space is occupied when the base matrices are stored according to matrix structures. The base graph of the LDPC code may alternatively be stored in the memory, and shift values of non-zero-elements in the base matrices may be stored row by row or column by column, and then the LDPC matrix may be obtained based on the base graph and shift values of a base matrix corresponding to the lifting factor Z.

The base graph may indicate positions of non-zero-elements in each base matrix. In another possible implementation, storing the base graph may be storing the positions of the non-zero-elements in the base graph. A position of a non-zero-element may be indicated by a row and a column in which the non-zero-element is located, for example, a column position of a non-zero-element in a row, or a row position of a non-zero-element in a column. In another possible implementation, storing the base graph may also be storing positions of zero-elements in the base graph. Similarly, a position of a zero-element may also be indicated by a row and a column in which the zero-element is located, for example, a column position of a zero-element in a row is located, or a row position of a zero-element in a column. Therefore, positions of non-zero-elements may be obtained by excluding the positions of the zero-elements. It should be noted only examples are provided herein, and the examples do not constitute a limitation in the present application.

In a design, parameters related to a base graph or a base matrix may be expressed in a table. For example, related parameters or tables may be stored in one or more memories. Related parameters such as a row index in the base graph or the base matrix and a column index in which a non-zero-element is located are read from the memory, so as to obtain the base graph or the base matrix. Optionally, a row weight of each row, and a shift value of a non-zero-element in each row may be stored.

The following uses FIG. 3a as an example for description. For other base graphs or base matrices provided in this application, refer to a similar design.

For example, parameters in the base graph 30a may be expressed in Table 2.

TABLE 2

| Row index (row index) | Row weight (row degree/row weight) | Column index of non-zero-element (column position of non-zero-element in row) |
| --- | --- | --- |
| 0 | 8 | 0, 1, 2, 3, 6, 9, 10, 11 |
| 1 | 10 | 0, 3, 4, 5, 6, 7, 8, 9, 11, 12 |
| 2 | 8 | 0, 1, 3, 4, 8, 10, 12, 13 |
| 3 | 10 | 1, 2, 4, 5, 6, 7, 8, 9, 10, 13 |
| 4 | 4 | 0, 1, 11, 14 |
| 5 | 6 | 0, 1, 5, 7, 11, 15 |
| 6 | 6 | 0, 5, 7, 9, 11, 16 |
| 7 | 6 | 1, 5, 7, 11, 13, 17 |
| 8 | 4 | 0, 1, 12, 18 |
| 9 | 5 | 1, 8, 10, 11, 19 |
| 10 | 5 | 0, 1, 6, 7, 20 |
| 11 | 5 | 0, 7, 9, 13, 21 |
| 12 | 4 | 1, 3, 11, 22 |

TABLE 2-continued

| Row index (row index) | Row weight (row degree/row weight) | Column index of non-zero-element (column position of non-zero-element in row) |
|---|---|---|
| 13 | 5 | 0, 1, 8, 13, 23 |
| 14 | 5 | 1, 6, 11, 13, 24 |
| 15 | 4 | 0, 10, 11, 25 |
| 16 | 5 | 1, 9, 11, 12, 26 |
| 17 | 5 | 1, 5, 11, 12, 27 |
| 18 | 4 | 0, 6, 7, 28 |
| 19 | 4 | 0, 1, 10, 29 |
| 20 | 4 | 1, 4, 11, 30 |
| 21 | 4 | 0, 8, 13, 31 |
| 22 | 3 | 1, 2, 32 |
| 23 | 4 | 0, 3, 5, 33 |
| 24 | 4 | 1, 2, 9, 34 |
| 25 | 3 | 0, 5, 35 |
| 26 | 5 | 2, 7, 12, 13, 36 |
| 27 | 3 | 0, 6, 37 |
| 28 | 4 | 1, 2, 5, 38 |
| 29 | 3 | 0, 4, 39 |
| 30 | 5 | 2, 5, 7, 9, 40 |
| 31 | 3 | 1, 13, 41 |
| 32 | 4 | 0, 5, 12, 42 |
| 33 | 4 | 2, 7, 10, 43 |
| 34 | 4 | 0, 12, 13, 44 |
| 35 | 4 | 1, 5, 11, 45 |
| 36 | 4 | 0, 2, 7, 46 |
| 37 | 3 | 10, 13, 47 |
| 38 | 4 | 1, 5, 11, 48 |
| 39 | 4 | 0, 7, 12, 49 |
| 40 | 4 | 2, 10, 13, 50 |
| 41 | 4 | 1, 5, 11, 51 |

It should be noted that only examples are provided herein, and the examples do not constitute a limitation. Related parameters of other base graph or base matrix provided in this application may also be expressed in a similar table. It may be understood that the foregoing base graph 30a and Table 2 are intended to help understand designs of the base graph and the base matrix. Representation forms of the base graph and the base matrix are not limited to only representation forms of the foregoing base graph 30a and Table 2. Other possible variations may be included.

In an implementation, related parameters may be column index, column weight, and row index in which a non-zero-element is located; or column index, column weight, and row index in which a zero-element is located. Using a form of Table 3 as an example, Table 3 shows only examples of two columns of the base graph. Other columns can be deduced by analogy, and details are not described one by one. Column 14 to column 51 may be weight-1 columns, and may alternatively be not stored. The row index of a non-zero-element is calculated according to a column index.

TABLE 3

| Column index | Column weight | Row index of non-zero-element |
|---|---|---|
| 0 | 22 | 0, 1, 2, 4, 5, 6, 8, 10, 11, 13, 15, 18, 19, 21, 23, 25, 27, 29, 32, 34, 36, 39 |
| 1 | 23 | 0, 2, 3, 4, 5, 7, 8, 9, 10, 12, 13, 14, 16, 17, 19, 20, 22, 24, 28, 35, 38, 41 |
| ... | ... | ... |

In an implementation, the parameter "row weight" or "column weight" in Table 2 or Table 3 may alternatively be omitted. According to columns or rows in which non-zero-elements in a row or a column are located, a quantity of non-zero-elements in a row or a column is learned. Therefore, row weight or column weight is also learned.

In an implementation, parameter values in "Column index of non-zero-element" in Table 2 and parameter values in "Row index of non-zero-element" in the Table 3 may be sorted in another order instead of an ascending order, provided that a parameter value is indexed to a column of a non-zero-element or indexed to a row of a non-zero-element.

In an implementation, Table 2 or Table 3 may further include a column "Shift value of non-zero-element". Parameter values in the column "Shift value of non-zero-element" are in a one-to-one correspondence with the parameter values in "Column index of non-zero-element". Table 5 may further include a column "Shift value of non-zero-element". Parameter values in the column "Shift value of non-zero-element" are in a one-to-one correspondence with parameter values in "Row index of non-zero-element".

In a design, to save storage space, a position of a non-zero-element in a part with a relatively definite structure in the base graph may be calculated according to a row position and a column index, and may not be stored. For example, the submatrix E is a diagonal matrix, and includes non-zero-elements only on the diagonal of the matrix. A column index of a non-zero-element may be calculated according to a row index, or a row index of a non-zero-element may also be calculated according to a column index. Using the base graph 30a as an example, for a weight-1 column in row $m_e$, where $m_e \geq 4$, a column index of a non-zero-element is column $(m_e + K_b)$, in this case, $K_b = 10$. For example, a column index of a non-zero-element in row 4 is column 14. For another example, the bi-diagonal structure B' in the submatrix B is located in row 0 to row 3 and column 11 to column 13 in the base graph 30a. A column position of a non-zero-element may be calculated according to a row index, or a row index of a non-zero-element may also be calculated according to a column index. For row mB, if $0 < m_B < 3$, column indexes of non-zero-elements in the row include column $(m_B + K_b)$ and column $(m_B + K_b + 1)$; and if $m_B = 0$ or $m_B = 3$, a column index of a non-zero-element in the row includes column $(m_B + K_b)$.

As shown in Table 4, Table 4 shows parameters in rows in the base graph 30a. Column indexes of non-zero-elements in column 0 to column 13 may be stored. However, Column indexes of non-zero-elements in column 14 to column 52 are not stored, that is, a column index of a non-zero-element in a weight-1 column is not stored. Table 4 may be used to indicate $H_{BG2}$ including 14 columns:

TABLE 4

| Row index | Row weight | Column index of non-zero-element |
|---|---|---|
| 0 | 8 | 0, 1, 2, 3, 6, 9, 10, 11 |
| 1 | 10 | 0, 3, 4, 5, 6, 7, 8, 9, 11, 12 |
| 2 | 8 | 0, 1, 3, 4, 8, 10, 12, 13 |
| 3 | 10 | 1, 2, 4, 5, 6, 7, 8, 9, 10, 13 |
| 4 | 3 | 0, 1, 11 |
| 5 | 5 | 0, 1, 5, 7, 11 |
| 6 | 5 | 0, 5, 7, 9, 11 |
| 7 | 5 | 1, 5, 7, 11, 13 |
| 8 | 3 | 0, 1, 12 |
| 9 | 4 | 1, 8, 10, 11 |
| 10 | 4 | 0, 1, 6, 7 |
| 11 | 4 | 0, 7, 9, 13 |
| 12 | 3 | 1, 3, 11 |
| 13 | 4 | 0, 1, 8, 13 |
| 14 | 4 | 1, 6, 11, 13 |
| 15 | 3 | 0, 10, 11 |
| 16 | 4 | 1, 9, 11, 12 |
| 17 | 4 | 1, 5, 11, 12 |
| 18 | 3 | 0, 6, 7 |
| 19 | 3 | 0, 1, 10 |

TABLE 4-continued

| Row index | Row weight | Column index of non-zero-element |
|---|---|---|
| 20 | 3 | 1, 4, 11 |
| 21 | 3 | 0, 8, 13 |
| 22 | 2 | 1, 2 |
| 23 | 3 | 0, 3, 5 |
| 24 | 3 | 1, 2, 9 |
| 25 | 2 | 0, 5 |
| 26 | 4 | 2, 7, 12, 13 |
| 27 | 2 | 0, 6 |
| 28 | 3 | 1, 2, 5 |
| 29 | 2 | 0, 4 |
| 30 | 4 | 2, 5, 7, 9 |
| 31 | 2 | 1, 13 |
| 32 | 3 | 0, 5, 12 |
| 33 | 3 | 2, 7, 10 |
| 34 | 3 | 0, 12, 13 |
| 35 | 3 | 1, 5, 11 |
| 36 | 3 | 0, 2, 7 |
| 37 | 2 | 10, 13 |
| 38 | 3 | 1, 5, 11 |
| 39 | 3 | 0, 7, 12 |
| 40 | 3 | 2, 10, 13 |
| 41 | 3 | 1, 5, 11 |

Certainly, for parameters stored in $H_{BG2}$ including 15 columns, parameters of row 0 to row 3 and column 5 to column 41 are the same as those in Table 4. A row weight of row 4 is the row weight of row 4 in Table 4 plus 1, that is, 4. Column positions of non-zero-elements in row 4 include column indexes of non-zero-elements in row 4 in Table 4 and column index 4, that is, 0, 1, 11, and 14. For parameters stored in $H_{BG2}$ including 16 columns, parameters of row 0 to row 3 and column 6 to column 41 are the same as those in Table 4. A row weight of row 4 is the row weight of row 4 in Table 4 plus 1, that is, 4. Column positions of non-zero-elements in row 4 include column indexes of non-zero-elements in row 4 in Table 4 and column index 14, that is, 0, 1, 11, and 14. A row weight of row 5 is the row weight of row 5 in Table 4 plus 1, that is, 6. Column positions of non-zero-elements in row 5 include column positions of non-zero-elements in row 5 in Table 4 and a position whose column index is 15, that is, 0, 1, 5, 7, 11, and 15.

For parameters stored in $H_{BG2}$ including 17 columns, parameters of row 0 to row 3 and column 7 to column 41 are the same as those in Table 4. A row weight of row 4 is the row weight of row 4 in Table 4 plus 1, that is, 4. Column positions of non-zero-elements in row 4 include column indexes of non-zero-elements in row 4 in Table 4 and column index 14, that is, 0, 1, 11, and 14. A row weight of row 5 is the row weight of row 5 in Table 4 plus 1, that is, 6. Column positions of non-zero-elements in row 5 include column indexes of non-zero-elements in row 5 in Table 4 and column index 15, that is, 0, 1, 5, 7, 11, and 15. A row weight of row 6 is the row weight of row 6 in Table 4 plus 1, that is, 6. Column positions of non-zero-elements in row 6 include column indexes of non-zero-elements in row 6 in Table 4 and column index 16, that is, 0, 5, 7, 9, 11, and 16, as shown in Table 5.

TABLE 5

| Row index | Row weight | Column index of non-zero-element |
|---|---|---|
| 0 | 8 | 0, 1, 2, 3, 6, 9, 10, 11 |
| 1 | 10 | 0, 3, 4, 5, 6, 7, 8, 9, 11, 12 |
| 2 | 8 | 0, 1, 3, 4, 8, 10, 12 13 |
| 3 | 10 | 1, 2, 4, 5, 6, 7, 8, 9, 10, 13 |
| 4 | 4 | 0, 1, 11, 14 |
| 5 | 6 | 0, 1, 5, 7, 11, 15 |
| 6 | 6 | 0, 5, 7, 9, 11, 16 |
| 7 | 5 | 1, 5, 7, 11, 13 |
| 8 | 3 | 0, 1, 12 |
| 9 | 4 | 1, 8, 10, 11 |
| 10 | 4 | 0, 1, 6, 7 |
| 11 | 4 | 0, 7, 9, 13 |
| 12 | 3 | 1, 3, 11 |
| 13 | 4 | 0, 1, 8, 13 |
| 14 | 4 | 1, 6, 11, 13 |
| 15 | 3 | 0, 10, 11 |
| 16 | 4 | 1, 9, 11, 12 |
| 17 | 4 | 1, 5, 11, 12 |
| 18 | 3 | 0, 6, 7 |
| 19 | 3 | 0, 1, 10 |
| 20 | 3 | 1, 4, 11 |
| 21 | 3 | 0, 8, 13 |
| 22 | 2 | 1, 2 |
| 23 | 3 | 0, 3, 5 |
| 24 | 3 | 1, 2, 9 |
| 25 | 2 | 0, 5 |
| 26 | 4 | 2, 7, 12, 13 |
| 27 | 2 | 0, 6 |
| 28 | 3 | 1, 2, 5 |
| 29 | 2 | 0, 4 |
| 30 | 4 | 2, 5, 7, 9 |
| 31 | 2 | 1, 13 |
| 32 | 3 | 0, 5, 12 |
| 33 | 3 | 2, 7, 10 |
| 34 | 3 | 0, 12, 13 |
| 35 | 3 | 1, 5, 11 |
| 36 | 3 | 0, 2, 7 |
| 37 | 2 | 10, 13 |
| 38 | 3 | 1, 5, 11 |
| 39 | 3 | 0, 7, 12 |
| 40 | 3 | 2, 10, 13 |
| 41 | 3 | 1, 5, 11 |

In the foregoing designs, each "Row weight" column is optional. In a possible design, in the base graph, 1 and 0 in each row or each column may be considered as binary digits. Storage space may be saved by storing the binary digits as decimal digits or hexadecimal digits. Using any of the foregoing base graphs as an example, for each row, positions of non-zero-elements in former 26 columns or former 27 columns may be stored by using four hexadecimal digits. For example, if former 14 columns in row 0 are 11110010011100, positions of non-zero-elements in row 0 may be denoted as 0xF2 and 0x70, that is, each eight columns form a hexadecimal digit. For the last two columns in row 0, a corresponding hexadecimal digit may be obtained by filling 0s to reach an integer multiple of 8 bits. Certainly, a corresponding hexadecimal digit may alternatively be obtained by filling 0s before 11110010011100 to reach an integer multiple of 8 bits. Other rows can be deduced by analogy, and details are not described herein again.

It should be noted that only examples are provided herein, and the examples do not constitute a limitation in the present application.

When the information bit sequence is encoded, the LDPC matrix H used for encoding may be obtained by expanding the base matrix $H_B$ according to Z. For each non-zero-element $P_{i,j}$ in the base matrix $H_B$, a circular permutation matrix $h_{i,j}$ of size Z×Z is determined, where $h_{i,j}$ is a circular permutation matrix obtained by circularly shifting an identity matrix for $P_{i,j}$ times. The parity check matrix H is obtained by replacing each non-zero-element $P_{i,j}$ with $h_{i,j}$ and replacing each zero-element in the base matrix $H_B$ with an all zero matrix of size Z×Z.

In a communication system, an LDPC code may be obtained by encoding by using the foregoing method. After obtaining the LDPC code, a communication apparatus may further perform the following one or more operations: performing rate matching on the LDPC code; interleaving, according to an interleaving scheme, an LDPC code obtained by performing rate matching; modulating the interleaved LDPC code according to a modulation scheme to obtain a bit sequence B; and sending the bit sequence B.

In a decoding method provided in another embodiment of the present application, a decoder decodes an input sequence by using an LDPC matrix. A base graph of the LDPC matrix may be any base graph in the foregoing examples. A base matrix $H_B$ of the LDPC matrix may be any base matrix in the foregoing examples. The input sequence of the decoder may be a soft value sequence of an LDPC code.

Further, the method includes: determining a lifting factor Z. A communication device at a receive end may receive a signal including the LDPC code, obtain the soft value sequence of the LDPC code in the signal, and determine the corresponding lifting factor Z.

The decoding, by a decoder, an input sequence by using an LDPC matrix may be decoding the soft value sequence of the LDPC code by using the LDPC matrix corresponding to the lifting factor Z.

Decoding is an inverse process of encoding. Therefore, for descriptions of the LDPC matrix H and the base graph of the LDPC matrix, refer to the foregoing encoding embodiments. During decoding, decoding may alternatively be performed based on the complete base graph, or based on some rows and columns of the complete base graph. The base matrix $H_B$ of the LDPC matrix may be any base matrix mentioned in the foregoing embodiments or a base matrix obtained by performing row permutation, or column permutation, or both row permutation and column permutation on any base matrix described above. The base graph of the LDPC matrix includes at least a submatrix A and a submatrix B, and may further include a submatrix C, a submatrix D, and a submatrix E. For each part, refer to descriptions in the foregoing embodiments, and details are not described herein again.

In a possible design, the base matrix $H_B$ of the LDPC code may be stored in a memory, and soft values of the LDPC code may be decoded by obtaining the LDPC matrix corresponding to the lifting factor Z.

In another possible implementation, because there are a plurality of base matrices of the LDPC code, relatively large storage space is occupied when the base matrices are stored according to matrix structures. The base graph of the LDPC code may alternatively be stored in the memory, and shift values of non-zero-elements in the base matrices may be stored row by row or column by column, and then the LDPC matrix may be obtained based on the base graph and shift values of the base matrix corresponding to the lifting factor Z.

For a manner of storing the base graph, the base graph may be stored in various manners described in the foregoing encoding embodiments. It should be noted that only examples are provided herein, and the examples do not constitute a limitation.

Decoding is a process inverse to encoding, and the base matrix $H_B$ used during the decoding has a same characteristic as the base matrix in the encoding method embodiments. For obtaining the LDPC matrix H by lifting the base matrix $H_B$, refer to the encoding method embodiments.

In a communication system, before the decoding method, a communication apparatus may further perform the following one or more operations: receiving a signal including an LDPC code, and performing demodulation, deinterleaving, and perform de-rate matching on the signal, to obtain the soft values of the LDPC code.

In a possible implementation, one or more parameters of the following may be stored:

(a) parameter used to obtain any base matrix $H_B$ described in the foregoing implementations. The base matrix $H_B$ may be obtained based on the parameters; for example, the parameters may include one or more of the following: shift values in a base matrix, a lifting factor, a base graph of the base matrix, a code rate, or the like;

(b) a base matrix $H_B$, which is one of any base matrices described in the foregoing implementations;

(c) a matrix obtained after performing lifting based on the base matrix $H_B$;

(d) a base matrix obtained by performing row/column permutation based on the any base matrix $H_B$ described in the foregoing implementations, where in this application, the row/column permutation refers to row permutation, column permutation, or row permutation and column permutation; and (e) a matrix obtained by performing lifting based on the base matrix obtained by performing row/column permutation.

In a possible implementation, in an encoding process or a decoding process, the encoding an input sequence by using a low density parity check LDPC matrix may be performed in one or more of the following manners:

i obtaining the base matrix $H_B$ based on the foregoing (a), and performing encoding or decoding based on the obtained base matrix $H_B$; or performing row/column permutation based on the obtained base matrix $H_B$, and performing encoding or decoding based on a base matrix obtained by performing row/column permutation, where the performing encoding or decoding based on the base matrix may optionally further include performing encoding or decoding based on a lifted matrix of the base matrix;

ii performing encoding or decoding based on the stored base matrix (the stored base matrix $H_B$, or the stored base matrix obtained by performing row/column permutation based on the base matrix $H_B$) in (b) or (d); or performing row/column permutation based on the stored base matrix, and performing encoding or decoding based on a base matrix obtained by performing row/column permutation, where the performing encoding or decoding based on the base matrix may optionally further include performing encoding or decoding based on a lifted matrix of the base matrix; and iii performing encoding or decoding based on (c) or (e).

The storing in this application may be storing in one or more memories. The one or more memories may be separately disposed, or may be integrated into the encoder, the decoder, a processor, a chip, a communication apparatus, or a terminal. Alternatively, some of the one or more memories may be separately disposed, and the others are integrated into an encoder, a decoder, a processor, a chip, a communication apparatus, or a terminal. A type of the memory may be a storage medium in any form. This is not limited in this application.

Figure 5:
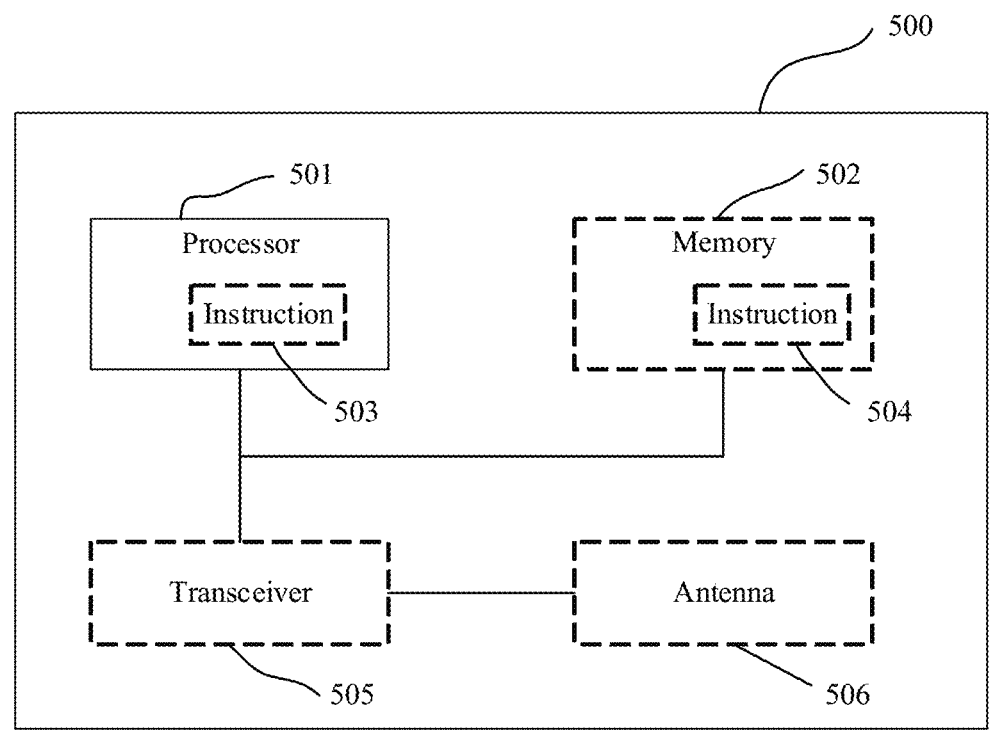

FIG. 5 is a schematic structural diagram of a communication apparatus 500. The apparatus 500 may be configured to implement the method described in the foregoing method embodiments. Reference may be made to descriptions in the foregoing method embodiments. The communication apparatus 500 may be a chip, a base station, a terminal, or other network devices.

The communication apparatus 500 includes one or more processors 501. The processor 501 may be a general-purpose processor, a special-purpose processor, or the like. For example, the processor 501 may be a baseband processor or a central processing unit. The baseband processor may be configured to process a communication protocol and communication data. The central processing unit may be configured to: control the communication apparatus (such as a base station, a terminal, or a chip), execute a software program, and process data of the software program.

In a possible design, the communication apparatus 500 includes one or more processors 501. The one or more processors 501 may implement a function of the foregoing encoder. In another possible design, the foregoing encoder may be a part of the processor 501. In addition to the function of the encoder, the processor 501 may further implement another function.

The communication apparatus 500 encodes an input sequence by using an LDPC matrix. A base graph of the LDPC matrix may be any base graph in the foregoing examples, or a base graph obtained by performing row permutation, column permutation, or both row permutation and column permutation on any base graph described above. A base matrix $H_B$ of the LDPC matrix may be any base matrix in the foregoing embodiments, or a base matrix obtained by performing row permutation, column permutation, or both row permutation and column permutation on any base matrix described above. The input sequence of the encoder may be an information bit sequence.

In a possible design, the one or more processors 501 may implement a function of the foregoing decoder. In another possible design, the foregoing decoder may be a part of the processor 501.

The communication apparatus 500 may be configured to decode an input sequence by using an LDPC matrix. A base graph of the LDPC matrix may be any base graph in the foregoing examples, or a base graph obtained by performing row permutation, column permutation, or both row permutation and column permutation on any base graph described above. A base matrix $H_B$ of the LDPC matrix may be any base matrix in the foregoing examples, or a base matrix obtained by performing row permutation, column permutation, or both row permutation and column permutation on any base matrix described above. The input sequence of the decoder may be a soft value sequence.

In an optional possible design, the processor 501 may further include instruction(s) 503. The instruction(s) may be executed on the processor, so that the communication apparatus 500 performs the method described in the foregoing method embodiments.

In another possible design, the communication apparatus 500 may further include a circuit. The circuit may implement the function of the encoder, the function of the decoder, or the functions of the encoder and the decoder in the foregoing method embodiments.

Optionally, the communication apparatus 500 may include one or more memories 502. The memory stores instruction(s) 504, and the instruction(s) may be executed on the processor, so that the communication apparatus 500 performs the method described in the foregoing method embodiments. Optionally, the memory may further store data. Optionally, the processor may further store instruction(s) and/or data. The processor and the memory may be separately disposed, or may be integrated together. Optionally, the one or more memories 502 may store parameters related to a base matrix, for example, a shift value, a base graph, a matrix obtained through lifting based on the base graph, each row in the base matrix, and a lifting factor. Optionally, the one or more memories 502 may store a base matrix or a matrix obtained through lifting based on the base matrix.

Optionally, the communication apparatus 500 may further include a transceiver 505 and an antenna 506. The processor 501 may be referred to as a processing unit. The processor 501 controls the communication apparatus (a terminal or a base station). The transceiver 505 may be referred to as a transceiver unit, a transceiver circuit, a transceiver, or the like, and is configured to implement transmitting and receiving functions of the communication apparatus by using the antenna 506.

Optionally, the communication apparatus 500 may further include a component configured to generate a transport block CRC, a component used for code block segmentation and CRC attachment, an interleaver used for interleaving, a modulator used for modulation processing, or the like. Functions of the components may be implemented by using the one or more processors 501.

Optionally, the communication apparatus 500 may further include a demodulator used for a demodulation operation, a deinterleaver used for deinterleaving, a component used for de-rate matching, or the like. Functions of the components may be implemented by using the one or more processors 501.

Figure 6:
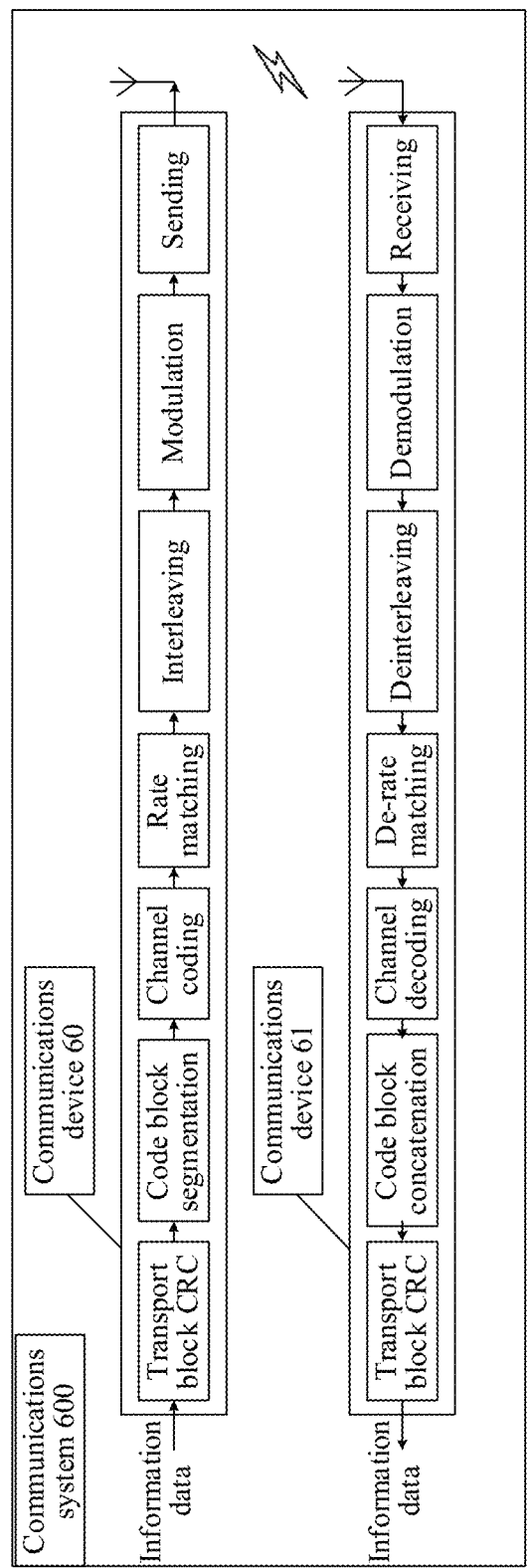

FIG. 6 is a schematic diagram of a communication system 600. The communication system 600 includes a communication device 60 and a communication device 61. Information data is received and sent between the communication device 60 and the communication device 61. The communication device 60 and the communication device 61 may be the communication apparatus 500, or the communication device 60 and the communications device 61 respectively includes a communication apparatus 500 for receiving and sending the information data. In an example, the communication device 60 may be a terminal, and correspondingly, the communication device 61 may be a base station. In another example, the communication device 60 is a base station, and correspondingly, the communication device 61 may be a terminal.

A person skilled in the art may further understand that various illustrative logical blocks and steps that are listed in the embodiments of the present application may be implemented by using electronic hardware, computer software, or a combination thereof. Whether the functions are implemented by using hardware or software depends on particular applications and a design requirement of the complete system. For each specific application, a person skilled in the art may use various methods to implement the functions. However, this implementation should not be understood to go beyond the protection scope of the present application.

The various illustrative logical units and circuits described in the embodiments of the present application may implement or operate the described functions by using a general processor, a digital signal processor, an application-specific integrated circuit (ASIC), a field programmable gate array (FPGA) or another programmable logical apparatus, a discrete gate or transistor logic, a discrete hardware component, or a design of any combination thereof. The general processor may be a microprocessor. Optionally, the general processor may also be any conventional processor, controller, microcontroller, or state machine. The processor may also be implemented by a combination of computing apparatuses, such as a digital signal processor and a microprocessor, multiple microprocessors, one or more microprocessors with a digital signal processor core, or any other similar configuration.

Steps of the methods or algorithms described in the embodiments of the present application may be directly embedded into hardware, instruction(s) executed by a processor, or a combination thereof. The memory may be a random access memory (RAM), a flash memory, a read-only memory (ROM), an erasable programmable read-only memory (EPROM), an electrically erasable programmable read-only memory (EEPROM), a register, a hard disk, a removable magnetic disk, a CD-ROM, or a storage medium of any other form in the art. For example, the memory may connect to a processor so that the processor may read information from the memory and write information to the memory. Alternatively, the memory may further be integrated into a processor. The processor and the memory may be disposed in an ASIC, and the ASIC may be disposed in a user equipment (UE). Alternatively, the processor and the memory may be disposed in different components of UE.

With descriptions of the foregoing embodiments, a person skilled in the art may clearly understand that the present application may be implemented by hardware, firmware or a combination thereof. When the present application is implemented by using a software program, all or a part of the present application may be implemented in a form of a computer program product. The computer program product includes one or more computer instructions. When the computer instructions are loaded and executed on the computer, the procedures or functions according to the embodiments of the present application are all or partially generated. When the present application is implemented by the software program, the foregoing functions may be stored in a computer-readable medium or transmitted as one or more instructions or code in the computer-readable medium. The computer may be a general-purpose computer, a dedicated computer, a computer network, or another programmable apparatus. The computer instructions may be stored in a computer-readable storage medium or may be transmitted from a computer-readable storage medium to another computer-readable storage medium. The computer-readable medium includes a computer storage medium and a communication medium, where the communication medium includes any medium that enables a computer program to be transmitted from one place to another. The storage medium may be any available medium accessible to a computer. The following provides an example but does not impose a limitation: The computer-readable medium may include a RAM, a ROM, an EEPROM, a CD-ROM, or another optical disc storage or disk storage medium, or another magnetic storage device, or any other medium that can carry or store expected program code in a form of instruction(s) or a data structure and can be accessed by a computer. In addition, any connection may be appropriately defined as a computer-readable medium. For example, if software is transmitted from a website, a server or another remote source by using a coaxial cable, an optical fiber/cable, a twisted pair, a digital subscriber line (DSL) or wireless technologies such as infrared ray, radio and microwave, the coaxial cable, optical fiber/cable, twisted pair, DSL or wireless technologies such as infrared ray, radio and microwave are included in fixation of a medium to which they belong. For example, a disk and disc used by the present application includes a compact disc (CD), a laser disc, an optical disc, a digital versatile disc (DVD), a floppy disk and a Blue-ray disc, where the disk generally copies data by a magnetic means, and the disc copies data optically by a laser means. The foregoing combination should also be included in the protection scope of the computer-readable medium.

Described herein are merely examples of embodiments of technical solutions of the present application, and the description of the examples is not intended to limit the protection scope of the present application. Any modification, equivalent replacement, or improvement made without departing from principles of the present application may fall within the protection scope of the present application.

What is claimed is:

1. A method for wireless communication, comprising:
obtaining, by a first communication apparatus, an input sequence;
encoding, by the first communication apparatus, the input sequence using a matrix H to obtain an encoded sequence; and
outputting, by the first communication apparatus, the encoded sequence;
wherein the matrix H is determined based on a base matrix and a lifting factor Z, wherein Z is a positive integer;
wherein the base matrix comprises m rows and n columns, where $33 \leq m \leq 42$ and $43 \leq n \leq 52$;
wherein each element in the base matrix corresponds to a respective row index i and a respective column index j, where $0 \leq i < m$ and $0 \leq j < n$;
wherein each element in the base matrix is either a zero-element or a non-zero-element;
wherein the base matrix comprises at least one of the following rows:
a thirty-third row corresponding to row index i=32 having non-zero-elements at columns corresponding to column indexes j=0, 5, 12, 42;
a thirty-fourth row corresponding to row index i=33 having non-zero-elements at columns corresponding to column indexes j=2, 7, 10, 43;
a thirty-fifth row corresponding to row index i=34 having non-zero-elements at columns corresponding to column indexes j=0, 12, 13, 44;
a thirty-sixth row corresponding to row index i=35 having non-zero-elements at columns corresponding to column indexes j=1, 5, 11, 45;
a thirty-seventh row corresponding to row index i=36 having non-zero-elements at columns corresponding to column indexes j=0, 2, 7, 46;
a thirty-eighth row corresponding to row index i=37 having non-zero-elements at columns corresponding to column indexes j=10, 13, 47;
a thirty-ninth row corresponding to row index i=38 having non-zero-elements at columns corresponding to column indexes j=1, 5, 11, 48;
a fortieth row corresponding to row index i=39 having non-zero-elements at columns corresponding to column indexes j=0, 7, 12, 49;
a forty-first row corresponding to row index i=40 having non-zero-elements at columns corresponding to column indexes j=2, 10, 13, 50; or a forty-second row corresponding to row index i=41 having non-zero-elements at columns corresponding to column indexes j=1, 5, 11, 51.

2. The method according to claim 1, wherein each zero-element in the base matrix corresponds to an all-zero matrix of size Z×Z in the matrix H;
wherein each non-zero-element for a respective row index i and column index j has a value $V_{i,j}$ and corresponds to a circular permutation matrix $I(P_{i,j})$ of size Z×Z in the matrix H;

wherein $P_{i,j}$ is an integer shift value greater than or equal to zero, and $P_{i,j}$=mod $(V_{i,j}, Z)$.

3. The method according to claim 1, wherein the lifting factor Z is a minimum of a plurality of lifting factors satisfying a relationship of $10 \times Z \geq K$, wherein K is a length of the input sequence.

4. The method according to claim 1, wherein the lifting factor Z satisfies $Z=a \times 2^j$, where $a \in \{2,3,5,7,9,11,13,15\}$; wherein:
in case of a=2, j=0, 1, 2, 3, 4, 5, 6 or 7;
in case of a=3, j=0, 1, 2, 3, 4, 5, 6 or 7;
in case of a=5, j=0, 1, 2, 3, 4, 5 or 6;
in case of a=7, j=0, 1, 2, 3, 4 or 5;
in case of a=9, j=0, 1, 2, 3, 4 or 5;
in case of a=11, j=0, 1, 2, 3, 4 or 5;
in case of a=13, j=0, 1, 2, 3 or 4; or
in case of a=15, j=0, 1, 2, 3 or 4.

5. The method according to claim 1, wherein the input sequence is represented as $c=\{c_0, c_1, c_2, \ldots, c_{K-1}\}$, and the encoded sequence is represented as $d=\{d_0, d_1, d_2, \ldots, d_{N-1}\}$, wherein K is a length of the input sequence, N is a positive integer, $N=(40+Kb) \times Z$, and Kb is one of $\{6, 8, 9, 10\}$.

6. The method according to claim 5, wherein the encoded sequence d comprises $K_0$ bits in the input sequence c and $N-K_0$ parity bits in a parity sequence $w=\{w_0, w_1, w_2, \ldots, w_{N-K_0-1}\}$, wherein $K_0$ is an integer greater than 0 and less than or equal to K; and
wherein the matrix H, the parity sequence w, and the input sequence c meet:

$$H \times \begin{bmatrix} c^T \\ w^T \end{bmatrix} = 0^T,$$

wherein $c^T=[c_0, c_1, c_2, \ldots, c_{K-1}]^T$, $w^T=[w_0, w_1, w_2, \ldots, w_{N-K_0-1}]^T$, $0^T$ is a column vector, and values of all elements of $0^T$ are 0.

7. The method according to claim 6, wherein $K_0=K-2 \times Z$.

8. The method according to claim 5, wherein the lifting factor $Z=Z_0$, wherein $Z_0$ is a minimum of a plurality of lifting factors satisfying a relationship of $Kb \times Z_0 \geq K$.

9. The method according to claim 5, wherein:
in case of K>640, Kb is equal to 10;
in case of K>560 and K≤640, Kb is equal to 9;
in case of K>192 and K≤560, Kb is equal to 8; or
in case of K≤192, Kb is equal to 6.

10. The method according to claim 1, wherein the base matrix further comprises at least one of the following rows:
a first row corresponding to row index i=0 having non-zero-elements at columns corresponding to column indexes j=0, 1, 2, 3, 6, 9, 10, 11;
a second row corresponding to row index i=1 having non-zero-elements at columns corresponding to column indexes j=0, 3, 4, 5, 6, 7, 8, 9, 11, 12;
a third row corresponding to row index i=2 having non-zero-elements at columns corresponding to column indexes j=0, 1, 3, 4, 8, 10, 12, 13;
a fourth row corresponding to row index i=3 having non-zero-elements at columns corresponding to column indexes j=1, 2, 4, 5, 6, 7, 8, 9, 10, 13;
a fifth row corresponding to row index i=4 having non-zero-elements at columns corresponding to column indexes j=0, 1, 11, 14;
a sixth row corresponding to row index i=5 having non-zero-elements at columns corresponding to column indexes j=0, 1, 5, 7, 11, 15;
a seventh row corresponding to row index i=6 having non-zero-elements at columns corresponding to column indexes j=0, 5, 7, 9, 11, 16;
an eighth row corresponding to row index i=7 having non-zero-elements at columns corresponding to column indexes j=1, 5, 7, 11, 13, 17;
a ninth row corresponding to row index i=8 having non-zero-elements at columns corresponding to column indexes j=0, 1, 12, 18;
a tenth row corresponding to row index i=9 having non-zero-elements at columns corresponding to column indexes j=1, 8, 10, 11, 19;
an eleventh row corresponding to row index i=10 having non-zero-elements at columns corresponding to column indexes j=0, 1, 6, 7, 20;
a twelfth row corresponding to row index i=11 having non-zero-elements at columns corresponding to column indexes j=0, 7, 9, 13, 21;
a thirteenth row corresponding to row index i=12 having non-zero-elements at columns corresponding to column indexes j=1, 3, 11, 22;
a fourteenth row corresponding to row index i=13 having non-zero-elements at columns corresponding to column indexes j=0, 1, 8, 13, 23;
a fifteenth row corresponding to row index i=14 having non-zero-elements at columns corresponding to column indexes j=1, 6, 11, 13, 24;
a sixteenth row corresponding to row index i=15 having non-zero-elements at columns corresponding to column indexes j=0, 10, 11, 25;
a seventeenth row corresponding to row index i=16 having non-zero-elements at columns corresponding to column indexes j=1, 9, 11, 12, 26;
an eighteenth row corresponding to row index i=17 having non-zero-elements at columns corresponding to column indexes j=1, 5, 11, 12, 27;
a nineteenth row corresponding to row index i=18 having non-zero-elements at columns corresponding to column indexes j=0, 6, 7, 28;
a twentieth row corresponding to row index i=19 having non-zero-elements at columns corresponding to column indexes j=0, 1, 10, 29;
a twenty-first row corresponding to row index i=20 having non-zero-elements at columns corresponding to column indexes j=1, 4, 11, 30;
a twenty-second row corresponding to row index i=21 having non-zero-elements at columns corresponding to column indexes j=0, 8, 13, 31;
a twenty-third row corresponding to row index i=22 having non-zero-elements at columns corresponding to column indexes j=1, 2, 32;
a twenty-fourth row corresponding to row index i=23 having non-zero-elements at columns corresponding to column indexes j=0, 3, 5, 33;
a twenty-fifth row corresponding to row index i=24 having non-zero-elements at columns corresponding to column indexes j=1, 2, 9, 34;
a twenty-sixth row corresponding to row index i=25 having non-zero-elements at columns corresponding to column indexes j=0, 5, 35;
a twenty-seventh row corresponding to row index i=26 having non-zero-elements at columns corresponding to column indexes j=2, 7, 12, 13, 36;

a twenty-eighth row corresponding to row index i=27 having non-zero-elements at columns corresponding to column indexes j=0, 6, 37;

a twenty-ninth row corresponding to row index i=28 having non-zero-elements at columns corresponding to column indexes j=1, 2, 5, 38;

a thirtieth row corresponding to row index i=29 having non-zero-elements at columns corresponding to column indexes j=0, 4, 39;

a thirty-first row corresponding to row index i=30 having non-zero-elements at columns corresponding to column indexes j=2, 5, 7, 9, 40; or a thirty-second row corresponding to row index i=31 having non-zero-elements at columns corresponding to column indexes j=1, 13, 41.

11. The method according to claim 1, wherein the matrix H is determined according to a permutated matrix of the base matrix, and wherein the permutated matrix is obtained by performing row permutation and/or column permutation on the base matrix.

12. A first communication apparatus for wireless communication, comprising:
at least one processor; and
at least one memory having processor-executable instructions stored thereon;
wherein the at least one processor is configured to execute the processor-executable instructions to facilitate the following being performed by the first communication apparatus:
obtaining an input sequence;
encoding the input sequence using a matrix H to obtain an encoded sequence; and
outputting the encoded sequence;
wherein the matrix H is determined based on a base matrix and a lifting factor Z, wherein Z is a positive integer;
wherein the base matrix comprises m rows and n columns, where 33≤m≤42 and 43≤n≤52;
wherein each element in the base matrix corresponds to a respective row index i and a respective column index j, where 0≤i<m and 0≤j<n;
wherein each element in the base matrix is either a zero-element or a non-zero-element;
wherein the base matrix comprises at least one of the following rows:
a thirty-third row corresponding to row index i=32 having non-zero-elements at columns corresponding to column indexes j=0, 5, 12, 42;
a thirty-fourth row corresponding to row index i=33 having non-zero-elements at columns corresponding to column indexes j=2, 7, 10, 43;
a thirty-fifth row corresponding to row index i=34 having non-zero-elements at columns corresponding to column indexes j=0, 12, 13, 44;
a thirty-sixth row corresponding to row index i=35 having non-zero-elements at columns corresponding to column indexes j=1, 5, 11, 45;
a thirty-seventh row corresponding to row index i=36 having non-zero-elements at columns corresponding to column indexes j=0, 2, 7, 46;
a thirty-eighth row corresponding to row index i=37 having non-zero-elements at columns corresponding to column indexes j=10, 13, 47;
a thirty-ninth row corresponding to row index i=38 having non-zero-elements at columns corresponding to column indexes j=1, 5, 11, 48;

a fortieth row corresponding to row index i=39 having non-zero-elements at columns corresponding to column indexes j=0, 7, 12, 49;

a forty-first row corresponding to row index i=40 having non-zero-elements at columns corresponding to column indexes j=2, 10, 13, 50; or a forty-second row corresponding to row index i=41 having non-zero-elements at columns corresponding to column indexes j=1, 5, 11, 51.

13. The first communication apparatus according to claim 12, wherein each zero-element in the base matrix corresponds to an all-zero matrix of size Z×Z in the matrix H;
wherein each non-zero-element for a respective row index i and column index j has a value and corresponds to a circular permutation matrix $I(P_{i,j})$ of size Z×Z in the matrix H;
wherein $P_{i,j}$ is an integer shift value greater than or equal to zero, and $P_{i,j}=mod\ (Vi,j,Z)$.

14. The first communication apparatus according to claim 12, wherein the lifting factor Z is a minimum of a plurality of lifting factors satisfying a relationship of 10×Z≥K, wherein K is a length of the input sequence.

15. The first communication apparatus according to claim 12, wherein the lifting factor Z satisfies $Z=a\times 2^j$, where a∈{2,3,5,7,9,11,13,15};
wherein:
in case of a=2, j=0, 1, 2, 3, 4, 5, 6 or 7;
in case of a=3, j=0, 1, 2, 3, 4, 5, 6 or 7;
in case of a=5, j=0, 1, 2, 3, 4, 5 or 6;
in case of a=7, j=0, 1, 2, 3, 4 or 5;
in case of a=9, j=0, 1, 2, 3, 4 or 5;
in case of a=11, j=0, 1, 2, 3, 4 or 5;
in case of a=13, j=0, 1, 2, 3 or 4; or
in case of a=15, j=0, 1, 2, 3 or 4.

16. The first communication apparatus according to claim 12, wherein the input sequence is represented as c={$c_0$, $c_1$, $c_2$, . . . , $c_{K-1}$}, and the encoded sequence is represented as d={$d_0$, $d_1$, $d_2$, . . . , $d_{N-1}$}, wherein K is a length of the input sequence, N is a positive integer, N=(40+Kb)×Z, and Kb is one of {6, 8, 9, 10}.

17. The first communication apparatus according to claim 16, wherein the encoded sequence d comprises $K_0$ bits in the input sequence c and N−$K_0$ parity bits in a parity sequence w={$w_0$, $w_1$, $w_2$, . . . , $w_{N-K_0-1}$}, wherein $K_0$ is an integer greater than 0 and less than or equal to K; and
wherein the matrix H, the parity sequence w, and the input sequence c meet:

$$H \times \begin{bmatrix} c^T \\ w^T \end{bmatrix} = 0^T,$$

wherein $c^T$=[$c_0$, $c_1$, $c_2$, . . . , $c_{K-1}$]$^T$, $w^T$=[$w_0$, $w_1$, $w_2$, . . . , $w_{N-K_0-1}$]$^T$, $0^T$ is a column vector, and values of all elements of $0^T$ are 0.

18. The first communication apparatus according to claim 17, wherein $K_0$=K−2×Z.

19. The first communication apparatus according to claim 16, wherein the lifting factor Z=$Z_0$, wherein $Z_0$ is a minimum of a plurality of lifting factors satisfying a relationship of Kb×$Z_0$≥K.

20. The first communication apparatus according to claim 16, wherein:
in case of K>640, Kb is equal to 10;
in case of K>560 and K≤640, Kb is equal to 9;

in case of K>192 and K≤560, Kb is equal to 8; or in case of K≤192, Kb is equal to 6.

21. The first communication apparatus according to claim 12, wherein the base matrix further comprises at least one of the following rows:

a first row corresponding to row index i=0 having non-zero-elements at columns corresponding to column indexes j=0, 1, 2, 3, 6, 9, 10, 11;

a second row corresponding to row index i=1 having non-zero-elements at columns corresponding to column indexes j=0, 3, 4, 5, 6, 7, 8, 9, 11, 12;

a third row corresponding to row index i=2 having non-zero-elements at columns corresponding to column indexes j=0, 1, 3, 4, 8, 10, 12, 13;

a fourth row corresponding to row index i=3 having non-zero-elements at columns corresponding to column indexes j=1, 2, 4, 5, 6, 7, 8, 9, 10, 13;

a fifth row corresponding to row index i=4 having non-zero-elements at columns corresponding to column indexes j=0, 1, 11, 14;

a sixth row corresponding to row index i=5 having non-zero-elements at columns corresponding to column indexes j=0, 1, 5, 7, 11, 15;

a seventh row corresponding to row index i=6 having non-zero-elements at columns corresponding to column indexes j=0, 5, 7, 9, 11, 16;

an eighth row corresponding to row index i=7 having non-zero-elements at columns corresponding to column indexes j=1, 5, 7, 11, 13, 17;

a ninth row corresponding to row index i=8 having non-zero-elements at columns corresponding to column indexes j=0, 1, 12, 18;

a tenth row corresponding to row index i=9 having non-zero-elements at columns corresponding to column indexes j=1, 8, 10, 11, 19;

an eleventh row corresponding to row index i=10 having non-zero-elements at columns corresponding to column indexes j=0, 1, 6, 7, 20;

a twelfth row corresponding to row index i=11 having non-zero-elements at columns corresponding to column indexes j=0, 7, 9, 13, 21;

a thirteenth row corresponding to row index i=12 having non-zero-elements at columns corresponding to column indexes j=1, 3, 11, 22;

a fourteenth row corresponding to row index i=13 having non-zero-elements at columns corresponding to column indexes j=0, 1, 8, 13, 23;

a fifteenth row corresponding to row index i=14 having non-zero-elements at columns corresponding to column indexes j=1, 6, 11, 13, 24;

a sixteenth row corresponding to row index i=15 having non-zero-elements at columns corresponding to column indexes j=0, 10, 11, 25;

a seventeenth row corresponding to row index i=16 having non-zero-elements at columns corresponding to column indexes j=1, 9, 11, 12, 26;

an eighteenth row corresponding to row index i=17 having non-zero-elements at columns corresponding to column indexes j=1, 5, 11, 12, 27;

a nineteenth row corresponding to row index i=18 having non-zero-elements at columns corresponding to column indexes j=0, 6, 7, 28;

a twentieth row corresponding to row index i=19 having non-zero-elements at columns corresponding to column indexes j=0, 1, 10, 29;

a twenty-first row corresponding to row index i=20 having non-zero-elements at columns corresponding to column indexes j=1, 4, 11, 30;

a twenty-second row corresponding to row index i=21 having non-zero-elements at columns corresponding to column indexes j=0, 8, 13, 31;

a twenty-third row corresponding to row index i=22 having non-zero-elements at columns corresponding to column indexes j=1, 2, 32;

a twenty-fourth row corresponding to row index i=23 having non-zero-elements at columns corresponding to column indexes j=0, 3, 5, 33;

a twenty-fifth row corresponding to row index i=24 having non-zero-elements at columns corresponding to column indexes j=1, 2, 9, 34;

a twenty-sixth row corresponding to row index i=25 having non-zero-elements at columns corresponding to column indexes j=0, 5, 35;

a twenty-seventh row corresponding to row index i=26 having non-zero-elements at columns corresponding to column indexes j=2, 7, 12, 13, 36;

a twenty-eighth row corresponding to row index i=27 having non-zero-elements at columns corresponding to column indexes j=0, 6, 37;

a twenty-ninth row corresponding to row index i=28 having non-zero-elements at columns corresponding to column indexes j=1, 2, 5, 38;

a thirtieth row corresponding to row index i=29 having non-zero-elements at columns corresponding to column indexes j=0, 4, 39;

a thirty-first row corresponding to row index i=30 having non-zero-elements at columns corresponding to column indexes j=2, 5, 7, 9, 40; or a thirty-second row corresponding to row index i=31 having non-zero-elements at columns corresponding to column indexes j=1, 13, 41.

22. The first communication apparatus according to claim 12, wherein the at least one memory is configured to store the base matrix, one or more lifting factors Z, or one or more circular permutation matrices.

23. The first communication apparatus according to claim 12, further comprising:

a transceiver configured to transmit, to a second communication apparatus, a transmission corresponding to the encoded sequence.

24. A non-transitory computer-readable storage medium having processor-executable instructions stored thereon, wherein the processor-executable instructions, when executed, facilitate:

obtaining, by a first communication apparatus, an input sequence, wherein the input sequence comprises K bits, wherein K≥1;

encoding, by the first communication apparatus, the input sequence using a matrix H to obtain an encoded sequence; and outputting, by the first communication apparatus, the encoded sequence;

wherein the matrix H is determined based on a base matrix and a lifting factor Z, wherein Z is a positive integer;

wherein the base matrix comprises m rows and n columns, where 33≤m≤42 and 43≤n≤52;

wherein each element in the base matrix corresponds to a respective row index i and a respective column index j, where 0≤i<m and 0≤j<n;

wherein each element in the base matrix is either a zero-element or a non-zero-element;

wherein the base matrix comprises at least one of the following rows:
a thirty-third row corresponding to row index i=32 having non-zero-elements at columns corresponding to column indexes j=0, 5, 12, 42;
a thirty-fourth row corresponding to row index i=33 having non-zero-elements at columns corresponding to column indexes j=2, 7, 10, 43;
a thirty-fifth row corresponding to row index i=34 having non-zero-elements at columns corresponding to column indexes j=0, 12, 13, 44;
a thirty-sixth row corresponding to row index i=35 having non-zero-elements at columns corresponding to column indexes j=1, 5, 11, 45;
a thirty-seventh row corresponding to row index i=36 having non-zero-elements at columns corresponding to column indexes j=0, 2, 7, 46;
a thirty-eighth row corresponding to row index i=37 having non-zero-elements at columns corresponding to column indexes j=10, 13, 47;
a thirty-ninth row corresponding to row index i=38 having non-zero-elements at columns corresponding to column indexes j=1, 5, 11, 48;
a fortieth row corresponding to row index i=39 having non-zero-elements at columns corresponding to column indexes j=0, 7, 12, 49;
a forty-first row corresponding to row index i=40 having non-zero-elements at columns corresponding to column indexes j=2, 10, 13, 50; or a forty-second row corresponding to row index i=41 having non-zero-elements at columns corresponding to column indexes j=1, 5, 11, 51.

25. The non-transitory computer-readable storage medium according to claim 24, wherein each zero-element in the base matrix corresponds to an all-zero matrix of size Z×Z in the matrix H;
wherein each non-zero-element for a respective row index i and column index j has a value $V_{i,j}$ and corresponds to a circular permutation matrix $I(P_{i,j})$ of size Z×Z in the matrix H;
wherein $P_{i,j}$ is an integer shift value greater than or equal to zero, and $P_{i,j}$=mod $(V_{i,j},Z)$.

26. The non-transitory computer-readable storage medium according to claim 24, wherein the base matrix further comprises at least one of the following rows:
a first row corresponding to row index i=0 having non-zero-elements at columns corresponding to column indexes j=0, 1, 2, 3, 6, 9, 10, 11;
a second row corresponding to row index i=1 having non-zero-elements at columns corresponding to column indexes j=0, 3, 4, 5, 6, 7, 8, 9, 11, 12;
a third row corresponding to row index i=2 having non-zero-elements at columns corresponding to column indexes j=0, 1, 3, 4, 8, 10, 12, 13;
a fourth row corresponding to row index i=3 having non-zero-elements at columns corresponding to column indexes j=1, 2, 4, 5, 6, 7, 8, 9, 10, 13;
a fifth row corresponding to row index i=4 having non-zero-elements at columns corresponding to column indexes j=0, 1, 11, 14;
a sixth row corresponding to row index i=5 having non-zero-elements at columns corresponding to column indexes j=0, 1, 5, 7, 11, 15;
a seventh row corresponding to row index i=6 having non-zero-elements at columns corresponding to column indexes j=0, 5, 7, 9, 11, 16;
an eighth row corresponding to row index i=7 having non-zero-elements at columns corresponding to column indexes j=1, 5, 7, 11, 13, 17;
a ninth row corresponding to row index i=8 having non-zero-elements at columns corresponding to column indexes j=0, 1, 12, 18;
a tenth row corresponding to row index i=9 having non-zero-elements at columns corresponding to column indexes j=1, 8, 10, 11, 19;
an eleventh row corresponding to row index i=10 having non-zero-elements at columns corresponding to column indexes j=0, 1, 6, 7, 20;
a twelfth row corresponding to row index i=11 having non-zero-elements at columns corresponding to column indexes j=0, 7, 9, 13, 21;
a thirteenth row corresponding to row index i=12 having non-zero-elements at columns corresponding to column indexes j=1, 3, 11, 22;
a fourteenth row corresponding to row index i=13 having non-zero-elements at columns corresponding to column indexes j=0, 1, 8, 13, 23;
a fifteenth row corresponding to row index i=14 having non-zero-elements at columns corresponding to column indexes j=1, 6, 11, 13, 24;
a sixteenth row corresponding to row index i=15 having non-zero-elements at columns corresponding to column indexes j=0, 10, 11, 25;
a seventeenth row corresponding to row index i=16 having non-zero-elements at columns corresponding to column indexes j=1, 9, 11, 12, 26;
an eighteenth row corresponding to row index i=17 having non-zero-elements at columns corresponding to column indexes j=1, 5, 11, 12, 27;
a nineteenth row corresponding to row index i=18 having non-zero-elements at columns corresponding to column indexes j=0, 6, 7, 28;
a twentieth row corresponding to row index i=19 having non-zero-elements at columns corresponding to column indexes j=0, 1, 10, 29;
a twenty-first row corresponding to row index i=20 having non-zero-elements at columns corresponding to column indexes j=1, 4, 11, 30;
a twenty-second row corresponding to row index i=21 having non-zero-elements at columns corresponding to column indexes j =0, 8, 13, 31;
a twenty-third row corresponding to row index i =22 having non-zero-elements at columns corresponding to column indexes j=1, 2, 32;
a twenty-fourth row corresponding to row index i=23 having non-zero-elements at columns corresponding to column indexes j=0, 3, 5, 33;
a twenty-fifth row corresponding to row index i=24 having non-zero-elements at columns corresponding to column indexes j=1, 2, 9, 34;
a twenty-sixth row corresponding to row index i=25 having non-zero-elements at columns corresponding to column indexes j=0, 5, 35;
a twenty-seventh row corresponding to row index i=26 having non-zero-elements at columns corresponding to column indexes j=2, 7, 12, 13, 36;
a twenty-eighth row corresponding to row index i=27 having non-zero-elements at columns corresponding to column indexes j=0, 6, 37;
a twenty-ninth row corresponding to row index i=28 having non-zero-elements at columns corresponding to column indexes j=1, 2, 5, 38;

a thirtieth row corresponding to row index i=29 having non-zero-elements at columns corresponding to column indexes j=0, 4, 39;

a thirty-first row corresponding to row index i=30 having non-zero-elements at columns corresponding to column indexes j=2, 5, 7, 9, 40; or a thirty-second row corresponding to row index i=31 having non-zero-elements at columns corresponding to column indexes j=1, 13, 41.

27. The non-transitory computer-readable storage medium according to claim 24, wherein the lifting factor Z satisfies $Z=a\times 2^j$, where $a\in\{2,3,5,7,9,11,13,15\}$;

wherein:
in case of a=2, j=0, 1, 2, 3, 4, 5, 6 or 7;
in case of a=3, j=0, 1, 2, 3, 4, 5, 6 or 7;
in case of a=5, j=0, 1, 2, 3, 4, 5 or 6;
in case of a=7, j=0, 1, 2, 3, 4 or 5;
in case of a=9, j=0, 1, 2, 3, 4 or 5;
in case of a=11, j=0, 1, 2, 3, 4 or 5;
in case of a=13, j=0, 1, 2, 3 or 4; or
in case of a=15, j=0, 1, 2, 3 or 4.

28. The non-transitory computer-readable storage medium according to claim 24, wherein the input sequence is represented as $c=\{c_0, c_1, c_2, \ldots, c_{K-1}\}$, and the encoded sequence is represented as $d=\{d_0, d_1, d_2, \ldots, d_{N-1}\}$, wherein K is a length of the input sequence, N is a positive integer, $N=(40+Kb)\times Z$, and Kb is one of $\{6, 8, 9, 10\}$.

29. The non-transitory computer-readable storage medium according to claim 28, wherein the encoded sequence d comprises $K_0$ bits in the input sequence c and $N-K_0$ parity bits in a parity sequence $w=\{w_0, w_1, w_2, \ldots, w_{N-K_0-1}\}$, wherein $K_0$ is an integer greater than 0 and less than or equal to K; and wherein the matrix H, the parity sequence w, and the input sequence c meet:

$$H\times\begin{bmatrix}c^T\\w^T\end{bmatrix}=0^T,$$

wherein $C^T=[c_0, c_1, c_2, \ldots, c_{K-1}]^T$, $w^T=[w_0, w_1, w_2, \ldots, w_{N-K_0-1}]^T$, $0^T$ is a column vector, and values of all elements of $0^T$ are 0.

30. The non-transitory computer-readable storage medium according to claim 29, wherein $K_0=K-2\times Z$.

* * * * *

UNITED STATES PATENT AND TRADEMARK OFFICE
CERTIFICATE OF CORRECTION

PATENT NO.         : 11,296,726 B2
APPLICATION NO.    : 16/923841
DATED              : April 5, 2022
INVENTOR(S)        : Jin et al.

Page 1 of 1

It is certified that error appears in the above-identified patent and that said Letters Patent is hereby corrected as shown below:

In the Claims

Claim 6: Column 33, Lines 39-40: "$w^T = [w_0, w_1, w_2, ..., w_{N-K_0-1}]^T, 0^T$ is a column vector, and values" should read -- $w^T = [w_0, w_1, w_2, ..., w_{N-K_0-1}]^T, 0^T$ is a column vector, and values --.

Claim 13: Column 36, Line 14: "i and column index j has a value and corresponds to a" should read -- i and column index j has a value $V_{i,j}$ and corresponds to a --.

Claim 13: Column 36, Line 18: "to zero, and $P_{i,j=\ mod\ (V_{i,j}, Z)}$." should read -- to zero, and $P_{i,j} = \mod(V_{i,j}, Z)$. --.

Signed and Sealed this
Twenty-third Day of August, 2022

Katherine Kelly Vidal
*Director of the United States Patent and Trademark Office*